(12) United States Patent
Matsuzaki et al.

(10) Patent No.: US 9,990,997 B2
(45) Date of Patent: Jun. 5, 2018

(54) SEMICONDUCTOR DEVICE INCLUDING TRANSISTOR WITH BACK GATE, AND MEMORY DEVICE INCLUDING THE SEMICONDUCTOR DEVICE

(71) Applicant: Semiconductor Energy Laboratory Co., Ltd., Atsugi-shi, Kanagawa-ken (JP)

(72) Inventors: Takanori Matsuzaki, Atsugi (JP); Kiyoshi Kato, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days. days.

(21) Appl. No.: 15/296,493

(22) Filed: Oct. 18, 2016

(65) Prior Publication Data

US 2017/0117283 A1    Apr. 27, 2017

(30) Foreign Application Priority Data

Oct. 22, 2015  (JP) ................. 2015-208166
Mar. 15, 2016  (JP) ................. 2016-050444

(51) Int. Cl.
  *G11C 16/04*    (2006.01)
  *H01L 23/535*    (2006.01)
  (Continued)

(52) U.S. Cl.
  CPC ........ *G11C 16/0433* (2013.01); *G11C 11/403* (2013.01); *G11C 11/4097* (2013.01);
  (Continued)

(58) Field of Classification Search
  CPC .................... G11C 16/0433; H01L 27/1157
  See application file for complete search history.

(56) References Cited

U.S. PATENT DOCUMENTS 5,252,846 A    10/1993  Tanaka et al.
5,266,509 A    11/1993  Chen
(Continued)

FOREIGN PATENT DOCUMENTS

JP    2001-351386 A    12/2001
JP    2011-135065 A    7/2011
(Continued)

OTHER PUBLICATIONS

International Search Report (Application No. PCT/IB2016/056202) dated Dec. 20, 2016.
(Continued)

*Primary Examiner* — Vanthu Nguyen
(74) *Attorney, Agent, or Firm* — Robinson Intellectual Property Law Office; Eric J. Robinson

(57) ABSTRACT

The memory device includes a first transistor and a circuit. The circuit includes a second to a (2n+1)th transistor, a first to an n-th capacitor, a first wiring, and a first to an n-th retention node (n is an integer greater than or equal to 2). When n is 2, a memory cell MC[1] includes a transistor ROS[1], a transistor WOS[1], and a capacitor C[1] and a memory cell MC[2] includes a transistor ROS[2], a transistor WOS[2], and a capacitor C[2]. A back gate of the transistor WOS[1] and a back gate of the transistor WOS[2] are electrically connected to a wiring WBG. A bake gate of a first transistor, a back gate of the transistor ROS[1], and a back gate of the transistor ROS[2] are electrically connected to a wiring RBG.

19 Claims, 49 Drawing Sheets

(51) Int. Cl.

| | |
|---|---|
| *H01L 27/1157* | (2017.01) |
| *H01L 27/11582* | (2017.01) |
| *H01L 27/12* | (2006.01) |
| *H01L 29/792* | (2006.01) |
| *G11C 11/403* | (2006.01) |
| *G11C 11/4097* | (2006.01) |

(52) U.S. Cl.
CPC ........ *H01L 23/535* (2013.01); *H01L 27/1157* (2013.01); *H01L 27/11582* (2013.01); *H01L 27/1203* (2013.01); *H01L 29/792* (2013.01)

(56) References Cited

U.S. PATENT DOCUMENTS

| | | | |
|---|---|---|---|
| 5,364,805 | A | 11/1994 | Taura et al. |
| 6,011,729 | A | 1/2000 | Choi |
| 6,982,897 | B2 | 1/2006 | Luk et al. |
| 8,072,798 | B2* | 12/2011 | Takeyama ............. G11C 11/412 365/154 |
| 8,278,162 | B2* | 10/2012 | Akimoto ............. H01L 29/7869 257/E21.411 |
| 8,588,000 | B2* | 11/2013 | Kamata ................. G11C 11/404 365/185.03 |
| 8,604,476 | B2* | 12/2013 | Kato ....................... H01L 21/84 257/57 |
| 8,614,916 | B2* | 12/2013 | Nagatsuka ......... G11C 16/0433 365/185.05 |
| 8,619,470 | B2* | 12/2013 | Kato ..................... G11C 11/403 365/185.17 |
| 8,730,730 | B2 | 5/2014 | Koyama et al. |
| 8,737,109 | B2* | 5/2014 | Yamazaki ............... G11C 16/02 365/149 |
| 8,780,629 | B2 | 7/2014 | Furutani et al. |
| 8,809,853 | B2 | 8/2014 | Saito et al. |
| 9,059,029 | B2 | 6/2015 | Arai |
| 9,240,244 | B2 | 1/2016 | Nagatsuka et al. |
| 9,318,374 | B2 | 4/2016 | Atsumi et al. |
| 9,373,724 | B2* | 6/2016 | Shimizu ............ H01L 29/78606 |
| 2001/0004273 | A1 | 6/2001 | Sugimoto et al. |
| 2002/0139980 | A1 | 10/2002 | Yamazaki |
| 2007/0034873 | A1 | 2/2007 | Yamazaki et al. |
| 2007/0211535 | A1 | 9/2007 | Kim |
| 2007/0252928 | A1 | 11/2007 | Ito et al. |
| 2008/0023696 | A1 | 1/2008 | Yukawa et al. |
| 2010/0032668 | A1 | 2/2010 | Yamazaki et al. |
| 2011/0122670 | A1 | 5/2011 | Yamazaki et al. |
| 2011/0128777 | A1 | 6/2011 | Yamazaki et al. |
| 2011/0176348 | A1 | 7/2011 | Yamazaki et al. |
| 2011/0176377 | A1 | 7/2011 | Koyama |
| 2011/0205774 | A1 | 8/2011 | Takemura |
| 2011/0286256 | A1 | 11/2011 | Kamata |
| 2012/0001243 | A1 | 1/2012 | Kato |
| 2012/0106226 | A1 | 5/2012 | Saito |
| 2012/0112191 | A1 | 5/2012 | Kato et al. |
| 2012/0120715 | A1 | 5/2012 | Saito |
| 2015/0263007 | A1 | 9/2015 | Yamazaki et al. |
| 2016/0211266 | A1 | 7/2016 | Kurokawa |
| 2016/0351243 | A1 | 12/2016 | Ishizu et al. |

FOREIGN PATENT DOCUMENTS

| | | |
|---|---|---|
| JP | 2012-004556 A | 1/2012 |
| JP | 2012-114422 A | 6/2012 |
| JP | 2012-256400 A | 12/2012 |
| JP | 2013-008936 A | 1/2013 |
| JP | 2014-199707 A | 10/2014 |
| JP | 2015-222807 A | 12/2015 |
| WO | WO-2011/065258 | 6/2011 |
| WO | WO-2011/145738 | 11/2011 |
| WO | WO-2012/060202 | 5/2012 |
| WO | WO-2015/136412 | 9/2015 |

OTHER PUBLICATIONS

Written Opinion (Application No. PCT/IB2016/056202) dated Dec. 20, 2016.

Ohmaru.T, "Eight-Bit CPU With Nonvolatile Registers Capable of Holding Data for 40 Days at 85° C. Using Crystalline In—Ga—Zn Oxide Thin Film Transistors". SSDM 2012 (Extended Abstracts of the 2012 International Conference on Solid State Devices and Materials), 2012, pp. 1144-1145.

Kobayashi.H et al., "Processor with 4.9-μs break-even time in power gating using crystalline In—Ga—Zn-oxide transistor", Cool Chips XVI, Apr. 17, 2013, pp. 1-3.

Sjokvist.N et al., "Zero Area Overhead State Retention Flip Flop Utilizing Crystalline In—Ga—Zn Oxide Thin Film Transistor with Simple Power Control Implemented in a 32-bit CPU", SSDM 2013 (Extended Abstracts of the 2013 International Conference on Solid State Devices and Materials), Sep. 24, 2013, pp. 1088-1089.

Tamura.H et al., "Embedded SRAM and Cortex-M0 Core with Backup Circuits Using a 60-nm Crystalline Oxide Semiconductor for Power Gating", IEEE Cool Chips XVII, Apr. 14, 2014, p. 3pages.

Isobe.A et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor", 2014 Symposium on VLSI Circuits Digest of Technical Papers, Jun. 10, 2014, pp. 49-50.

Atsumi.T et al., "DRAM Using Crystalline Oxide Semiconductor for Access Transistors and Not Requiring Refresh for More Than Ten Days", IMW 2012 (4th IEEE International Memory Workshop), 2012, pp. 99-102, IEEE.

Nagatsuka.S et al., "A 3bit/cell Nonvolatile Memory with Crystalline In—Ga—Zn—O TFT", IMW 2013 (5th IEEE International Memory Workshop), May 26, 2013, pp. 188-191.

Ishizu.T et al., "SRAM with C-Axis Aligned Crystalline Oxide Semiconductor: Power Leakage Reduction Technique for Microprocessor Caches", IMW 2014 (6th IEEE International Memory Workshop), May 18, 2014, pp. 103-106.

Onuki.T et al., "DRAM with Storage Capacitance of 3.9 fF using CAAC-OS Transistor with L of 60 nm and having More than 1-h Retention Characteristics", SSDM 2014 (Extended Abstracts of the 2014 International Conference on Solid State Devices and Materials), Sep. 8, 2014, pp. 430-431.

Matsuzaki.T et al., "A 128kb 4b/cell Nonvolatile Memory with Crystalline In—Ga—Zn Oxide FET Using Vt Cancel Write Method", ISSCC 2015 (Digest of Technical Papers. IEEE International Solid-State Circuits Conference), Feb. 22, 2015, pp. 306-308.

Kobayashi.Y et al., "Scaling to 100nm Channel Length of Crystalline In—Ga—Zn-Oxide Thin Film Transistors with Extremely Low Off-State Current", SSDM 2013 (Extended Abstracts of the 2013 International Conference on Solid State Devices and Materials), Sep. 24, 2013, pp. 930-931.

Yakubo.Y et al., "High-speed and Low-leakage Characteristics of 60-nm C-axis Aligned Crystalline Oxide Semiconductor FET with GHz-ordered Cutoff Frequency", SSDM 2014 (Extended Abstracts of the 2014 International Conference on Solid State Devices and Materials), Sep. 8, 2014, pp. 648-649.

\* cited by examiner

4000

4000

4000

4000

4000

4000

FIG. 21A
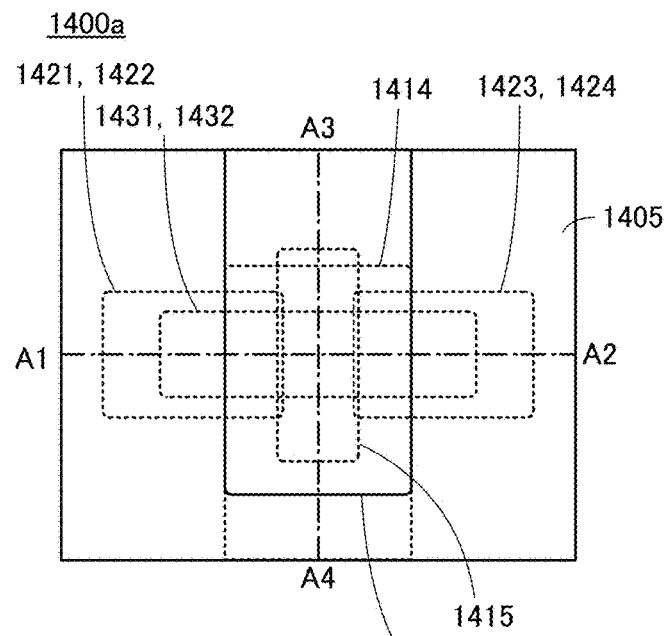
FIG. 21B
FIG. 21C
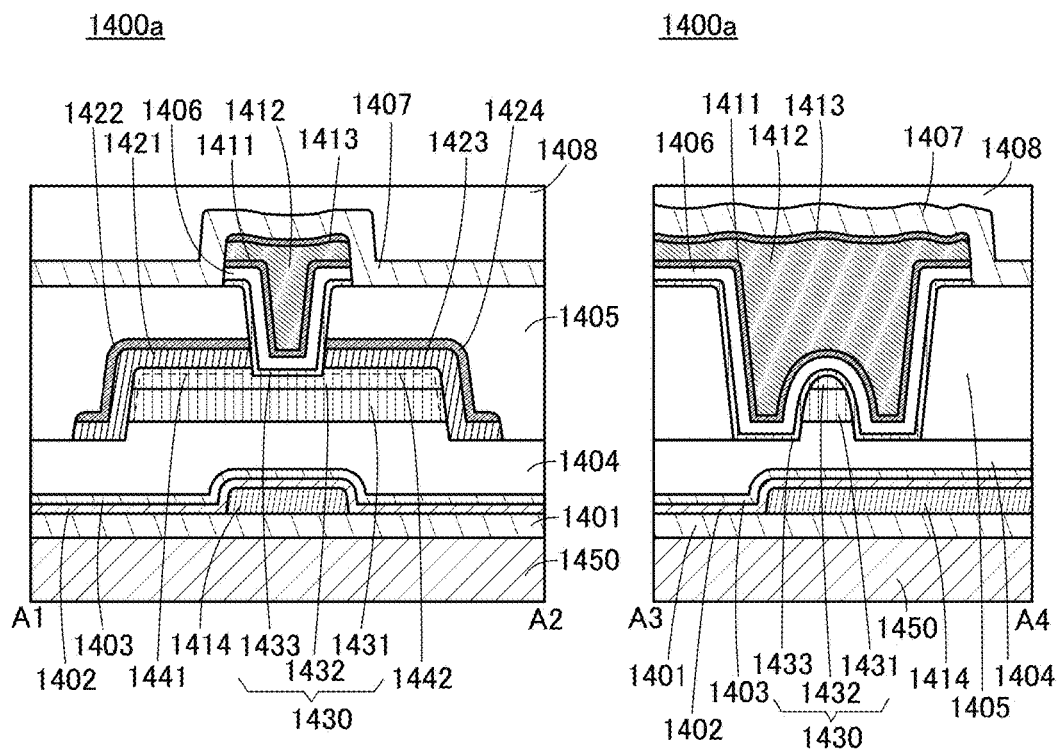

thickness of insulating film 7024 and insulating film 7022 [nm]

thickness of insulating film 7024 and insulating film 7022 [nm]

thickness of insulating film 7024 and insulating film 7022 [nm]

SEMICONDUCTOR DEVICE INCLUDING TRANSISTOR WITH BACK GATE, AND MEMORY DEVICE INCLUDING THE SEMICONDUCTOR DEVICE

TECHNICAL FIELD

In particular, one embodiment of the present invention relates to a semiconductor device or a memory device including the semiconductor device.

Note that one embodiment of the present invention is not limited to the above technical field. The technical field of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a power storage device, an imaging device, a memory device, a processor, an electronic device, a method for driving any of them, a method for manufacturing any of them, a method for testing any of them, and a system including any of them.

BACKGROUND ART

In recent years, electronic devices including central processing units (CPUs), memory devices, and sensors have been used as various electronic devices such as personal computers, smartphones, and digital cameras. The electronic devices have been improved to achieve miniaturization, lower power consumption, and other various objectives.

In particular, with a recent increase in the amount of data handled, a memory device having high storage capacity has been required. Patent Documents 1 and 2 disclose semiconductor devices where multilevel data can be written and read.

Furthermore, with a reduction in the size of electronic devices, semiconductor devices in the electronic devices have seen a need for miniaturization. That is, a memory device having both characteristics of miniaturization and a large capacity is required.

REFERENCE

Patent Document

[Patent Document 1] Japanese Published Patent Application No. 2012-256400
[Patent Document 2] Japanese Published Patent Application No. 2014-199707

Non-Patent Document

[Non-Patent Document 1] T. Ohmaru, et al., "Eight-bit CPU with Nonvolatile Registers Capable of Holding Data for 40 Days at 85° C. Using Crystalline In—Ga—Zn Oxide Thin Film Transistors," Ext. Abstr. Solid-State Devices and Materials, 2012, pp. 1144-1145.
[Non-Patent Document 2] H. Kobayashi et al., "Processor with 4.9-μs break-even time in power gating using crystalline In—Ga—Zn-oxide transistor," Cool Chips XVI, Session VI, 2013.
[Non-Patent Document 3] S. Niclas et al., "Zero Area Overhead State Retention Flip Flop Utilizing Crystalline In—Ga—Zn Oxide Thin Film Transistor with Simple Power Control Implemented in a 32-bit CPU," Ext. Abstr. Solid-State Devices and Materials, 2013, pp. 1088-1089.
[Non-Patent Document 4] H. Tamura et al., "Embedded SRAM and Cortex-M0 Core with Backup Circuits Using a 60-nm Crystalline Oxide Semiconductor for Power Gating," COOL Chips XVII, Session XII, 2014.
[Non-Patent Document 5] A. Isobe et al., "A 32-bit CPU with Zero Standby Power and 1.5-clock Sleep/2.5-clock Wake-up Achieved by Utilizing a 180-nm C-axis Aligned Crystalline In—Ga—Zn Oxide Transistor," *IEEE Symp. VLSI circuits*, 2014, pp. 49-50.
[Non-Patent Document 6] T. Atsumi et al., "DRAM Using Crystalline Oxide Semiconductor for Access Transistors and not Requiring Refresh for More Than Ten Days," International Memory Workshop, 2012, pp, 99-102.
[Non-Patent Document 7] S. Nagatsuka et al., "A 3 bit/cell Nonvolatile Memory with Crystalline In—Ga—Zn—O TFT," International Memory Workshop, 2013, pp, 188-191.
[Non-Patent Document 8] T. Ishizu et al., "SRAM with C-Axis Aligned Crystalline Oxide Semiconductor: Power Leakage Reduction Technique for Microprocessor Caches," International Memory Workshop, 2014, pp. 103-106.
[Non-Patent Document 9] T. Onuki et al., "DRAM with Storage Capacitance of 3.9 fF using CAAC-OS Transistor with L of 60 nm and having More Than 1-h Retention Characteristics," Ext. Abstr. Solid-State Devices and Materials, 2014, pp. 430-431
[Non-Patent Document 10] T. Matsuzaki et al., "A 128 kb 4 bit/cell nonvolatile memory with crystalline In—Ga—Zn oxide FET using Vt cancel write method," ISSCC Dig. Tech. Papers, pp. 306-307, February, 2015.
[Non-Patent Document 11] Y. Kobayashi et al., "Scaling to 100 nm Channel Length of Crystalline In—Ga—Zn-Oxide Thin Film Transistors with Extremely Low Off-State Current," Ext. Abstr. Solid-State Devices and Materials, 2013, pp. 930-931.
[Non-Patent Document 12] Y. Yakubo et al., "High-speed and Low-leakage Characteristics of 60-nm C-axis Aligned Crystalline Oxide Semiconductor FET with GHz-ordered Cutoff Frequency," Ext. Abstr. Solid-State Devices and Materials, 2014, pp. 648-649.

DISCLOSURE OF INVENTION

In a memory cell including two transistors and one capacitor (2T1C-type memory cell), a first terminal of a first transistor (writing transistor) is electrically connected to a first terminal of the capacitor and a gate of a second transistor (reading transistor) through a retention node. Such a memory cell stores data by charging and discharging of the retention node, so that deterioration does not occur in principle. Therefore, the memory cell is less likely to cause an error due to deterioration than a flash memory. When a transistor including an oxide semiconductor in a channel formation region is used as the writing transistor, soft-error tolerance can be obtained. Since off-state current of the transistor including an oxide semiconductor in a channel formation region is extremely low, leakage current flowing through the writing transistor due to charge of the retention node can be small. Therefore, data can be retained for a long time without performing refresh operations on retained electric charge.

The 2T1C-type memory cell can change the potential of the retention node in the memory cell by changing a control voltage of the capacitor (boosting effect). Thus, in a NAND memory device including 2T1C-type memory cells, current supplied to a reading transistor in a non-selected memory cell can be controlled by changing the potential of the retention node in the memory cell with the use of control voltage of a capacitor included in the non-selected memory cell.

However, when the potential of the retention node in the memory cell is increased, high electrical stress is applied to elements connected to the retention node such as a transistor and a capacitor. In the case where a withstand voltage of the element is low, electrostatic discharge of the element occurs as the potential of the retention node is increased, which leads to breakdown of a memory device including in the element.

Miniaturization of a memory device is also required with a reduction in the size of electronic devices. Since a withstand voltage of an element included in a memory device tends to be low when the memory device is miniaturized, a structure of a memory cell in which the element is not broken by electrostatic breakdown or the like is required.

It is an object of one embodiment of the present invention to provide a novel semiconductor device. Another object of one embodiment of the present invention is to provide a memory device including the novel semiconductor device. Another object of one embodiment of the present invention is to provide an electronic device using the memory device including the novel semiconductor device. Another object of one embodiment of the present invention is to provide a system that uses a memory device including the novel semiconductor device.

Another object of one embodiment of the present invention is to provide a memory device with high data capacity. Another object of one embodiment of the present invention is to provide a miniaturized memory device. Another object of one embodiment of the present invention is to provide a memory device with low power consumption.

Note that the objects of the present invention are not limited to the above objects. The above objects do not disturb the existence of other objects. The other objects are not described above and will be described below. The other objects will be apparent from and can be derived from the description of the specification, the drawings, and the like by those skilled in the art. One embodiment of the present invention achieves at least one of the above objects and the other objects. One embodiment of the present invention does not necessarily achieve all the above objects and the other objects.

(1) One embodiment of the present invention is a semiconductor device including a first transistor and a circuit. The circuit includes a second to a (2n+1)th transistor, a first to an n-th capacitor, a first wiring, and a first to an n-th retention node (n is an integer greater than or equal to 2). The (2i+1)th transistor includes a back gate is an integer greater than or equal to 1 and less than or equal to n). A first terminal of the 2i-th transistor is electrically connected to a gate of the (2i+1)th transistor and a first terminal of the i-th capacitor through the i-th retention node. A first terminal of the first transistor is electrically connected to a second terminal of the 2i-th transistor. A second terminal of the (2i−1)th transistor is electrically connected to a first terminal of the (2i+1)th transistor. A back gate of the (2j−1)th transistor is electrically connected to a back gate of the (2j+1)th transistor (is an integer greater than or equal to 2 and less than or equal to n).

(2) Another embodiment of the present invention is the semiconductor device according to (1), in which the first transistor includes silicon in a channel formation region and the second to the (2n+1)th transistor include an oxide semiconductor in a channel formation region.

(3) Another embodiment of the present invention is the semiconductor device according to (1), in which the first transistor includes a back gate. The back gate of the first transistor is electrically connected to a back gate of the third transistor.

(4) Another embodiment of the present invention is the semiconductor device according to (3), in which the first to the (2n+1)th transistor include an oxide semiconductor in a channel formation region.

(5) Another embodiment of the present invention is the semiconductor device according to any one of (1) to (4), which further includes a memory cell array including a first transistor and a circuit. The memory cell array may further include the plurality of first transistors and the plurality of circuits.

(6) Another embodiment of the present invention is a semiconductor device including the plurality of memory cell arrays according to (5). The plurality of memory cell arrays include an overlapping region.

(7) Another embodiment of the present invention is the semiconductor device according to any one of (1) to (6), in which the i-th retention node is configured to retain M-bit (M is an integer greater than or equal to 1) data.

(8) Another embodiment of the present invention is a memory device including the semiconductor device according to any one of (1) to (7) and a driver circuit.

(9) Another embodiment of the present invention is the memory device according to (8), which has a storage capacity of one terabyte or more.

(10) Another embodiment of the present invention is an electronic device including the memory device according to (8) or (9) and a housing.

The storage capacity of the memory device is described below.

FIG. 2C is a schematic view of a stacked-layer structure of a nonvolatile memory that is manufactured using transistors whose channel formation regions include an oxide semiconductor (hereinafter referred to as OS transistors). Note that in the present specification, a nonvolatile memory using OS transistors is sometimes referred to as a nonvolatile oxide semiconductor random access memory (NOSRAM).

FIGS. 2A and 2B are conceptual diagrams illustrating the case where NOSRAMs are stacked to provide a multi-level memory device. When a one-layer NOSRAM is a minimum unit of a memory cell, J-bit ($2^J$ values, where J is an integer of 1 or more) data is stored in one memory cell, and the memory cells are stacked in K layers (K is an integer of 2 or more), the NOSRAMs can retain J×K-bit ($2^{J \times K}$ values) data in total. FIG. 2B is a conceptual diagram illustrating the case where one memory cell stores 4-bit data (J=4). FIG. 2A is a conceptual diagram illustrating the case where the above memory cells are stacked in four layers (K=4) and 4×4=16 bits are assumed as one word.

The circuit diagram in FIG. 2D shows a configuration example of a memory cell 6100 that can retain the above J-bit data. The memory cell 6100 preferably includes a transistor OS1, a transistor OS2, and a capacitor C0. One of a source and a drain of the transistor OS1 is electrically connected to a gate of the transistor OS2. One terminal of the capacitor C0 is electrically connected to the gate of the transistor OS2.

The transistors OS1 and OS2 are preferably OS transistors. An OS transistor has an extremely low off-state current;

thus, data written in the gate of the transistor OS2 can be retained for a long time by turning off the transistor OS1.

Each of the transistors OS1 and OS2 preferably has a first gate and a second gate (BG). The first gate preferably includes a region which overlaps with the second gate with a channel formation region provided therebetween. When the transistors OS1 and OS2 each have a second gate, the threshold voltage of the transistors can be controlled. Moreover, on-state current of the transistors can be increased.

The schematic view in FIG. 2C illustrates a structure example of a memory device 6000. The memory device 6000 includes the memory cells 6100 that are stacked. The memory device 6000 includes a CMOS layer including Si transistors and first to fourth OS layers including OS transistors. The first to fourth OS layers are formed over the CMOS layer. The first to fourth OS layers each include the memory cell 6100. The CMOS layer has a function of controlling the memory cells.

FIG. 3 illustrates detailed configuration examples of the first OS layer and the second OS layer in the memory device 6000. The left half of FIG. 3 shows circuit diagrams and the right half of FIG. 3 shows cross-sectional views corresponding to the circuit diagrams.

In the first OS layer, the gate of the transistor OS1 is electrically connected to a wiring WL1. The other of the source and the drain of the transistor OS1 is electrically connected to a wiring BL1. One of a source and a drain of the transistor OS2 is electrically connected to a wiring SL1. The other of the source and the drain of the transistor OS2 is electrically connected to a wiring RBL1. The other terminal of the capacitor C0 is electrically connected to a wiring CNODE1.

In the second OS layer, the gate of the transistor OS1 is electrically connected to a wiring WL2. The other of the source and the drain of the transistor OS1 is electrically connected to a wiring BL2. One of the source and the drain of the transistor OS2 is electrically connected to a wiring SL2. The other of the source and the drain of the transistor OS2 is electrically connected to a wiring RBL2. The other terminal of the capacitor C0 is electrically connected to a wiring CNODE2.

In the third OS layer, the gate of the transistor OS1 is electrically connected to a wiring WL3. The other of the source and the drain of the transistor OS1 is electrically connected to a wiring BL3. One of a source and a drain of the transistor OS2 is electrically connected to a wiring SL3. The other of the source and the drain of the transistor OS2 is electrically connected to a wiring RBL3. The other terminal of the capacitor C0 is electrically connected to a wiring CNODE3.

In the fourth OS layer, the gate of the transistor OS1 is electrically connected to a wiring WL4. The other of the source and the drain of the transistor OS1 is electrically connected to a wiring BL4. One of the source and the drain of the transistor OS2 is electrically connected to a wiring SL4. The other of the source and the drain of the transistor OS2 is electrically connected to a wiring RBL4. The other terminal of the capacitor C0 is electrically connected to a wiring CNODE4.

A flash memory has a limit on the number of times of data rewriting and needs to erase old data when retained data is updated. The memory device 6000 does not have a limit on the number of times of data rewriting, and data can be rewritten $10^{12}$ times or more. In addition, new data can be written in the memory device 6000 without erasing old data. The memory device 6000 can write and read data at a lower voltage than a flash memory. Since OS transistors can be easily stacked, the memory device 6000 can easily become a multi-level memory device.

Table 1 shows the technology node of the OS transistor included in the NOSRAM, the area occupied by the memory cell 6100 ($F^2$/cell, Cell area), and the area per bit of the memory cell 6100 ($F^2$/bit, Area per bit). Note that as the area per bit (hereinafter referred to as bit area), values obtained when memory cell arrays including the memory cells 6100 are stacked in four layers as illustrated in FIG. 2C are listed. Note that the technology node of an OS transistor primarily means the channel length of the OS transistor. Table 1 also shows, for comparison, values of a solid state drive (SSD) with 256 GB (gigabytes) fabricated using a three-dimensional NAND flash memory.

TABLE 1

| Technology node (Design rule) | $F^2$/cell | $F^2$/bit (4-layered) | Cell Area | Area per bit (4-layered) |
|---|---|---|---|---|
| 10 nm | ≥16.5 | ≥1.03 | 0.0016 µm² (1600 nm²) | 0.00010 µm² (100 nm²) |
| 15 nm | ≥16.5 | ≥1.03 | 0.0037 µm² (3700 nm²) | 0.00023 µm² (230 nm²) |
| 30 nm | ≥16.5 | ≥1.03 | 0.0150 µm² (15000 nm²) | 0.00095 µm² (950 nm²) |
| 3D-NAND | ≥5.2 | ≥2.6 | 0.0179 µm² (17900 nm²) | 0.00028 µm² (280 nm²) |

Next, the bit area as a function of the number of stacked layers of the memory cell arrays including the memory cells 6100 is discussed. FIG. 4 is a graph whose vertical axis represents the hit area and whose horizontal axis represents the number of stacked layers of the memory cells 6100. From FIG. 4, the memory cell arrays including the memory cells 6100 each of which is manufactured using an OS transistor with the 15-nm node and which are stacked in four layers have substantially the same bit area as a 256-GByte SSD. Furthermore, the memory cell arrays including the memory cells 6100 each of which is manufactured using an OS transistor with the 10-nm node and which are stacked in six layers have substantially the same bit area as a 1-TByte (terabyte) SSD.

FIG. 5 shows a change in channel length of OS transistors which have been reported at academic conferences or the like (see Non-Patent Documents 1 to 12). In FIG. 5, 1) to 12) respectively denote the channel lengths of OS transistors disclosed in Non-Patent Documents 1 to 12. From FIG. 5, the scaling of OS transistors is such that the channel length is reduced by half in six months. For comparison, FIG. 5 also shows an example of Si transistors (hereinafter referred to as Si-FETs). The OS transistors are miniaturized in a shorter period than the Si-FETs. FIG. 5 also reveals that the channel length of OS transistors can reach that of Si-FETs in 2016.

One embodiment of the present invention can provide a novel semiconductor device. Another embodiment of the present invention can provide a memory device including the novel semiconductor device. Another embodiment of the present invention can provide an electronic device using the memory device including the novel semiconductor device. Another embodiment of the present invention can provide a system that uses a memory device including the novel semiconductor device.

Another embodiment of the present invention can provide a memory device with high data capacity Another embodiment of the present invention can provide a miniaturized memory device. According to another embodiment of the present invention, a memory device with low power consumption can be provided.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF DRAWINGS

FIGS. 21A to 21C are a top view and cross-sectional views illustrating a structure example of a transistor.

BEST MODE FOR CARRYING OUT THE INVENTION

Figure 1:
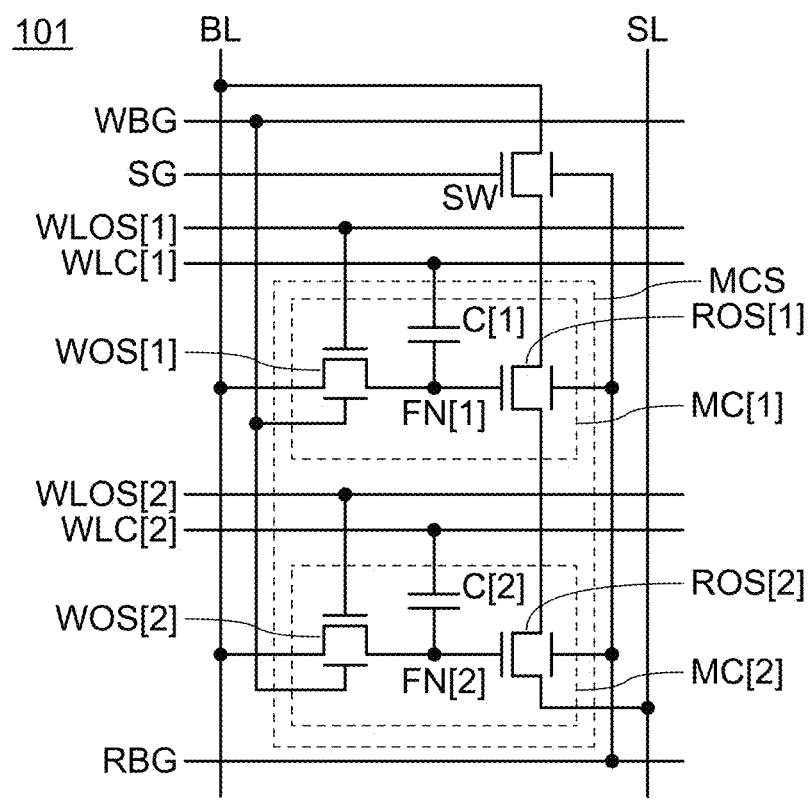
FIG. 1 is a circuit diagram of an example of a string included in a semiconductor device.
Figure 2A:
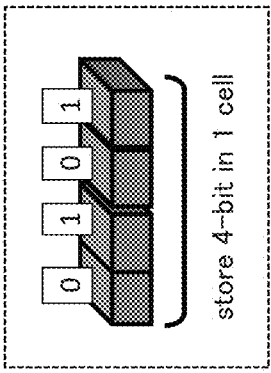
FIGS. 2A to 2D are conceptual diagrams, a schematic view, and a circuit diagram illustrating a configuration example of a memory device.
Figure 2C:
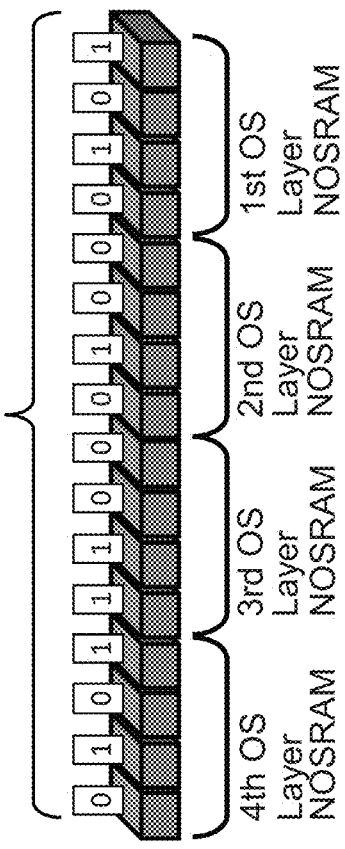
Figure 2B:
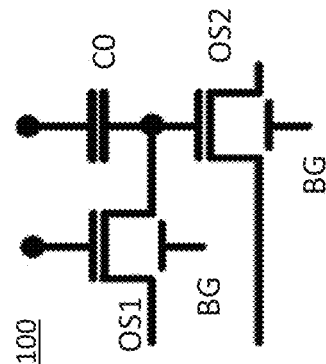
Figure 2D:
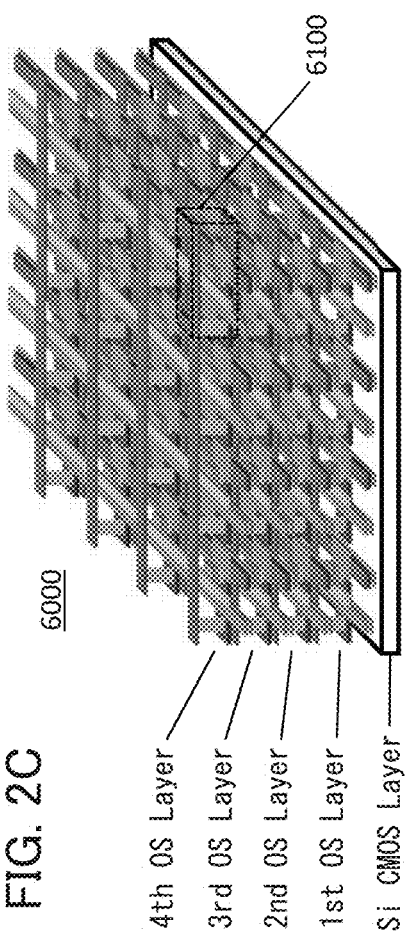
Figure 3:
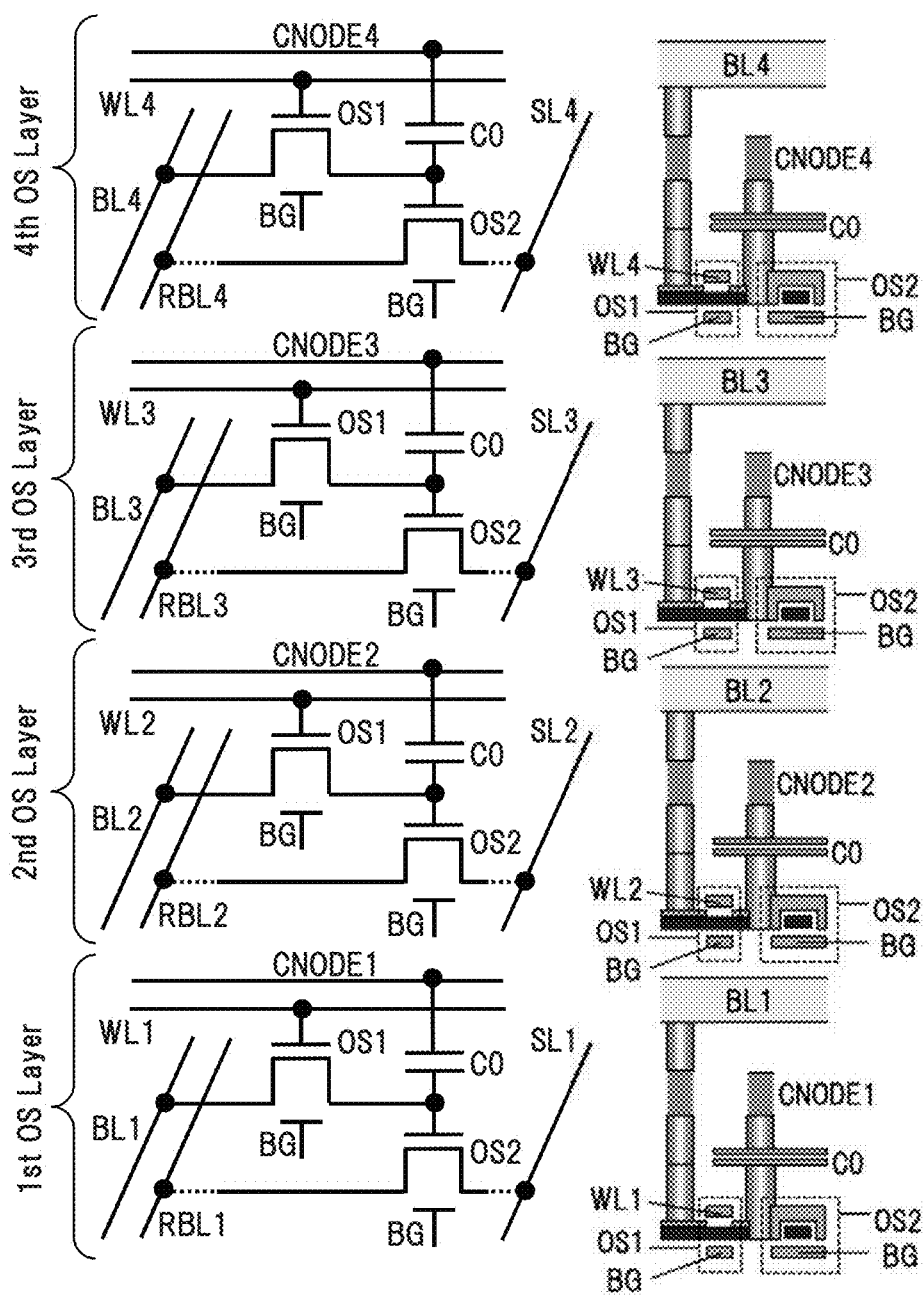
FIG. 3 shows circuit diagrams and cross-sectional views showing a configuration example of a memory device.
Figure 4:
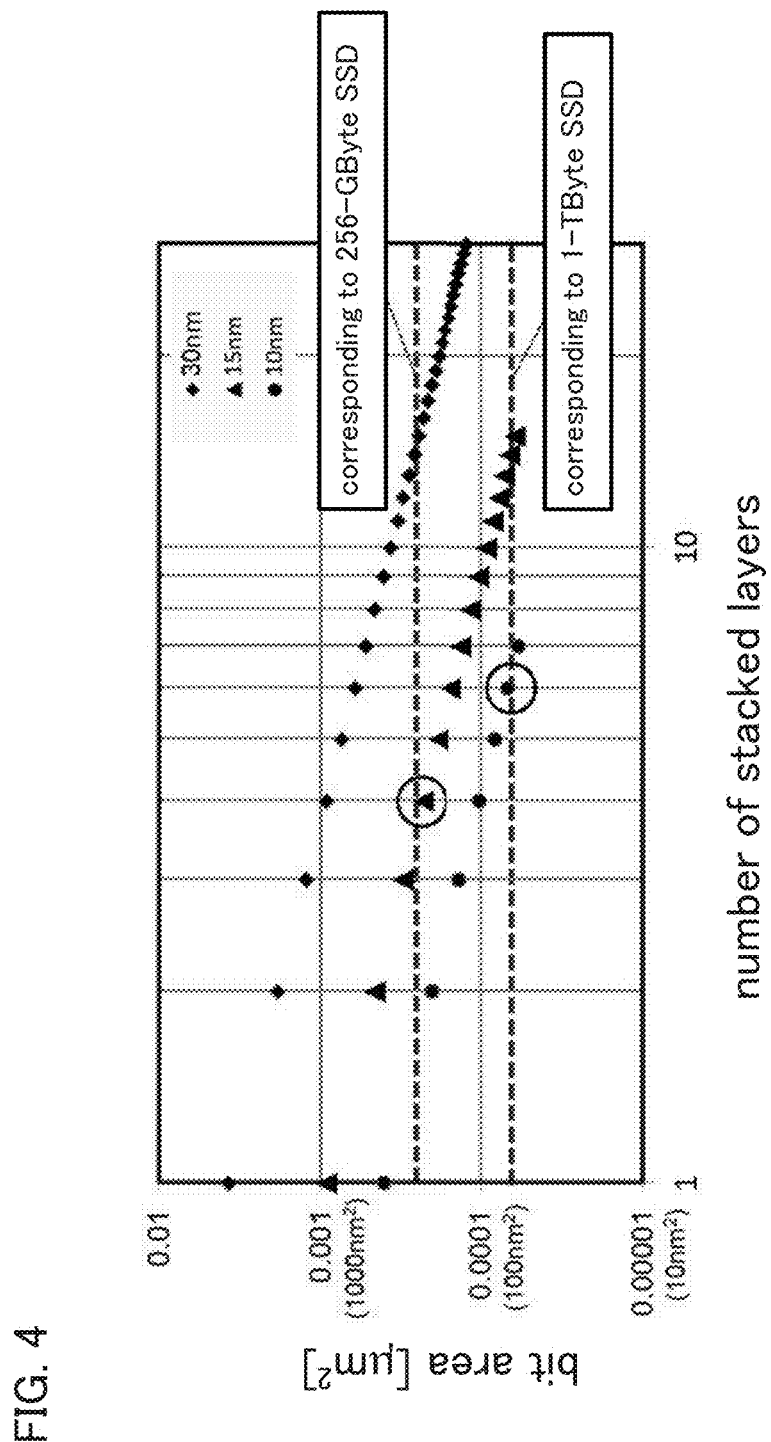
FIG. 4 shows a relation between the number of stacked layers of memory cells and bit area of a memory device.
Figure 5:
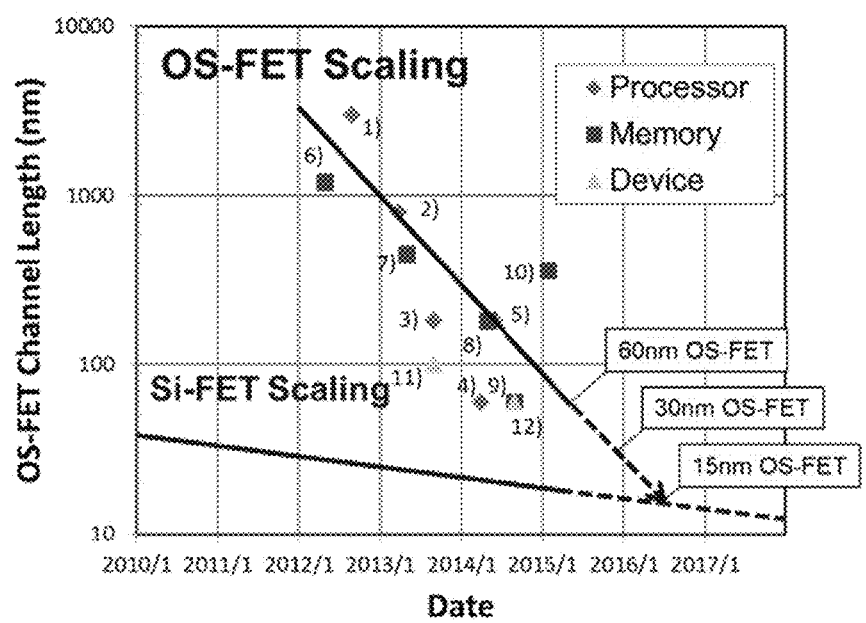
FIG. 5 shows changes in channel length of an OS transistor.

An "electronic device", an "electronic component", a "module", and a "semiconductor device" are described. In general, an "electronic device" may refer to as a personal computer, a mobile phone, a tablet terminal, an e-book reader, a wearable terminal, an audiovisual (AV) device, an electronic appliance, a household appliance, an industrial appliance, a digital signage, a car, or an electric appliance including a system, for example. An "electronic component" or a "module" may refer to a processor, a memory device, a sensor, a battery, a display device, a light-emitting device, an interface device, a radio frequency (RF) tag, a receiver, or a transmitter included in an electronic device. A "semiconductor device" may refer to a device including a semiconductor element or a driver circuit, a control circuit, a logic circuit, a signal generation circuit, a signal conversion circuit, a potential level converter circuit, a voltage source, a current source, a switching circuit, an amplifier circuit, a memory circuit, a memory cell, a display circuit, a display pixel, or the like which includes a semiconductor element and is included in an electronic component or a module.

Note that the above categorization is one example, and an "electronic device", an "electronic component", a "module", and a "semiconductor device" in this specification and the like are not limited by the above categorization. An "electronic device", an "electronic component", a "module", and a "semiconductor device" cannot be strictly distinguished from each other in some cases because distinctions between them are vague depending on roles, functions, components, use states, definitions, and the like thereof. For example, although a display device corresponds to an "electronic component" according to the above definition, the display device may also correspond to an "electronic device" in the case where the display device refers to an electronic appliance such as a television receiver. Although a memory circuit corresponds to a "semiconductor device" according to the above definition, the memory circuit may also correspond to an "electronic component" or a "module" in the case where the memory circuit is regarded as one kind of memory devices. In the case where a "semiconductor device" is defined as a device including a semiconductor element, for example, an "electronic device", an "electronic component", and a "module" including semiconductor elements can each be regarded as a "semiconductor device".

Accordingly, an "electronic device" described in this specification can be called an "electronic component", a "module", or a "semiconductor device" in some cases. Similarly, an "electronic component" described in this specification can be called an "electronic device", a "module", or a "semiconductor device" in some cases. Similarly, a "module" described in this specification can be called an "electronic device", an "electronic component", or a "semiconductor device" in some cases. Similarly, a "semiconductor device" described in this specification can be called an "electronic device", an "electronic component", or a "module" in some cases.

Embodiment 1

In this embodiment, an example of a semiconductor device included in a memory device according to the disclosed invention will be described.

Structure Example

FIG. 1 shows an example of a string of a memory cell array included in a semiconductor device of one embodiment of the present invention. A string 101 includes two memory cells. The string 101 includes a circuit unit MCS and a transistor SW. The circuit unit MCS includes a memory cell MC[1] and a memory cell MC[2].

The transistor SW includes a back gate. Note that the transistor SW is preferably an OS transistor. Depending on circumstances or conditions, the transistor SW may be a transistor which does not include a back gate and contains silicon in a channel formation region.

The memory cell MC[1] includes a transistor WOS[1], a transistor ROS[1], and a capacitor C[1]. In particular, the transistor WOS[1] and the transistor ROS[1] each include a back gate. Note that each of the transistor WOS[1] and the transistor ROS[1] is preferably an OS transistor.

The memory cell MC[2] includes a transistor WOS[2], a transistor ROS[2], and a capacitor C[2]. In particular, the transistor WOS[2] and the transistor ROS[2] each include a back gate. Note that each of the transistor WOS[2] and the transistor ROS[2] is preferably an OS transistor.

A first terminal of the transistor WOS[1] is electrically connected to a gate of the transistor ROS[1] and a first terminal of the capacitor C[1], and the connection portion is a node FN[1]. A gate of the transistor WOS[1] is electrically connected to a wiring WLOS[1], and a second terminal of the capacitor C[1] is electrically connected to a wiring WLC[1].

A first terminal of the transistor WOS[2] is electrically connected to a gate of the transistor ROS[2] and a first terminal of the capacitor C[2], and the connection portion is a node FN[2]. A gate of the transistor WOS[2] is electrically connected to a wiring WLOS[2], and a second terminal of the capacitor C[2] is electrically connected to a wiring WLC[2].

A second terminal of the transistor WOS[1], a second terminal of the transistor WOS[2], and a first terminal of the transistor SW are electrically connected to a wiring BL. A back gate of the transistor WOS[1] and a back gate of the transistor WOS[2] are electrically connected to a wiring WBG. A gate of the transistor SW is electrically connected to a wiring SG. A back gate of the transistor ROS[1], a back gate of the transistor ROS[2], and a back gate of the transistor SW are electrically connected to a wiring RBG. A second terminal of the transistor SW is electrically connected to a first terminal of the transistor ROS[1], a second terminal of the transistor ROS[1] is electrically connected to a first terminal of the transistor ROS[2], and a second terminal of the transistor ROS[2] is electrically connected to a wiring SL.

Here, the role of the back gate of the transistor ROS[1] or ROS[2] included in the string 101 according to the semiconductor device of one embodiment of the present invention is described. The threshold voltages of the transistors ROS[1] and ROS[2] can be controlled by supplying potentials to the back gates of the transistors ROS[1] and ROS[2] through the wiring RGB.

Note that when a potential is input to one of the first terminal and the second terminal of the transistor ROS[1], a potential output from the other of the first terminal and the second terminal of the transistor ROS[1] is determined by a potential of the node FN[1] input to the gate of the transistor ROS[1]. Here, the potential output from the other of the first terminal and the second terminal of the transistor ROS[1] can be stepped up by applying a high-level potential to the back gate of the transistor ROS[1] and shifting the threshold voltage of the transistor ROS[1] to the positive side. That is, the potential output from the other of the first terminal and the second terminal of the transistor ROS[1] can be adjusted by controlling the threshold voltage of the transistor ROS[1]. By utilizing this effect, the potential of the other of the first terminal and the second terminal of the transistor ROS[1] can be output as a potential which is substantially equal to that of the node FN[1]. Since the potential which is at substantially equal to the potential of the node FN[1] can be output from the other of the first terminal and the second terminal of the transistor ROS[1], the potential of the node FN[1] can be read out without using a converter circuit such as an AD converter. Similarly, the potential output from the other of the first terminal and the second terminal of the transistor ROS[2] can be controlled by controlling the threshold voltage of the transistor ROS[2]. By utilizing this effect, the potential of the other of the first terminal and the second terminal of the transistor ROS[2] can be output as a potential which is substantially equal to that of the node FN[2].

In the string 101 according to the semiconductor device of one embodiment of the present invention, when a potential is input to one of the first terminal and a second terminal of the transistor ROS[1], a potential which is substantially equal to that of the node FN[1] is output from the other of the first terminal and the second terminal of the transistor ROS[1] by inputting a high-level potential to the back gate of the transistor ROS[1]. Similarly, in the string 101 according to one embodiment of the present invention, when a potential is input to one of the first terminal and a second terminal of the transistor ROS[2], a potential which is approximately the same level as a potential of the node FN[2] is output from the other of the first terminal and the second terminal of the transistor ROS[2] by inputting a high-level potential to the back gate of the transistor ROS[2].

In the string 101, the back gate of the transistor WOS[1] and the back gate of the transistor WOS[2] are electrically connected to the wiring WBG; however, one embodiment of the present invention is not limited thereto.

Figure 6A:
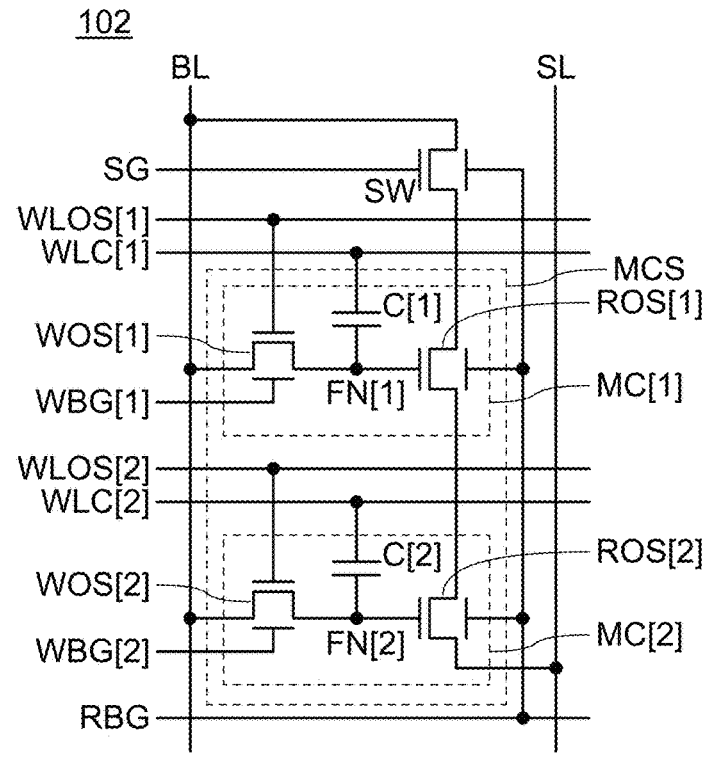
FIGS. 6A and 6B are each a circuit diagram showing an example of a string included in a semiconductor device.

For example, as shown in a string 102 illustrated in FIG. 6A, the back gate of the transistor WOS[1] and the back gate of the transistor WOS[2] may be electrically connected to a wiring WBG[1] and a wiring WBG[2], respectively. With this structure, the threshold voltages of the transistors WOS[1] and WOS[2] can be controlled independently.

Figure 6B:
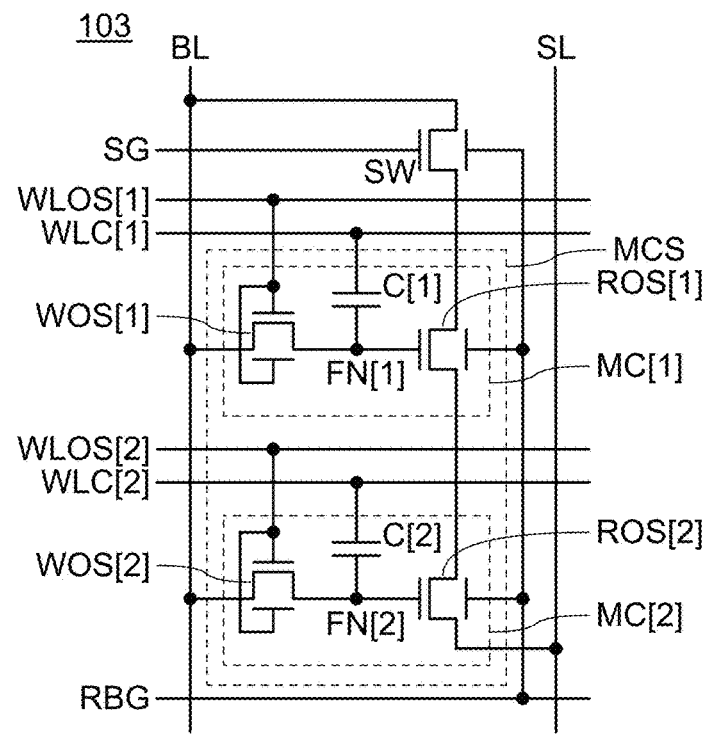

Alternatively, for example, as shown in a string 103 illustrated in FIG. 6B, the back gate of the transistor WOS[1] may be electrically connected to the gate of the transistor WOS[1] and the back gate of the transistor WOS[2] may be electrically connected to the gate the transistor WOS[2]. With this structure, on-state current supplied to the transistors WOS[1] and WOS[2] can be increased.

Figure 7:
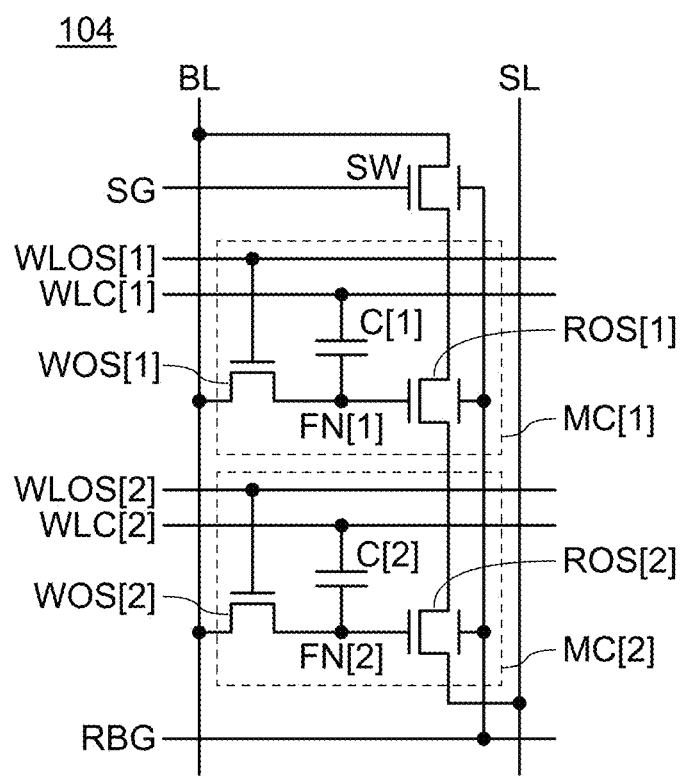
FIG. 7 is a circuit diagram showing an example of a string included in a semiconductor device.

Alternatively, for example, as shown in a string 104 illustrated in FIG. 7, a structure where the transistors WOS[1] and WOS[2] are not provided with back gates may be employed.

Note that, depending on circumstances or conditions, the transistor SW in each of the strings 102 to 104 illustrated in FIGS. 6A, 6B and 7 may be a transistor which does not include a back gate and contains silicon in a channel formation region.

Each of the strings 101 to 104 includes two memory cells; however, one embodiment of the present invention is not limited thereto. For example, a structure where three or more memory cells are included may be employed. For example, a structure where three or more memory cells are provided in the string 101 in FIG. 1 is shown in a string 105 in FIG. 8.

The string 105 includes the circuit portion MCS and the transistor SW. The circuit portion MCS includes memory cells MC[1] to MC[m] (m is an integer greater than or equal to 3). Note that the transistor SW is an OS transistor and includes a back gate.

The memory cell MC[1] includes the transistor WOS[1], the transistor ROS[1], and the capacitor C[1]. Note that each of the transistor WOS[1] and the transistor ROS[1] is an OS transistor and includes a back gate.

The memory cell MC[i] includes the transistor WOS[i], the transistor ROS[i], and the capacitor C[i] (i is an integer greater than or equal to 2 and less than or equal to m). Note that each of the transistor WOS[i] and the transistor ROS[i] is an OS transistor and includes a back gate.

The first terminal of the transistor WOS[1] is electrically connected to the gate of the transistor ROS[1] and the first terminal of the capacitor C[1], and the connection portion is the node FN[1]. The gate of the transistor WOS[1] is electrically connected to the wiring WLOS[1], and the second terminal of the capacitor C[1] is electrically connected to the wiring WLC[1].

A first terminal of the transistor WOS[i] is electrically connected to a gate of the transistor ROS[i] and a first terminal of the capacitor C[i], and the connection portion is a node FN[i]. A gate of the transistor WOS[i] is electrically connected to a wiring WLOS[i], and a second terminal of the capacitor C [i] is electrically connected to a wiring WLC[i].

Second terminals of the transistors WOS[1] to WOS[m] and the first terminal of the transistor SW are electrically connected to the wiring BL. Back gates of the transistors WOS[1] to WOS[m] are electrically connected to the wiring WBG. The gate of the transistor SW is electrically connected to the wiring SG. Back gates of transistors ROS[1] to ROS[m] and the back gate of the transistor SW are electrically connected to the wiring RBG. The second terminal of the transistor SW is electrically connected to the first terminal of the transistor ROS[1], a second terminal of the transistor ROS[i−1] is electrically connected to a first terminal of the transistor ROS[i], and a second terminal of the transistor ROS[m] is electrically connected to the wiring SL.

Figure 8:
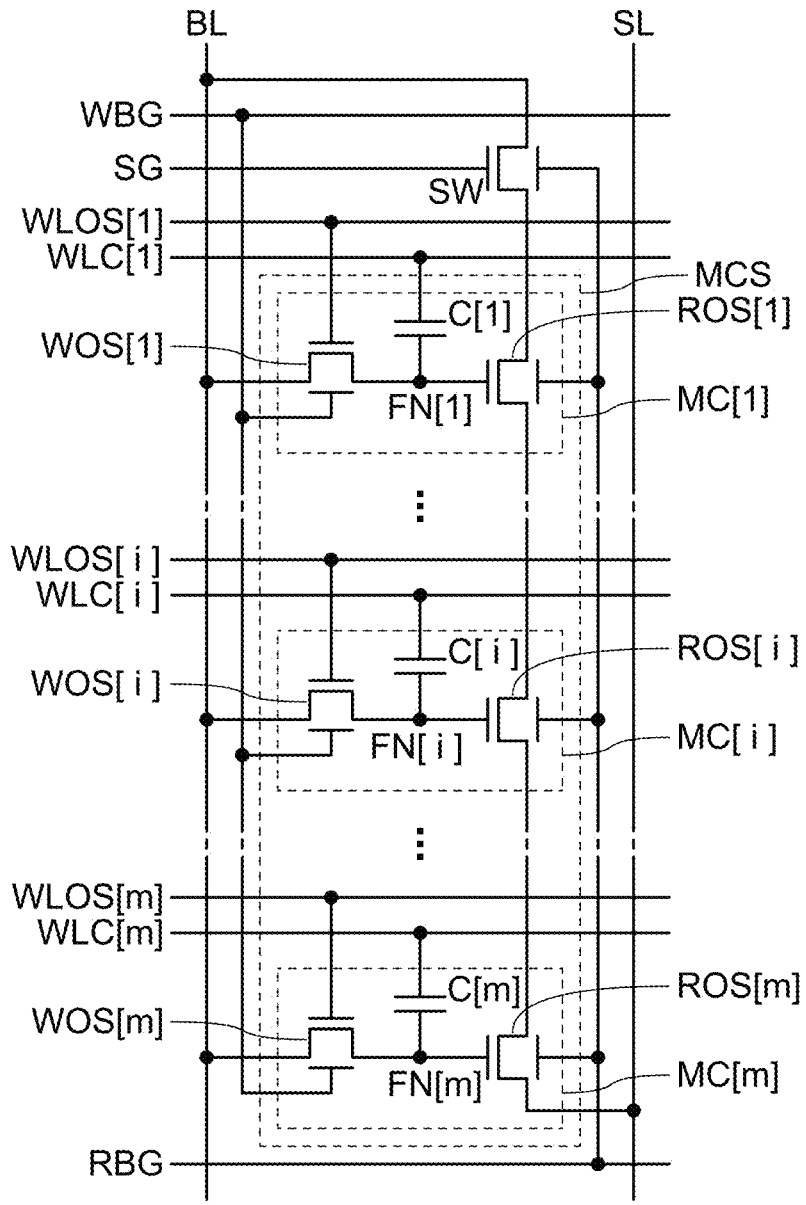
FIG. 8 is a circuit diagram showing an example of a string included in a semiconductor device.

In FIG. 8, only the following elements are shown, and the other circuits, wirings, signals, reference numerals, and the like are not shown: the string 105, the circuit portion MCS, the memory cell MC[1], the memory cell MC[i], the memory cell MC[m], the wiring WLOS[1], the wiring WLOS[i], a wiring WLOS[m], the wiring WLC[1], the wiring WLC[i], a wiring WLC[m], the wiring WOS[1], the wiring WOS[i], the wiring WOS[m], the wiring BL, the wiring SL, the wiring SG, the wiring WBG, the wiring RBG, the transistor SW, the transistor WOS[1], the transistor WOS[i], the transistor WOS[m], the transistor ROS[1], the transistor ROS[i], the transistor ROS[m], the capacitor C[1], the capacitor C[i], a capacitor C[m], the node FN[1], the node FN[i], and a node FN[m].

With the above structure of the string 105, the storage capacity can be higher than that of the string 101 and writing and reading can be performed in a manner substantially similar to that of the string 101.

Figure 9:
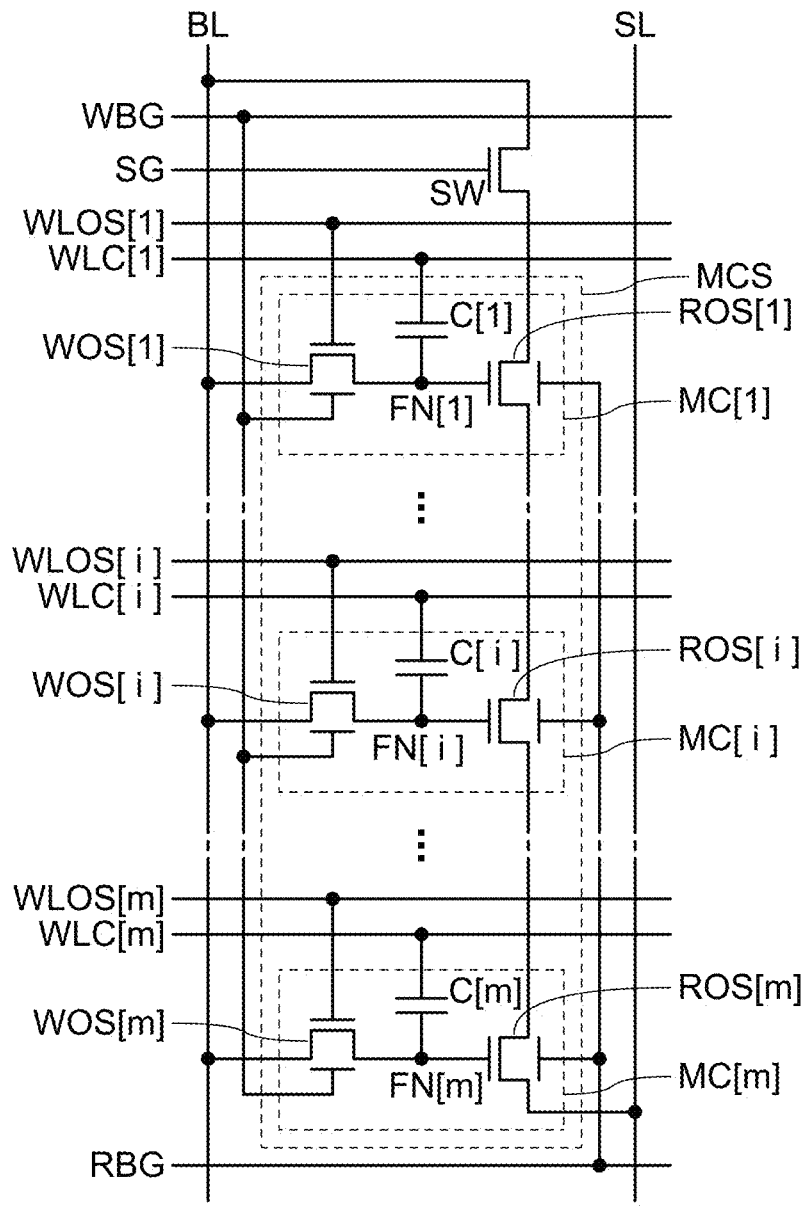
FIG. 9 is a circuit diagram showing an example of a string included in a semiconductor device.

The transistor SW in the string 105 may be a transistor which does not include a back gate and contains silicon in a channel formation region. The structure of that case is illustrated in a string 106 in FIG. 9. Although the polarity of the transistor SW is n-type in FIG. 9, one embodiment of the present invention is not limited thereto and the polarity of the transistor SW may be p-type.

Operation Example

The operation example of the semiconductor device including the string 101 is described with reference to FIGS.

10 and 11. Note that the string 101 can store four values (2 bits) per memory cell. The four values mean that four kinds of data "00", "01", "10", and "11". Potentials indicating data "00", "01", "10", and "11" are represented by $V_{00}$, $V_{01}$, $V_{10}$, and $V_{11}$, respectively.

<<Writing Operation>>

Figure 10:
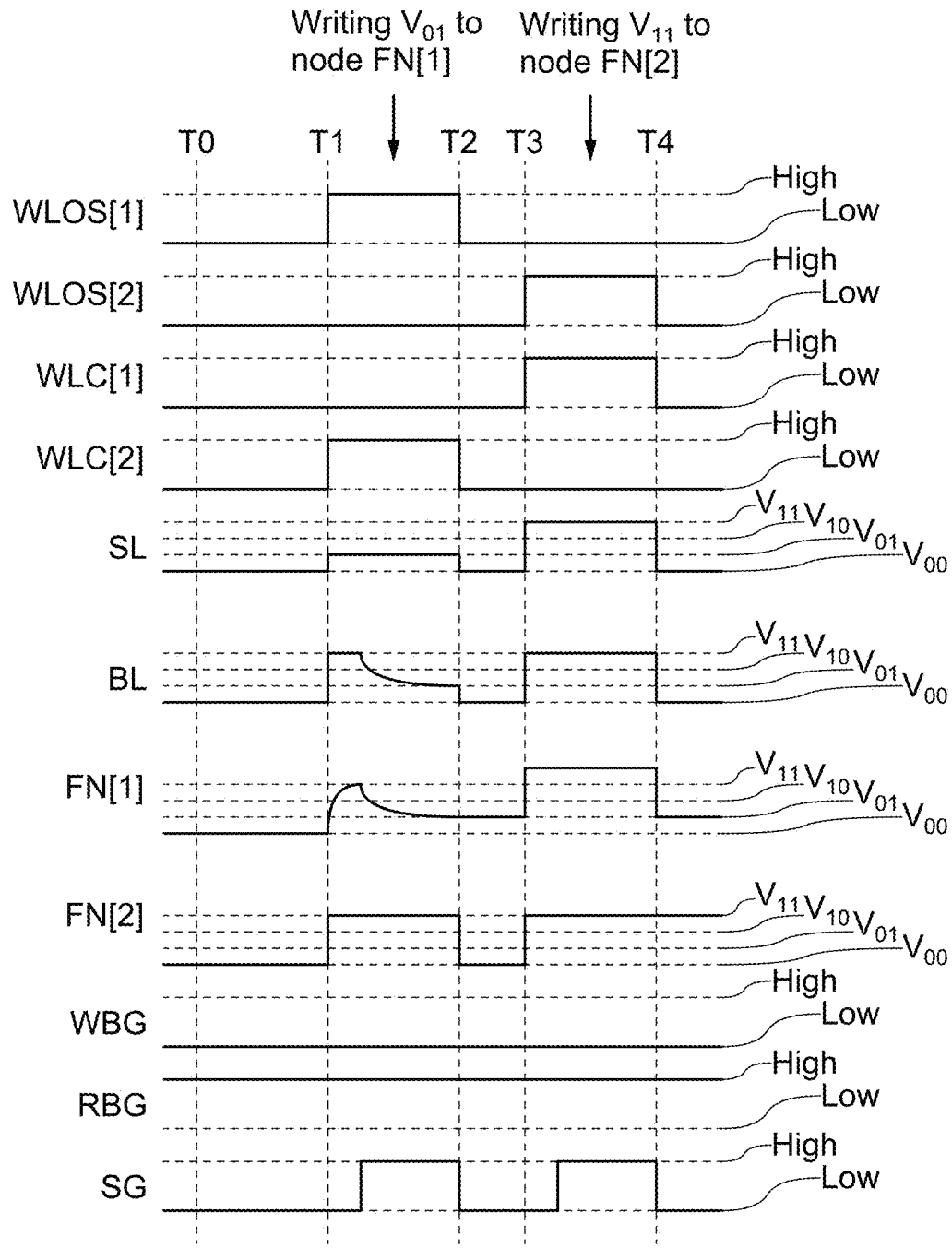
FIG. 10 is a timing chart showing an operation example of a string included in a semiconductor device.

FIG. 10 is a timing chart showing an operation of writing data to the nodes FN[1] and FN[2] in the string 101.

The timing chart in FIG. 10 shows potential changes of the wirings WLOS[1], WLOS[2], WLC[1], WLC[2], SL, BL, WBG, RBG, and SG and the nodes FN[1] and FN[2] from time T0 to T4. In the timing chart in FIG. 10, a high-level potential (indicated as High in the drawing) or a low-level potential (indicated as Low in the drawing) is input as an input potential to each of the wirings WLOS[1], WLOS[2], WLC[1], WLC[2], WBG, RBG, and SG, and the potential is input to an element. One of potentials $V_{00}$, $V_{01}$, $V_{10}$, and $V_{11}$ is applied to the wirings SL and BL, and the one of the potentials $V_{00}$, $V_{01}$, $V_{10}$, and $V_{11}$ is held at the nodes FN[1] and FN[2]. Potentials which are input to or held at the wirings and nodes are not limited to the above, and potentials other than those described above may be input or held depending on circumstances or conditions.

The timing chart in FIG. 10 shows an operation of writing $V_{01}$ to the node FN[1] and an operation of writing $V_{11}$ to the node FN[2] as an example. Specifically, the operation of writing $V_{01}$ to the node FN[1] is performed in a period from time T1 to T2 and the operation of writing $V_{11}$ to the node FN[2] is performed in a period from time T3 to T4.

[Time T0 to T1]

From time T0 to T1, a low-level potential from the wiring WLOS[1] and a low-level potential from the wiring WLC[1] are input to the memory cell MC[1]. In addition, a low-level potential from the wiring WLOS[2] and a low-level potential from the wiring WLC[2] are input to the memory cell MC[2]. Furthermore, a low-level potential from the wiring WBG is input to the memory cells MC[1] and MC[2].

Therefore, both the transistors WOS[1] and WOS[2] are turned off. Since the second terminals of the capacitors C[1] and C[2] have the low-level potentials, the potential change (boosting effect) is not caused at both the nodes FN[1] and FN[2]. Furthermore, since the low-level potential is input to each of the back gates of the transistors WOS[1] and WOS[2], changes in threshold voltages of the transistors WOS[1] and WOS[2] are not caused.

The potential $V_{00}$ from the wiring SL, the potential $V_{00}$ from the wiring BL, and a high-level potential from the wiring RBG are input to the memory cells MC[1] and MC[2]. Then, a low-level potential from the wiring SG is input to the transistor SW.

Thus, since a high-level potential is input to the back gate of the transistor ROS[1], the back gate of the transistor ROS[2], and the back gate of the transistor SW, the threshold voltages of the transistor ROS[1], the transistor ROS[2], and the transistor SW are shifted in the negative direction.

[Time T1 to T2]

From time T1 to T2, the potential of the wiring WLOS[1] is stepped up to a high-level potential. Thus, the high-level potential is input to the gate of the transistor WOS[1], whereby the transistor WOS[1] is turned on.

From time T1 to T2, a potential of the wiring WLC[2] is stepped up to a high-level potential. Here, the potential of the node FN[2] is increased by a capacitive coupling of the capacitor C[2]. The increase amount of the potential of the node FN[2] is obtained by multiplication of a capacitive coupling coefficient determined by the structure of the memory cell MC[2] by the step-up amount of the potential of the wiring WLC[2]. In this specification, the increase amount of the potential of the node FN[2] is equal to the step-up amount of the potential of the wiring WLC[2]. This means that the capacitive coupling coefficient of the memory cell MC[2] is 1.

At time T1, a high-level potential is input from the wiring BL. Here, the high-level potential is preferably higher than or equal to $V_{11}$ (The wiring BL is precharged to the potential $V_{11}$ in the timing chart of FIG. 10). Since the transistor WOS[1] is in on-state, the potential of the node FN[1] is stepped up to the high-level potential.

At time T1, a potential of $V_{01}$ is input from the wiring SL as a potential to be written to the node FN[1].

When a sufficient time has elapsed after the high-level potential is input from the wiring BL to the node FN[1] at time T1, the supply of the potential from the wiring BL is stopped to bring the wiring BL into a floating state. Here, a high-level potential is input from the wiring SG, so that the transistor SW is turned on.

Here, the gates of the transistors ROS[1] and ROS[2] have high-level potentials and the threshold voltages of the transistors are shifted in the negative direction, so that the transistor ROS[1] and the transistor ROS[2] are turned on. Thus, charge accumulated in the wiring BL flows to the wiring SL through the transistors SW, ROS[1], and ROS[2], whereby a potential of the wiring BL becomes substantially equal to the potential of the wiring SL. That is, the potential of the wiring BL is $V_{01}$ and the potential of the node FN[1] is $V_{01}$.

[Time T2 to T3]

From time T2 to T3, the potential of the wiring WLOS[1] is stepped down to the low-level potential. Thus, the low-level potential is input to the gate of the transistor WOS[1], whereby the transistor WOS[1] is turned off.

In addition, a potential of the wiring SG is stepped down to a low-level potential. Thus, the low-level potential is input to the gate of the transistor SW, whereby the transistor SW is turned off. Therefore, the wiring BL and the wiring SL are brought out of conduction.

From time T2 to T3, the potential of the wiring WLC[2] is stepped down to a low-level potential. Here, the potential of the node FN[2] is decreased by a capacitive coupling of the capacitor C[2]. Therefore, the potential of the node FN[2] is returned to the potential held in the node FN[2] from time T0 to T1.

[Time T3 to T4]

From time T3 to T4, a potential of the wiring WLOS[2] is stepped up to a high-level potential. Thus, the high-level potential is input to the gate of the transistor WOS[2], whereby the transistor WOS[2] is turned on.

From time T3 to T4, a potential of the wiring WLC[1] is stepped up to a high-level potential. Here, the potential of the node FN[1] is increased by a capacitive coupling of the capacitor C[1]. The increase amount of the potential of the node FN[1] is obtained by multiplication of a capacitive coupling coefficient determined by the structure of the memory cell MC[1] by the step-up amount of the potential of the wiring WLC[1]. In this specification, the increase amount of the potential of the node FN[1] is equal to the step-up amount of the potential of the wiring WLC[1]. This means that the capacitive coupling coefficient of the memory cell MC[1] is 1.

At time T3, a high-level potential is input from the wiring BL. Here, the high-level potential is preferably higher than or equal to $V_{11}$ (a potential of $V_{11}$ is precharged in the wiring BL in the timing chart in FIG. 10). Since the transistor WOS[2] is in on-state, the potential of the node FN[2] is stepped up to its a high-level potential.

At time T3, a potential of $V_{11}$ is input from the wiring SL as a potential to be written to the node FN[2].

When a sufficient time has elapsed after the high-level potential is input from the wiring BL to the node FN[2] at time T3, the supply of a potential from the wiring BL is stopped to bring the wiring BL into a floating state. Here, a high-level potential is input from the wiring SG, so that the transistor SW is turned on.

Here, the gates of the transistors ROS[1] and ROS[2] have high-level potentials and the threshold voltages of the transistors are shifted in the negative direction, so that the transistor ROS[1] and the transistor ROS[2] are turned on. Thus, charge accumulated in the wiring BL flows to the wiring SL through the transistors SW, ROS[1], and ROS[2], whereby a potential of the wiring BL becomes substantially equal to the potential of the wiring SL. That is, the potential of the wiring BL is $V_{11}$ and the potential of the node FN[2] is $V_{11}$.

<<Reading Operation>>

Figure 11:
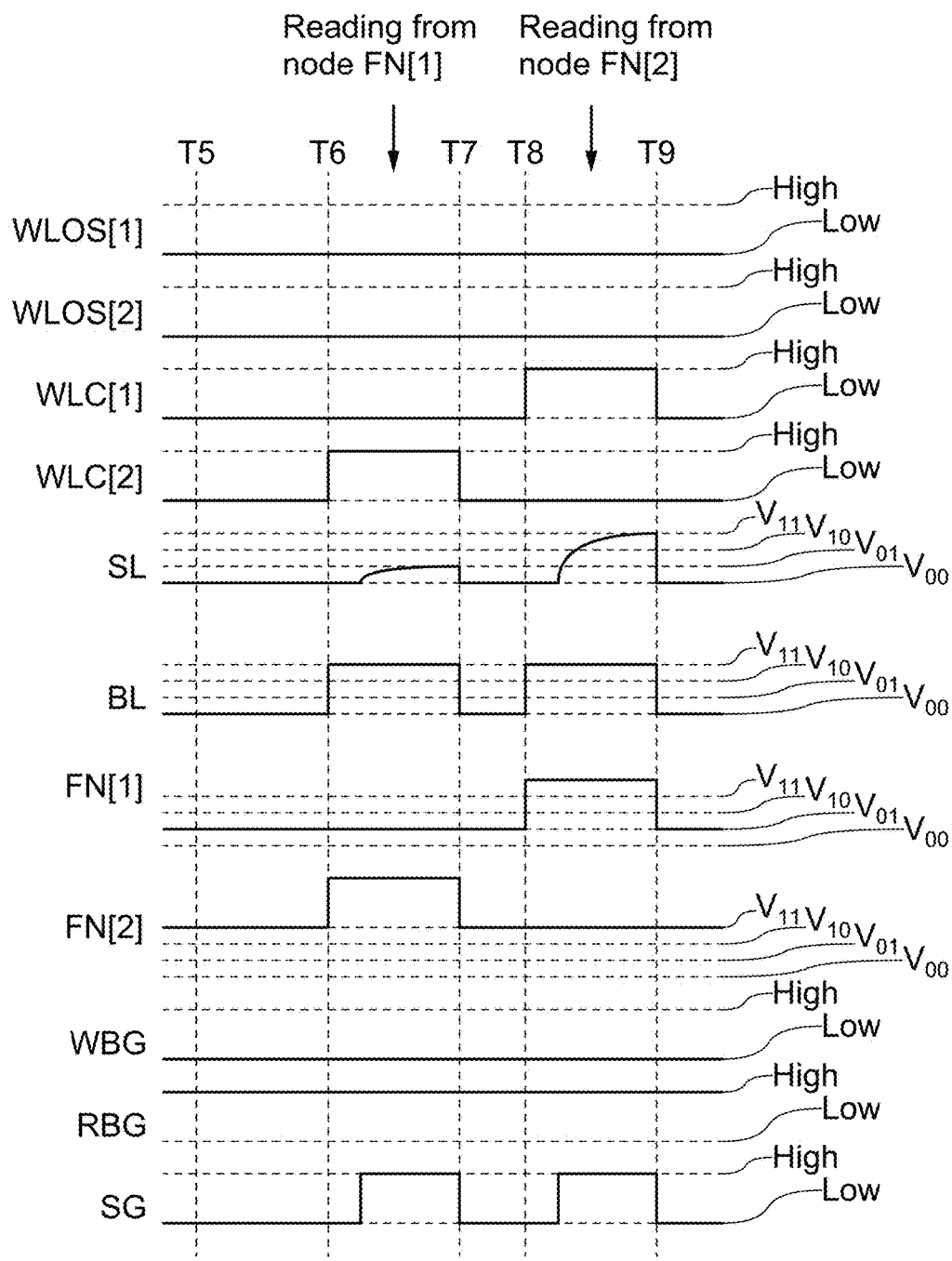
FIG. 11 is a timing chart showing an operation example of a string included in a semiconductor device.

FIG. 11 is a timing chart showing an operation of reading data from the nodes FN[1] and FN[2] in the string 101.

For the description of the timing chart in FIG. 11, the description of the timing chart FIG. 10 can be referred to.

The timing chart in FIG. 11 shows an operation of reading the potentials written to the nodes FN[1] and FN[2] in a period from time T0 to T4 in the timing chart in FIG. 10 as an example. Specifically, the operation of reading $V_{01}$ from the node FN[1] is performed in a period from time T6 to T7, and the operation of reading $V_{11}$ from the node FN[2] is performed in a period from time T8 to T9.

[Time T5 to T6]

From time T5 to T6, a low-level potential from the wiring WLOS[1] and a low-level potential from the wiring WLC[1] are input to the memory cell MC[1]. In addition, a low-level potential from the wiring WLOS[2] and a low-level potential from the wiring WLC[2] are input to the memory cell MC[1]. Furthermore, a low-level potential from the wiring WBG is input to the memory cells MC[1] and MC[2].

Therefore, both the transistors WOS[1] and WOS[2] are turned off. Since the second terminals of the capacitors C[1] and C[2] have the low-level potentials, the potential change (boosting effect) is not caused at both the nodes FN[1] and FN[2]. Furthermore, since the low-level potential is input to each of the back gates of the transistors WOS[1] and WOS[2], changes in threshold voltages of the transistors WOS[1] and WOS[2] are not caused.

The potential $V_{00}$ from the wiring SL, the potential $V_{00}$ from the wiring BL, and a high-level potential from the wiring RBG are input to the memory cells MC[1] and MC[2]. Then, a low-level potential from the wiring SG is input to the transistor SW.

Thus, since a high-level potential is input to the back gate of the transistor ROS[1], the back gate of the transistor ROS[2], and the back gate of the transistor SW, the threshold voltages of the transistor ROS[1], the transistor ROS[2], and the transistor SW are shifted in the negative direction.

[Time T6 to T7]

From time T6 to T7, a potential of the wiring WLC[2] is stepped up to a high-level potential. Here, the potential of the node FN[2] is increased by a capacitive coupling of the capacitor C[2]. The amount of increase in potential of the node FN[2] is equal to the step-up amount of the potential of the wiring WLC[2] because the capacitive coupling coefficient of the memory cell MC[2] is 1 as described in the description of the operation from time T1 to T2.

At time T6, a high-level potential is input from the wiring BL. Here, the high-level potential is preferably higher than or equal to $V_{11}$ (The wiring BL is precharged to the potential $V_{11}$ in the timing chart of FIG. 11).

When a sufficient time has elapsed after the wiring BL has a high-level potential at time T6, a high-level potential is input from the wiring SG to turn on the transistor SW.

Here, the gate of the transistor ROS[2] has a high-level potential and the threshold voltage thereof is shifted in the negative direction, and thus the transistor ROS[2] is turned on.

Here, the gate of the transistor ROS[1] has a potential of $V_{01}$ and the threshold voltage of the transistor is shifted in the negative direction, and thus the transistor ROS[1] is not in a complete on-state. Therefore, a potential difference is generated between a source and a drain of the transistor ROS[1]. The potential difference between the source and the drain of the transistor ROS[1] depends on the potential of the gate of the transistor ROS[1]. Therefore, the potential difference between the source and the drain of the transistor ROS[1] is determined by the potential of the node FN[1]. That is, although the wirings BL and SL are electrically connected, a potential difference is generated between the source and the drain of the transistor ROS[1], so that the potential of the wiring SL is different from that of the wiring BL. Here, the potential of the wiring SL depends on the potential of the gate of the transistor ROS[1], and the potential of $V_{01}$ is output from the wiring SL.

Thus, the potential held in the node FN[1] can be read from the wiring SL.

[Time T7 to T8]

From time T7 to T8, a potential of the wiring SG is stepped down to a low-level potential. Thus, the low-level potential is input to the gate of the transistor SW, whereby the transistor SW is turned off. Therefore, the wiring BL and the wiring SL are brought out of conduction.

From time T7 to T8, the potential of the wiring WLC[2] is stepped down to a low-level potential. Here, the potential of the node FN[2] is decreased by a capacitive coupling of the capacitor C[2]. Therefore, the potential of the node FN[2] is returned to the potential held in the node FN[2] from time T5 to T6.

[Time T8 to T9]

From time T8 to T9, a potential of the wiring WLC[1] is stepped up to a high-level potential. Here, the potential of the node FN[1] is increased by a capacitive coupling of the capacitor C[1]. The amount of increase in potential of the node FN[1] is equal to the step-up amount of the potential of the wiring WLC[1] because the capacitive coupling coefficient of the memory cell MC[1] is 1 as described in the description of the operation from time T3 to T4.

At time T8 a high-level potential is input from the wiring BL. Here, the high-level potential is preferably higher than or equal to $V_{11}$ (The wiring BL is precharged to the potential $V_{11}$ in the timing chart of FIG. 11).

When a sufficient time has elapsed after the wiring BL has a high-level potential at time T8, a high-level potential is input from the wiring SG to turn on the transistor SW.

Here, the gate of the transistor ROS[1] has a high-level potential and the threshold voltage of the transistor is shifted in the negative direction, and thus the transistor ROS[1] is turned on.

Here, the gate of the transistor ROS[2] has a potential of $V_{11}$ and the threshold voltage of the transistor is shifted in the negative direction, and thus the transistor ROS[2] is in a complete on-state. Therefore, a potential difference is not generated between a source and a drain of the transistor ROS[2], and the potential of the wiring SL becomes substantially equal to the potential of the wiring BL. That is, the wirings BL and SL are electrically connected and a potential of $V_{11}$ is output to the wiring SL.

Thus, the potential held in the node FN[2] can be read from the wiring SL.

Although the string 101 including a memory cell which can store data of four values (2 bits) is described in the above operation example, one embodiment of the present invention is not limited thereto. One embodiment of the present invention may be a semiconductor device formed using the string 101 including a memory cell which can store information of five values or more such as 8 values (3 bits) or 16 values (4 bits). The semiconductor device can perform writing and reading operations in a manner similar to the above operation example.

When the above structure example and the above operation example are applied to the structure of the semiconductor device and the method for operating the semiconductor device, respectively, a memory device having a high capacity for holding data, a memory device capable of maintaining stored data without any change, or a memory device which shortens the time required for writing or reading operation can be obtained. Note that the plurality of effects described above can be achieved at the same time in some cases.

Note that an example described as one embodiment of the present invention in this embodiment can be combined with any of the other examples as appropriate.

In this embodiment, one embodiment of the present invention has been described. Other embodiments of the present invention are described in the other embodiments. Note that one embodiment of the present invention is not limited thereto. In other words, various embodiments of the invention are described in this embodiment and the other embodiments, and one embodiment of the present invention is not limited to a particular embodiment. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

Note that this embodiment can be combined with any of the other embodiments in this specification as appropriate.

Embodiment 2

In this embodiment, an example of a structure of a semiconductor device including the string 105 described in Embodiment 1 is described.

Structure Example 1

Figure 12:
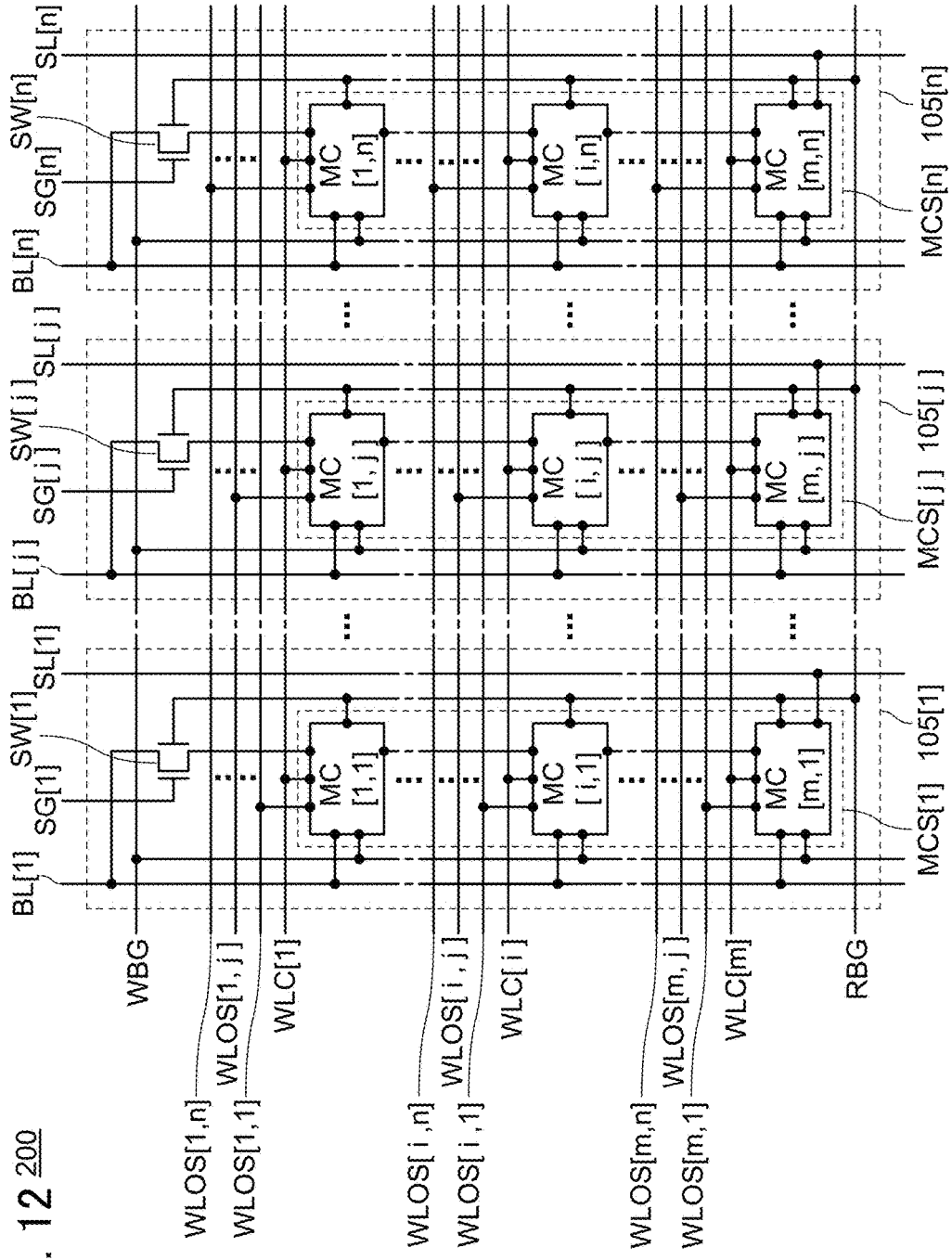
FIG. 12 is a block diagram illustrating a semiconductor device.

FIG. 12 shows a semiconductor device 200 which includes a memory cell array including n strings 105 (n is an integer greater than or equal to 1). The semiconductor device 200 includes the strings 105[1] to 105[n]. Note that the string 105[j] refers to a string provided in the j-th row (j is an integer greater than or equal to 1 and less than or equal to n). The string 105[j] includes memory cells MC[1, j] to MC[m, j]. That is, the semiconductor device 200 includes m memory cells in a column and n memory cells in a row, i.e., m×n memory cells, and memory cells MC[1, 1] to [m, n] are included in the memory cell array of the semiconductor device 200. Note that a memory cell located in the i-th column and the j-th row is referred to as a memory cell MC[i, j] (i is an integer greater than or equal to 1 and less than or equal to m).

The strings 105[1] to 105[n] include the transistors SW[1] to SW[n], respectively. The transistors SW[1] to SW[n] are transistors for selecting one of the strings 105[1] to 105[n].

The string 105[j] is electrically connected to a wiring BL[j], a wiring SG[j], a wiring SL[j], wirings WLOS[1, j] to WLOS[m, j], the wirings WLC[1] to WLC[m], the wiring WBG, and the wiring RBG.

The memory cell MC[i, j] is electrically connected to the wirings BL[i], WBG, RBG, WLOS[i, j], and WLC[i]. The description of the memory cell MC[i] included in the string 105 in Embodiment 1 can be referred to for circuit elements included in the memory cell MC[i, j] and the connection structure of the circuit elements.

Next, a method for selecting a memory cell to be read from or written to in the semiconductor device 200 is described. When data is written to or read from the memory cell MC[i, j], a high-level potential is input to the wiring SG[j] to turn on the transistor SW[j]. In addition, a signal is input to the wiring WLOS[i, j], so that a writing transistor (the transistor WOS[i] included in the string 105 in the above Embodiment 1) included in the memory cell MC[i, j] is turned on. That is, with these operations, the memory cell MC[i, j] in the string 105[j] can be selected.

As described above, the memory cell MC[i, j] is selected to perform operation for writing data to the memory cell MC[i, j] and operation for reading data from the memory cell MC[i, j]. The description of the operation example in Embodiment 1 is referred to for specific writing and reading operations.

In FIG. 12, only the following elements are shown, and the other circuits, wirings, signals, reference numerals, and the like are not shown: the semiconductor device 200, the string 105[1], the string 105[j], the string 105[n], the circuit portion MCS[1], the circuit portion MCS[j], the circuit portion MCS[n], the wiring WLOS[1, 1], the wiring WLOS[1, j], the wiring WLOS[1, n], the wiring WLOS[i, 1], the wiring WLOS[i, j], the wiring WLOS[i, n], the wiring WLOS[m, 1], wiring WLOS[m, j], the wiring WLOS[m, n], the wiring WLC[1], the wiring WLC[i], the wiring WLC[m], the wiring BL[1], the wiring BL[j], the wiring BL[n], the wiring SL[1], the wiring SL[j], the wiring SL[n], the wiring SG[1], the wiring SG[j], a wiring SG[n], the wiring WBG, the wiring RBG, the transistor SW[1], the transistor SW[j], the transistor SW[n], the memory cell MC[1, 1], a memory cell MC[i, 1], a memory cell MC[m, 1], the memory cell MC[1, j], the memory cell MC[i, j], the memory cell MC[m, j], the memory cell MC[1, n], the memory cell MC[i, n], and the memory cell MC[m, n].

Structure Example 2

Figure 13:
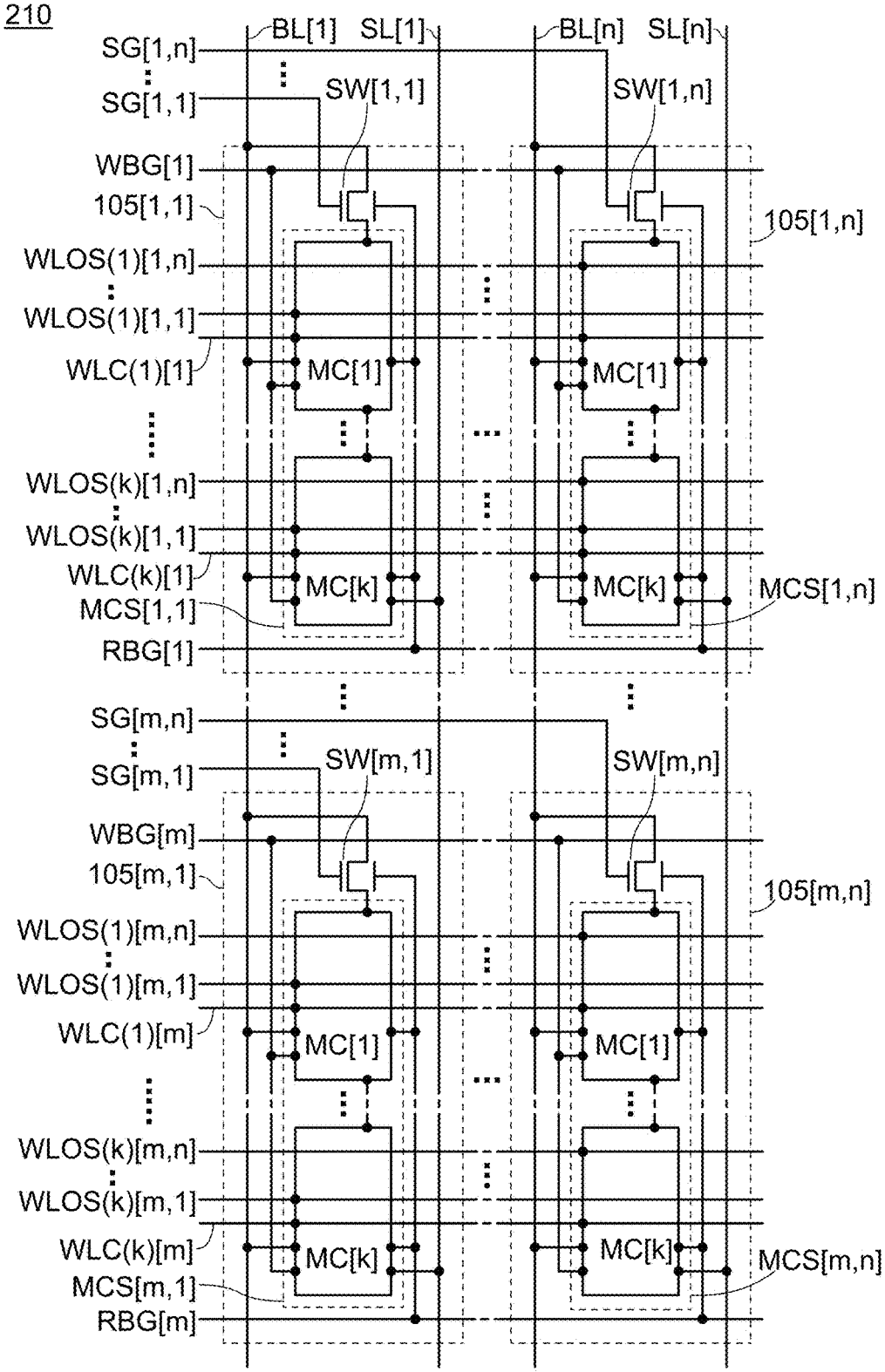
FIG. 13 is a block diagram illustrating a semiconductor device.

FIG. 13 shows a semiconductor device 210 including a memory cell array including m strings 105 in a column and n strings 105 in a row, i.e., m×n strings 105 in a matrix. The semiconductor device 210 includes the strings 105[1, 1] to 105[*m, n*]. Note that the string 105[*i, j*] (not illustrated in FIG. 13) refers to a string provided in the i-th row and the j-th column. The string 105[*i, j*] includes memory cells MC[1] to MC[k]. That is, the semiconductor device 210 includes m×k memory cells in a column and n memory cells in a row, i.e., m×k×n memory cells, and these memory cells are included in the memory cell array of the semiconductor device 210.

The strings 105[1, 1] to [m, n] include the transistors SW[1, 1] to SW[m, n], respectively. Each of the transistors SW[1, 1] to SW[m, n] is a transistor for selecting one of the strings 105[1, 1] to 105[*m, n*].

The string 105[*i, j*] is electrically connected to the wiring BL[j], a wiring SG[i, j], the wiring SL[j], wirings WLOS(1)[*i, j*] to WLOS(k)[i, j], wirings WLC(1)[*i*] to WLC(k)[i], a wiring WBG[i], and a wiring RBG[i] (k is an integer greater than or equal to 1).

A memory cell MC[h] included in the string 105[*i, j*] is electrically connected to the wiring BL[j], the wiring WBG[i], the wiring RBG[i], a wiring WLOS(h)[i, j], and a wiring WLC(h)[i] (h is an integer greater than or equal to 1 and less than or equal to k). The description of the memory cell MC[i] included in the string 105 in Embodiment 1 can be referred to for circuit elements included in the memory cell MC[i, j] and the connection structure of the circuit elements.

The wiring WLC(h)[i] is electrically connected to the memory cell MC[h] included in each of the strings 105[*i*, 1] to 105[*i, n*]. That is, in the case where a potential (signal) is input (transmitted) from the wiring WLC(h)[i] to the memory cell to be selected, a potential (signal) is input (transmitted) to the memory cell MC[h] included in each of the strings 105[*i*, 1] to 105[*i, n*] through one wiring WLC(h)[i].

Next, a method for selecting a memory cell to be read from or written to in the semiconductor device 210 is described. When data is written to or read from the memory cell MC[h] included in the string 105[*i, j*], a high-level potential is input to the wiring SG[i, j] to turn on the transistor SW[j]. In addition, a signal is input to the wiring WLOS(h)[i, j], so that a writing transistor (the transistor WOS[i] included in the string 105 in the above Embodiment 1) included in the memory cell MC[h] in the string 105[*i, j*] is turned on. That is, with these operations, the memory cell MC[i, j] in the string 105[*j*] can be selected.

As described above, the semiconductor device 210 selects the memory cell MC[i, j] to perform operation for writing data to the memory cell MC[i, j] and operation for reading data from the memory cell MC[i, j]. The description of the operation example in Embodiment 1 is referred to for specific writing and reading operations.

In FIG. 13, only the following elements are shown, and the other circuits, wirings, signals, reference numerals, and the like are not shown: the semiconductor device 210, the string 105[1, 1], the string 105[*m*, 1], the string 105[1, *n*], the string 105[*m, n*], the circuit portion MCS[1, 1], the circuit portion MCS[m, 1], the circuit portion MCS[1, *n*], the circuit portion MCS[m, n], a wiring WLOS(1)[1, 1], a wiring WLOS(1)[1,*n*], a wiring WLOS(k)[1,1], a wiring WLOS(k)[1, *n*], a wiring WLOS(1)[*m*, 1], a wiring WLOS(k)[m, 1], a wiring WLOS(1)[*m, n*], a wiring WLOS(k)[m, n], a wiring WLC(1)[1], a wiring WLC(k)[1], a wiring WLC(1)[*m*], a wiring WLC(k)[m], the wiring BL[1], the wiring BL[n], the wiring SL[1], the wiring SL[n], the wiring SG[1, 1], the wiring SG[1, n], the wiring SG[m, 1], the wiring SG[m, n], the wiring WBG[1], the wiring WBG[m], the wiring RBG[1], the wiring RBG[m], the transistor SW[1, 1], the transistor SW[m, 1], the transistor SW[1,*n*], the transistor SW[m, n], the memory cell MC[1], and the memory cell MC[k]. In the strings 105[1, 1], 105[*m*,1], 105[1, *n*], and 105[*m, n*], the same reference numerals are used for the memory cells MC[1] and MC[k].

Structure Example 3

Figure 14:
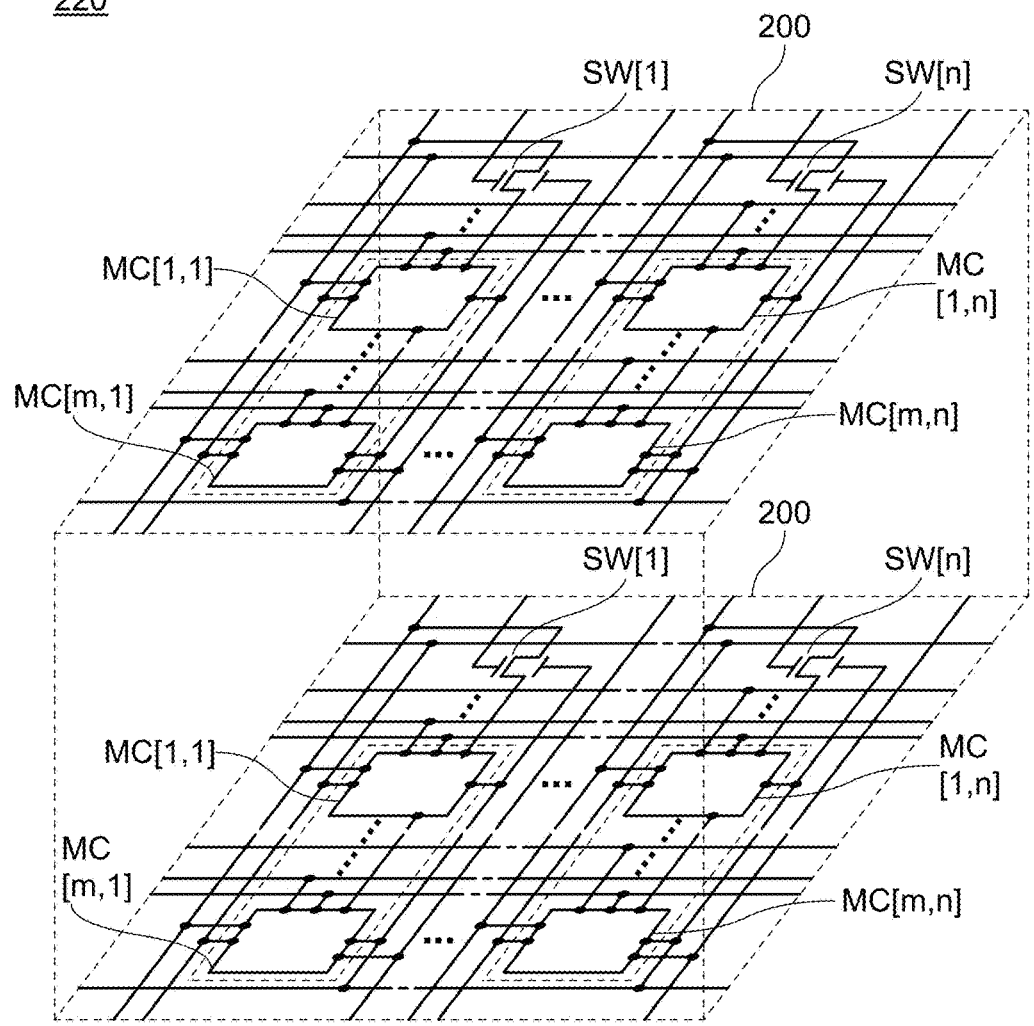
FIG. 14 is a block diagram illustrating a semiconductor device.

FIG. 14 shows a semiconductor device with a structure different from those of the semiconductor devices described in the structure examples 1 and 2.

A semiconductor device 220 includes the plurality of semiconductor devices 200 described in the structure example 1 and a region where the plurality of semiconductor devices 200 overlap with each other. In FIG. 14, the memory cell MC[1, 1], the memory cell MC[m, 1], the memory cell MC[1, *n*], and the memory cell MC[m, n] are only shown and the other memory cells are not shown.

The transistors SW[1] to SW[n] included in the semiconductor device 200 in each layer are preferably formed using the same material as the transistors (the transistors WOS[1] to WOS[m] and transistors ROS[1] to ROS[n]) in the memory cells. Thus, the transistors SW[1] to SW[n] and the transistors in the memory cells can be provided in the same layer.

Although the transistors SW[1] to SW[n] included in the semiconductor device 200 in each layer and the transistors in the memory cells are provided in the same layer in FIG. 14, one embodiment of the present invention is not limited thereto. For example, as shown in a semiconductor device 221 in FIG. 15, a structure where the transistors SW[1] to SW[n] are not provided in the same layer as the transistors in the memory cells but provided in a circuit layer 20 which is another layer may be used. Although the circuit layer 20 is provided under the semiconductor device 200 in FIG. 15, the circuit layer 20 may be provided over the semiconductor device 200. Note that wirings electrically connecting the semiconductor device 200 and the circuit layer 20 are collectively illustrated by a thick dashed-dotted line for simplicity, which does not mean that the wirings are electrically and collectively connected. For example, as shown in a semiconductor device 222 in FIG. 16, a structure where the transistors SW[1] to SW[n] are not provided in the same layer as the transistors in the memory cells and provided in an external circuit 10 outside the semiconductor device 220 may be employed.

Figure 15:
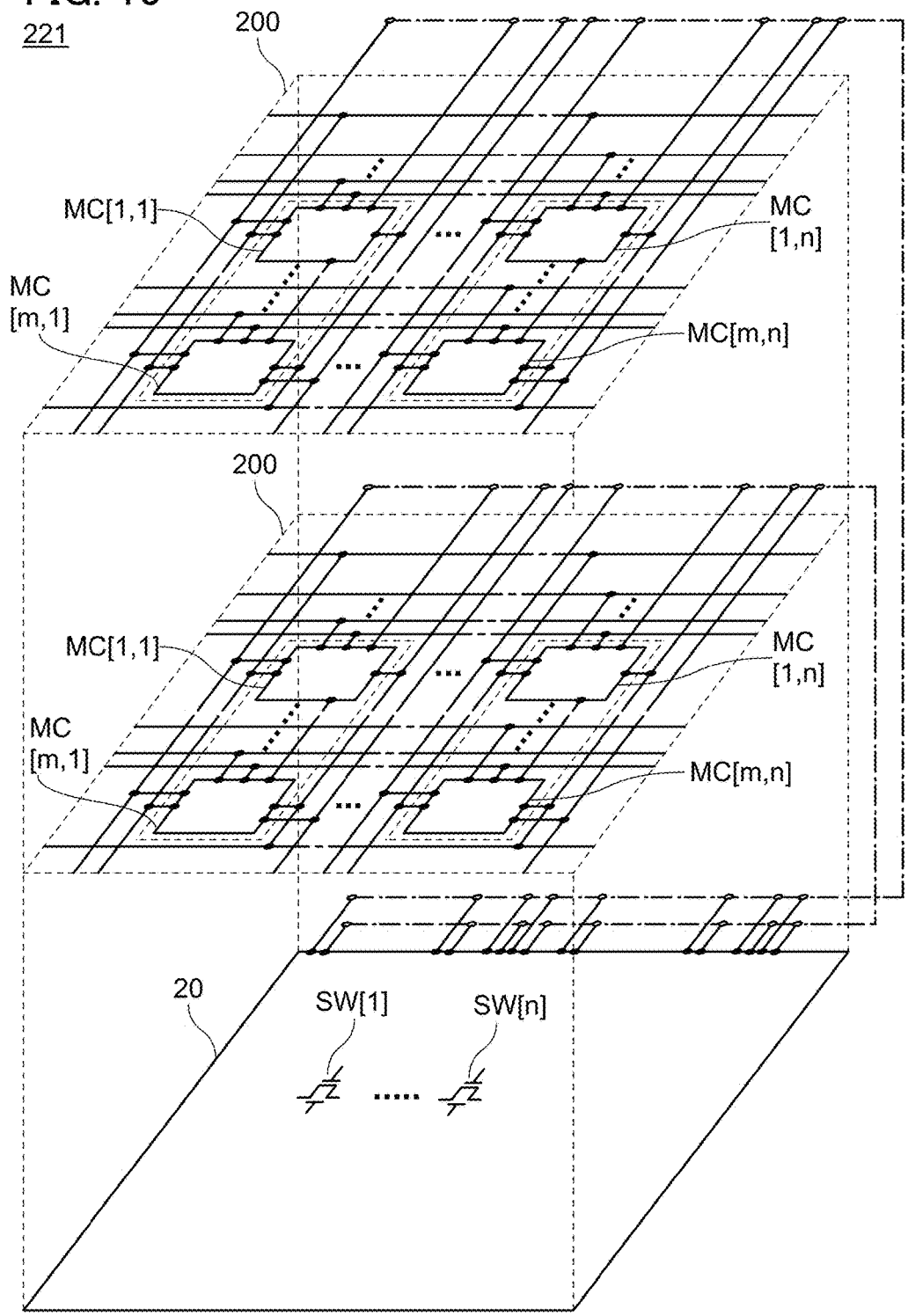
FIG. 15 is a block diagram illustrating a semiconductor device.
Figure 16:
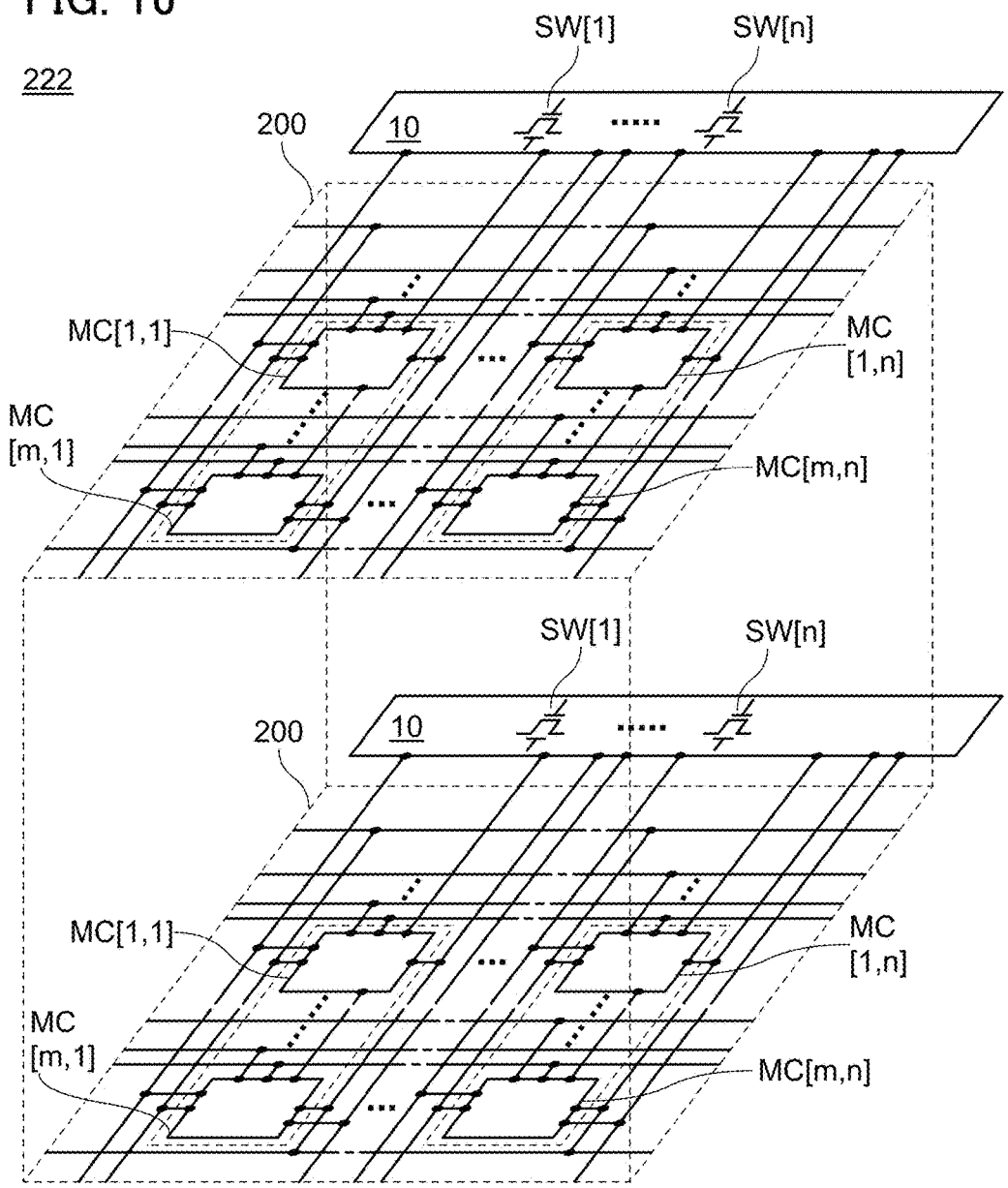
FIG. 16 is a block diagram illustrating a semiconductor device.

In particular, the structures illustrated in FIGS. 15 and 16 are preferably used when the transistors SW[1] to SW[n] are formed using a material different from that used for the transistors in the memory cells. For example, in the case where channel formation regions of the transistors SW[1] to SW[n] include silicon and channel formation regions of the transistors in the memory cells include an oxide semiconductor, the above structures are preferably used.

In this manner, the area per bit can be reduced when memory cell arrays are stacked. That is, storage capacity of a memory device including stacked memory cell arrays can be increased. Furthermore, in the case where memory cell arrays are stacked in six layers with use of OS transistors with 10-nm node, for example, storage capacity of the memory device can be increased to the vicinity of 1 TByte.

In addition, the storage capacity of the memory device can be increased to the vicinity of 1 TByte by increasing the number of memory cells or the number of bits held in one memory cell instead of stacking memory cell arrays, for example.

Note that this embodiment can be combined with any of the other embodiments in this specification as appropriate.

Embodiment 3

A structure example of a memory device in one embodiment of the present invention is described with reference to FIG. 17.

Figure 17:
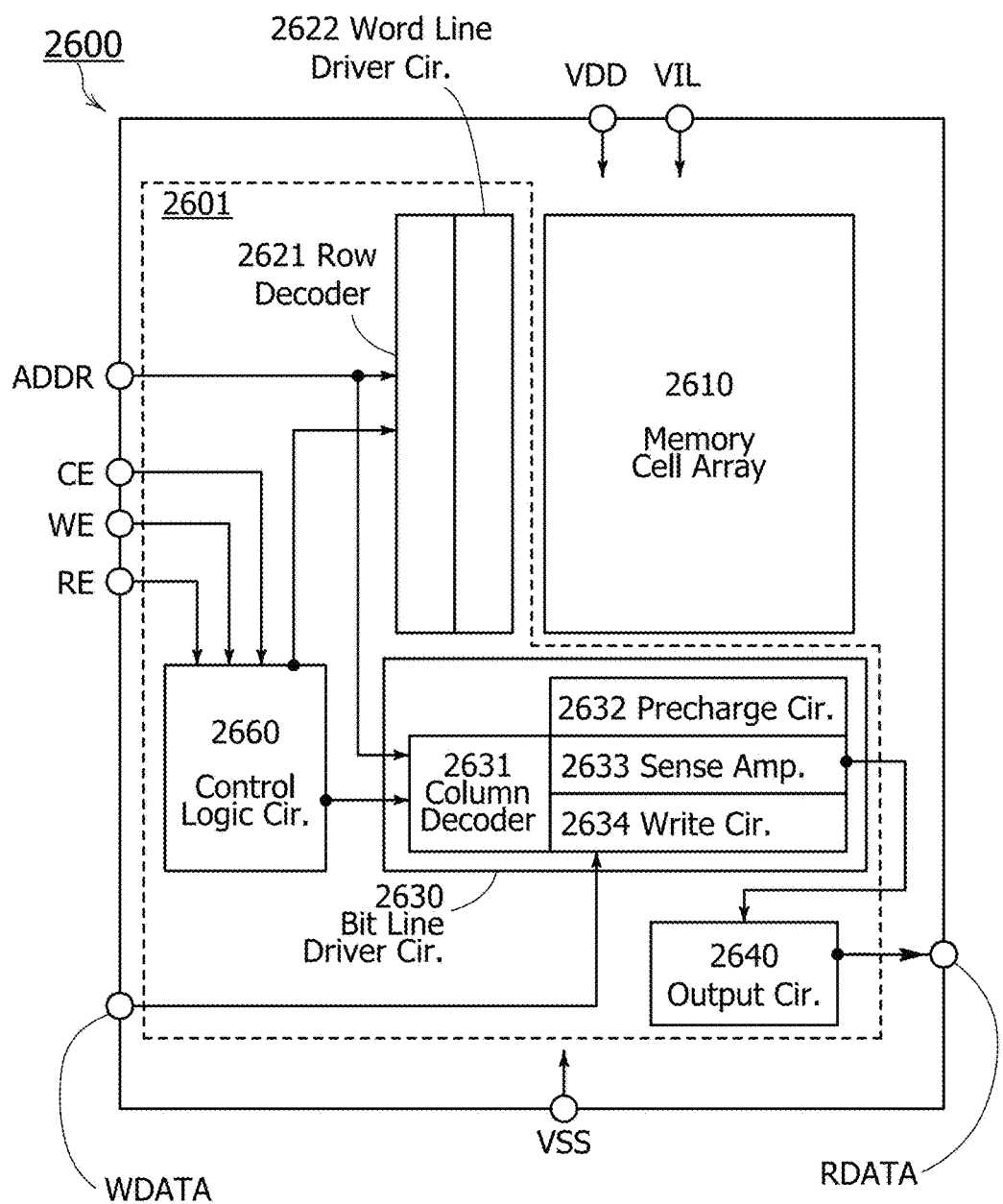
FIG. 17 is a block diagram showing an example of a memory device.

FIG. 17 illustrates a structure example of a memory device. A memory device 2600 includes a peripheral circuit 2601 and a memory cell array 2610. The peripheral circuit 2601 includes a row decoder 2621, a word line driver circuit 2622, a bit line driver circuit 2630, an output circuit 2640, and a control logic circuit 2660. Note that the memory cell array 2610 includes the string 101 described in Embodiment 1.

The bit line driver circuit 2630 includes a column decoder 2631, a precharge circuit 2632, a sense amplifier 2633, and a write circuit 2634. The precharge circuit 2632 has a function of precharging the wiring SL or BL (not illustrated in FIG. 17) connected to the string 101 described in Embodiment 1. The sense amplifier 2633 has a function of amplifying a data signal read from the wiring SL or BL. The amplified data signal is output as a digital data signal RDATA from the memory device 2600 through the output circuit 2640.

As power supply voltages, low power supply voltage (VSS), high power supply voltage (VDD) for the peripheral circuit 2601, and high power supply voltage (VIL) for the memory cell array 2610 are supplied to the memory device 2600 from the outside.

Control signals (CE, WE, and RE), an address signal ADDR, and a data signal WDATA are input to the memory device 2600 from the outside. The address signal ADDR is input to the row decoder 2621 and the column decoder 2631, and the data signal WDATA is input to the write circuit 2634.

The control logic circuit 2660 processes the signals (CE, WE, and RE) input from the outside, and generates control signals for the row decoder 2621 and the column decoder 2631. CE, WE, and RE are a chip enable signal, a write enable signal, and a read enable signal, respectively. Signals processed by the control logic circuit 2660 are not limited to those listed above, and other control signals may be input as necessary.

Note that the decision whether the circuits and signals described above are used or not can be made as appropriate as needed.

When a p-channel Si transistor and a transistor including a channel formation region using an oxide semiconductor (preferably an oxide containing In, Ga, and Zn) described in a later embodiment are used in the memory device 2600, the memory device 2600 can be reduced in size. In addition, the memory device 2600 can be reduced in power consumption. Furthermore, the memory device 2600 can be increased in operation speed, in particular, by using only a p-channel transistor as the Si-transistor, manufacturing cost can be reduced.

Note that the structure example of this embodiment is not limited to that illustrated in FIG. 17. For example, in the case where the semiconductor device 221 described in Embodiment 2 is used, the configuration may be changed as appropriate so that, for example, the sense amplifier 2633 or the precharge circuit 2632 is provided in the circuit layer 20.

Note that this embodiment can be combined with any of the other embodiments in this specification as appropriate.

Embodiment 4

In this embodiment, application examples of the memory device including the semiconductor device described in any of the above embodiments to an electronic component and to an electronic device including the electronic component will be described with reference to FIGS. 18A and 18B, and FIGS. 19A to 19H.

<Electronic Component>

Figure 18A:
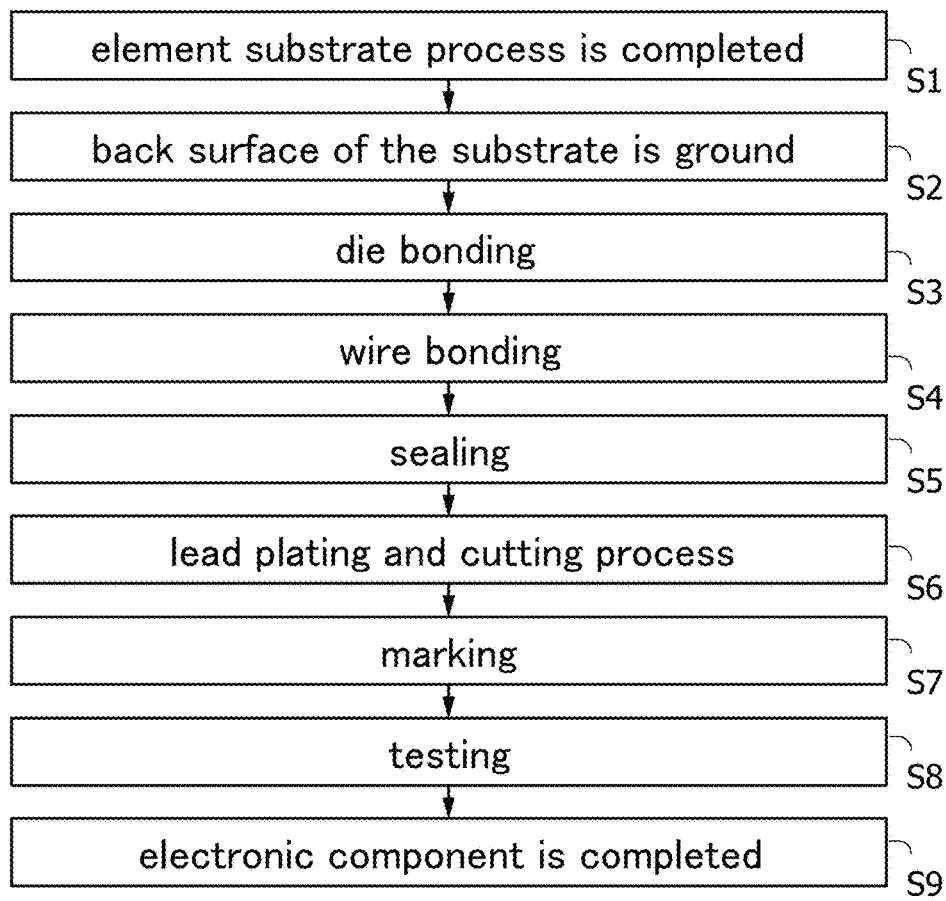
FIG. 18A is a flow chart showing an example of a method for manufacturing an electronic component.

FIG. 18A shows an example where the memory device including the semiconductor device described in any of the above embodiments is used as an electronic component. Note that the electronic component is also referred to as a semiconductor package or an integrated circuit (IC) package. This electronic component has various standards and names depending on the direction and the shape of terminals. Therefore, an example of the electronic component will be described in this embodiment.

A semiconductor device including transistors shown in Embodiment 1 is completed through an assembly process (post-process) of integrating detachable components on a printed board.

The post-process can be completed through the steps in FIG. 18A. Specifically, after an element substrate obtained in the preceding process is completed (Step S1), a back surface of the substrate is ground (Step S2). The substrate is thinned in this step to reduce substrate warpage or the like caused in the preceding process and to reduce the size of the component.

After the back surface of the substrate is ground, a dicing step is performed to divide the substrate into a plurality of chips. Then, the divided chips are separately picked up, placed on a lead frame, and bonded thereto in a die bonding step (Step S3). In the die bonding step, the chip is bonded to the lead frame by an appropriate method depending on products, for example, bonding with a resin or a tape. Note that in the die bonding step, a chip may be placed on and bonded to an interposer.

Note that in this embodiment, when an element is formed on a surface of a substrate, the other surface is referred to as a back surface (a surface on which the element is not formed).

Next, wire bonding for electrically connecting a lead of the lead frame and an electrode on the chip through a metal wire is performed (Step S4). As the metal wire, a silver wire or a gold wire can be used. Ball bonding or wedge bonding can be used as the wire bonding.

The wire-bonded chip is subjected to a molding step of sealing the chip with an epoxy resin or the like (Step S5). Through the molding step, the inside of the electronic component is filled with a resin, whereby damage to a mounted circuit portion and wire caused by external mechanical force as well as deterioration of characteristics due to moisture or dust can be reduced.

Subsequently, the lead of the lead frame is plated. Then, the lead is cut and processed (Step S6). This plating process prevents rust of the lead and facilitates soldering at the time of mounting the chip on a printed board in a later step.

Next, printing (marking) is performed on a surface of the package (Step S7). After a final testing step (Step S8), the electronic component is completed (Step S9).

The above-described electronic component can include the semiconductor device described in Embodiments 1 and 2 or the memory device described in Embodiment 3. Thus, a highly reliable electronic component can be obtained.

Figure 18B:
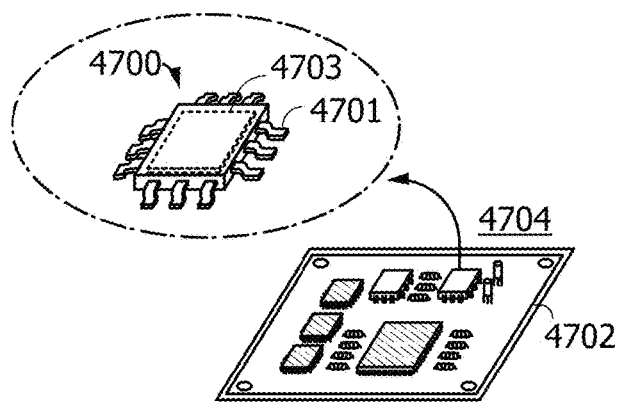
FIG. 18B is a schematic perspective view illustrating an example of the electronic component.

FIG. 18B is a perspective schematic diagram illustrating a quad flat package (QFP) as an example of the completed electronic component. An electronic component 4700 in FIG. 18B includes a lead 4701 and a circuit unit 4703. The electronic component 4700 in FIG. 18B is mounted on a printed board 4702, for example. A plurality of electronic components 4700 which are combined and electrically connected to each other over the printed board 4702 can be mounted on an electronic device. A completed circuit board 4704 is provided in an electronic device or the like.

<Electronic Device>

Described next are electronic devices including the aforementioned electronic component.

A semiconductor device of one embodiment of the present invention can be used for display devices, personal computers, or image reproducing devices provided with recording media (typically, devices that reproduce the content of recording media such as digital versatile discs (DVD) and have displays for displaying the reproduced images). Other examples of electronic devices that can include the semiconductor device of one embodiment of the present invention include cellular phones, game machines (including portable game machines), portable information terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (Arm), vending machines, and medical devices. FIGS. 19A to 19H illustrate specific examples of these electronic devices.

Figure 19A:
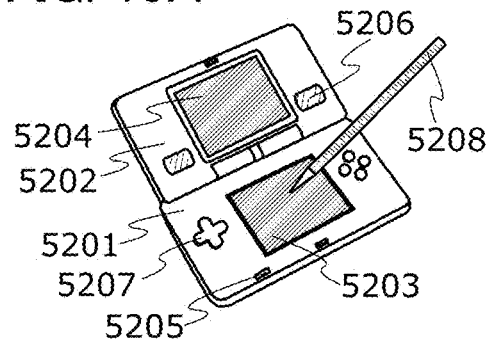
FIGS. 19A to 19H illustrate examples of electronic devices.

FIG. 19A illustrates a portable game machine, which includes a housing 5201, a housing 5202, a display portion 5203, a display portion 5204, a microphone 5205, a speaker 5206, an operation key 5207, a stylus 5208, and the like. The semiconductor device of one embodiment of the present invention can be used for a variety of integrated circuits included in portable game machines. Although the portable game machine in FIG. 19A has the two display portions 5203 and 5204, the number of display portions included in a portable game machine is not limited to this.

Figure 19B:
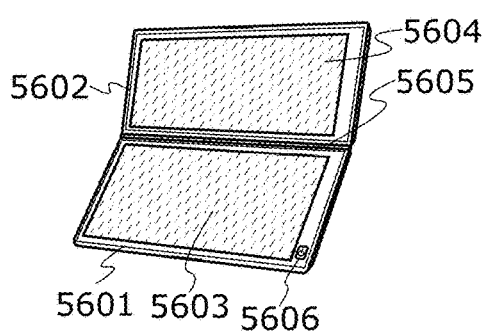

FIG. 19B illustrates a portable information terminal including a housing 5601, a housing 5602, a display portion 5603, a display portion 5604, a joint 5605, an operation key 5606, and the like. The semiconductor device of one embodiment of the present invention can be used for a variety of integrated circuits included in portable information terminals. The display portion 5603 is provided in the housing 5601, and the display portion 5604 is provided in the housing 5602. The housing 5601 and the housing 5602 are connected to each other with the joint 5605, and the angle between the housing 5601 and the housing 5602 can be changed with the joint 5605. Images displayed on the display portion 5603 may be switched in accordance with the angle at the joint 5605 between the housing 5601 and the housing 5602. A display device with a position input function may be used as at least one of the display portion 5603 and the display portion 5604. Note that the position input function can be added by providing a touch panel in a display device. Alternatively, the position input function can be added by provision of a photoelectric conversion element called a photosensor in a pixel portion of a display device.

Figure 19C:
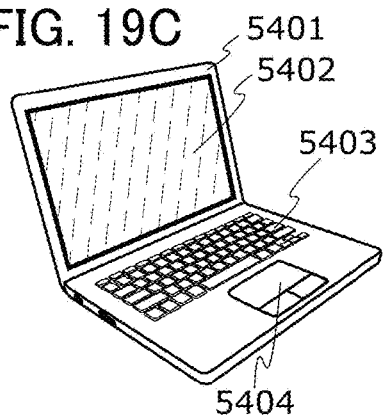

FIG. 19C illustrates a laptop including a housing 5401, a display portion 5402, a keyboard 5403, a pointing device 5404, and the like. The semiconductor device of one embodiment of the present invention can be used for a variety of integrated circuits included in notebook type personal computers.

Figure 19D:
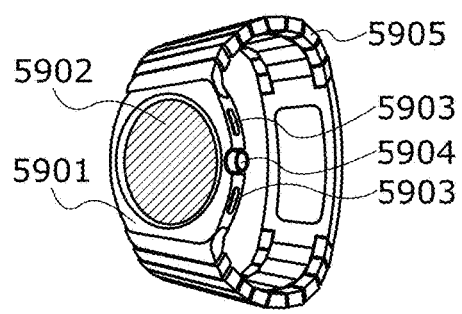

FIG. 19D is a smart watch which is one of wearable terminals. The smart watch includes a housing 5901, a display portion 5902, operation buttons 5903, an operator 5904, and a band 5905. The semiconductor device of one embodiment of the present invention can be used for a variety of integrated circuits included in the smart watch. A display device with a position input function may be used as a display portion 5902. Note that the position input function can be added by provision of a touch panel in a display device. Alternatively, the position input function can be added by providing a photoelectric conversion element called a photosensor in a pixel area of a display device. As operation buttons 5903, any one of a power switch for starting the smart watch, a button for operating an application of the smart watch, a volume control button, a switch for turning on or off the display portion 5902, and the like can be used. Although the smart watch in FIG. 19D includes two operation buttons 5903, the number of the operation buttons included in the smart watch is not limited to two. The operator 5904 functions as a crown performing time adjustment in the smart watch. The operator 5904 may be used as an input interface for operating an application of the smart watch as well as the crown for a time adjustment. Although the smart watch illustrated in FIG. 19D includes the operator 5904, one embodiment of the present invention is not limited thereto and the operator 5904 is not necessarily provided.

Figure 19E:
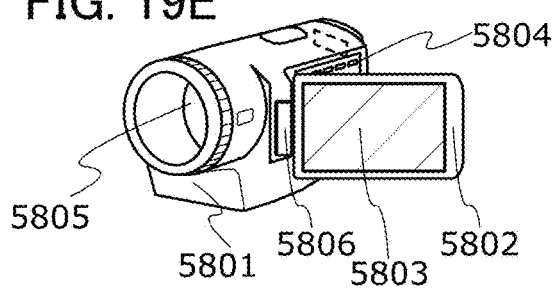

FIG. 19E illustrates a video camera including a housing 5801, a housing 5802, a display portion 5803, operation keys 5804, a lens 5805, a joint 5806, and the like. The semiconductor device of one embodiment of the present invention can be used for a variety of integrated circuits included in video cameras. The operation keys 5804 and the lens 5805 are provided in the housing 5801, and the display portion 5803 is provided in the housing 5802. The housing 5801 and the housing 5802 are connected to each other with the joint 5806, and the angle between the housing 5801 and the housing 5802 can be changed with the joint 5806. Images displayed on the display portion 5803 may be switched in accordance with the angle at the joint 5806 between the housing 5801 and the housing 5802.

Figure 19F:
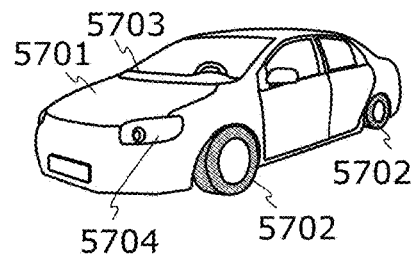

FIG. 19F illustrates a passenger car including a car body 5701, wheels 5702, a dashboard 5703, lights 5704, and the like. The semiconductor device of one embodiment of the present invention can be used for a variety of integrated circuits included in passenger cars.

Figure 19G:
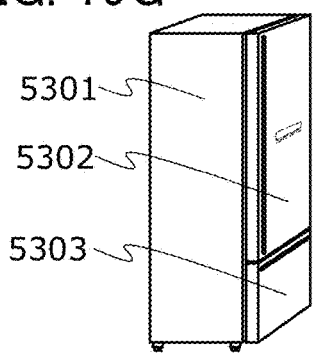

FIG. 19G illustrates an electric refrigerator-freezer including a housing 5301, a refrigerator door 5302, a freezer door 5303, and the like. The semiconductor device of one embodiment of the present invention can be used for a variety of integrated circuits included in the electric refrigerator-freezer.

Figure 19H:
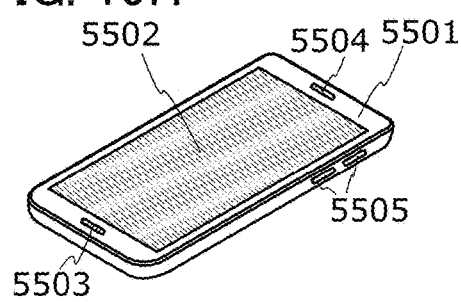
Figure 20A:
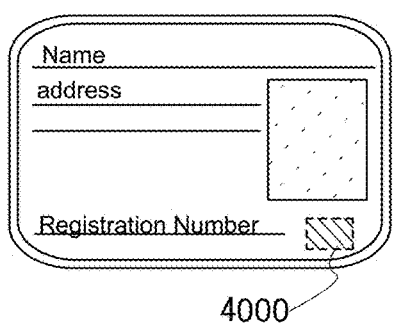
FIGS. 20A to 20F are perspective views illustrating application examples of an RF tag.
Figure 20B:
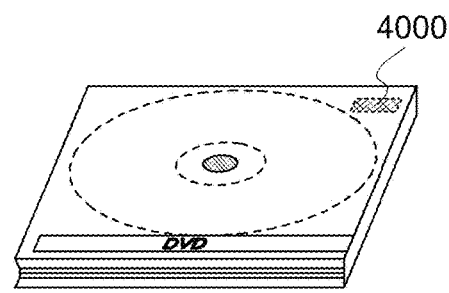
Figure 20C:
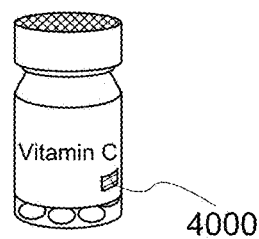
Figure 20D:
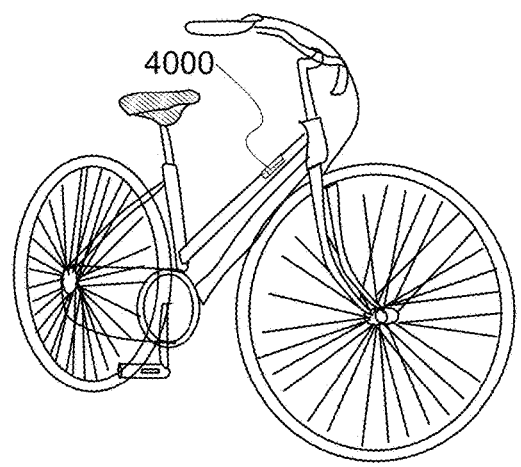
Figure 20E:
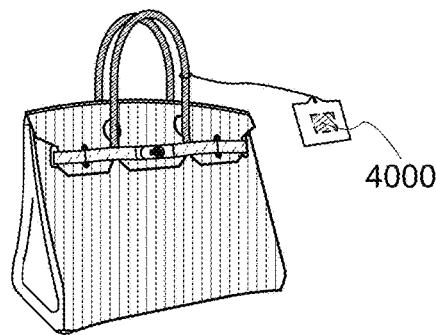
Figure 20F:
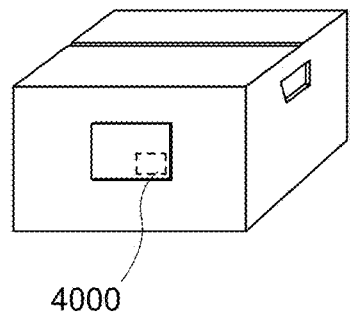

FIG. 19H is a mobile phone having a function of an information terminal. The mobile phone includes a housing 5501, a display portion 5502, a microphone 5503, a speaker 5504, and operation buttons 5505. A display device with a position input function may be used as the display portion 5502. Note that the position input function can be added by provision of a touch panel in a display device. Alternatively, the position input function can be added by providing a photoelectric conversion element called a photosensor in a pixel area of a display device. As operation buttons 5505, any one of a power switch for starting the mobile phone, a button for operating an application of the mobile phone, a volume control button, a switch for turning on or off the display portion 5502, and the like can be used. Although the mobile phone in FIG. 19H includes two operation buttons 5505, the number of the operation buttons included in the mobile phone is not limited to two. Although not illustrated, the mobile phone illustrated in FIG. 19H may be provided with a camera. Although not illustrated, the mobile phone illustrated in FIG. 19H may include a flashlight or a light-emitting device used for a lighting purpose. Although not illustrated, the mobile phone in FIG. 19H may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays) in the housing 5501. In particular, the direction of the mobile phone (the direction of the mobile phone with respect to the vertical direction) shown in FIG. 19H is determined by providing a sensing device which includes a sensor for sensing inclinations, such as a gyroscope or an acceleration sensor, and display on the screen of the display portion 5502 can be automatically changed in accordance with the direction of the mobile phone. In particular, in the case where a sensing device including a sensor obtaining biological information of fingerprints, veins, iris, voice prints, or the like is provided, a mobile phone having a function of biometric authentication can be obtained.

Next, an application example of a display device that can include the semiconductor device or memory device of one embodiment of the present invention is described. In one example, a display device includes a pixel. The pixel includes a transistor and a display element, for example. Alternatively, the display device includes a driver circuit for driving the pixel. The driver circuit includes a transistor, for example. As these transistors, any of the transistors described in the other embodiments can be used, for example.

For example, in this specification and the like, a display element, a display device which is a device including a display element, a light-emitting element, and a light-emitting device which is a device including a light-emitting element can employ a variety of modes or can include a variety of elements. The display element, the display device, the light-emitting element, or the light-emitting device includes at least one of an electroluminescent (EL) element (e.g., an EL element including organic and inorganic materials, an organic EL element, or an inorganic EL element), an LED chip (e.g., a white LED chip, a red LED chip, a green LED chip, or a blue LED chip), a transistor (a transistor that emits light in accordance with a current), a plasma display panel (PDP), an electron emitter, a display element including a carbon nanotube, a liquid crystal element, electronic ink, an electrowetting element, an electrophoretic element, a display element including micro electro mechanical systems (MEMS), (e.g., a grating light valve (GLV), a digital micromirror device (DMD), a digital micro shutter (DMS)), MIRASOL (registered trademark), an interferometric modulator display (IMOD) element, a MEMS shutter display element, an optical-interference-type MEMS display element, a piezoelectric ceramic display), and quantum dots. In addition to that, the display element, the display device, the light-emitting element, or the light-emitting device may include a display medium whose contrast, luminance, reflectivity, transmittance, or the like is changed by an electrical or magnetic effect. Note that examples of display devices having EL elements include an EL display. Examples of display devices including electron emitters are a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. Examples of display devices containing quantum dots in each pixel include a quantum dot display. Note that quantum dots may be provided not as display elements but as part of a backlight unit. The use of quantum dots enables display with high color purity. In the case of a transflective liquid crystal display or a reflective liquid crystal display, some of or all of pixel electrodes function as reflective electrodes. For example, some or all of pixel electrodes are formed to contain aluminum or silver. In such a case, a memory circuit such as an SRAM can be provided under the reflective electrodes. Thus, the power consumption can be further reduced. Note that in the case of using an LED chip, graphene or graphite may be provided under an electrode or a nitride semiconductor of the LED chip. Graphene or graphite may be a multilayer film in which a plurality of layers are stacked. As described above, the provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED chip can be formed. Note that an AlN layer may be provided between the n-type GaN semiconductor layer including crystals and graphene or graphite. The GaN semiconductor layers included in the LED chip may be formed by MOCVD. Note that when the graphene is provided, the GaN semiconductor layers included in the LED chip can also be formed by a sputtering method. In a display element including microelectromechanical systems (MEMS), a dry agent may be provided in a space where a display element is sealed (e.g., between an element substrate over which the display element is placed and a counter substrate opposed to the element substrate). Providing a dry agent can prevent MEMS and the like from becoming difficult to move or deteriorating easily because of moisture or the like.

Note that this embodiment can be combined with any of the other embodiments in this specification as appropriate.

Embodiment 5

In this embodiment, application examples of an RF tag that can include the memory device of one embodiment of the present invention will be described with reference to FIGS. 20A to 20F. The RF tag is widely used and can be provided for, for example, products such as bills, coins, securities, bearer bonds, documents (e.g., driver's licenses or resident's cards, see FIG. 20A), recording media (e.g., DVD or video tapes, see FIG. 20B), packaging containers (e.g., wrapping paper or bottles, see FIG. 20C), vehicles (e.g., bicycles, see FIG. 20D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 20E and 20F).

An RF tag 4000 of one embodiment of the present invention is fixed to a product by being attached to a surface thereof or embedded therein. For example, the RF tag 4000 is fixed to each product by being embedded in paper of a book, or embedded in an organic resin of a package. Since the RE tag 4000 of one embodiment of the present invention can be reduced in size, thickness, and weight, it can be fixed to a product without spoiling the design of the product. Furthermore, bills, coins, securities, bearer bonds, documents, or the like can have an identification function by being provided with the RF tag 4000 of one embodiment of the present invention, and the identification function can be utilized to prevent counterfeiting. Moreover, the efficiency of a system such as an inspection system can be improved by providing the RF tag of one embodiment of the present invention for packaging containers, recording media, personal belongings, foods, clothing, household goods, electronic devices, or the like. Vehicles can also have higher security against theft or the like by being provided with the RF tag of one embodiment of the present invention.

As described above, by using the RF tag of one embodiment of the present invention for each application described in this embodiment, power for operation such as writing or reading of data can be reduced, which results in an increase in the maximum communication distance. Moreover, data can be held for an extremely long period even in the state where power is not supplied; thus, the RF tag can be preferably used for application in which data is not frequently written or read.

Note that this embodiment can be combined with any of the other embodiments in this specification as appropriate.

Embodiment 6

Described in this embodiment are transistors of one embodiment of the disclosed invention.

Transistors in one embodiment of the present invention each preferably include an nc-OS or a CAAC-OS, which is described in Embodiment 8.

Structure Example 1 of Transistor

FIGS. 21A to 21C are a top view and cross-sectional views of a transistor 1400a. FIG. 21A is the top view. FIG. 21B is a cross-sectional view taken along dashed-dotted line A1-A2 in FIG. 21A, and FIG. 21C is a cross-sectional view taken along dashed-dotted line A3-A4 in FIG. 21A. Note that for simplification of the drawing, some components in the top view in FIG. 21A are not illustrated. The dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450; an insulating film 1401 over the substrate 1450; a conductive film 1414 over the insulating film 1401; an insulating film 1402 covering the conductive film 1414; an insulating film 1403 over the insulating film 1402; an insulating film 1404 over the insulating film 1403; a metal oxide 1431 and a metal oxide 1432 that are stacked in that order over the insulating film 1404; a conductive film 1421 in contact with top and side surfaces of the metal oxide 1432; a conductive film 1423 also in contact with the top and side surfaces of the metal oxide 1432; a conductive film 1422 over the conductive film 1421; a conductive film 1424 over the conductive film 1423; an insulating film 1405 over the conductive films 1422 and 1424; a metal oxide 1433 in contact with the metal oxides 1431 and 1432, the conductive films 1421 to 1424, and the insulating film 1405; an insulating film 1406 over the metal oxide 1433; a conductive film 1411 over the insulating film 1406; a conductive film 1412 over the conductive film 1411; a conductive film 1413 over the conductive film 1412; an insulating film 1407 covering the conductive film 1413; and an insulating film 1408 over the insulating film 1407. Note that the metal oxides 1431 to 1433 are collectively referred to as a metal oxide 1430.

The metal oxide 1432 is a semiconductor and functions as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 function as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 function as one of source and drain electrodes of the transistor 1400a. The conductive films 1423 and 1424 function as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 function as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 functions as a first gate insulating film of the transistor 1400a.

The conductive film 1414 functions as a second gate electrode of the transistor 1400a.

The potential applied to the conductive films 1411 to 1413 may be the same as or different from that applied to the conductive film 1414. The conductive film 1414 may be omitted depending on circumstances.

The insulating films 1401 to 1404 function as a base insulating film of the transistor 1400a. The insulating films 1402 to 1404 also function as a second gate insulating film of the transistor 1400a.

The insulating films 1405 to 1408 function as a protective insulating film or an interlayer insulating film of the transistor 1400a.

As illustrated in FIG. 21C, the side surface of the metal oxide 1432 is surrounded by the conductive film 1411. With this structure, the metal oxide 1432 can be electrically surrounded by an electric field of the conductive film 1411. Such a structure of a transistor in which a semiconductor is electrically surrounded by an electric field of a gate electrode is referred to as a surrounded channel (s-channel) structure. Therefore, a channel is formed in the entire metal oxide 1432 (bulk). In the s-channel structure, a large amount of current can flow between a source and a drain of a transistor, so that the on-state current of the transistor can be increased.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400*a*, a region functioning as a gate electrode is formed to fill an opening 1415 formed in the insulating film 1405 and the like, that is, in a self-aligning manner.

As illustrated in FIG. 21B, the conductive films 1411 and 1422 have a region where they overlap with each other with the insulating film positioned therebetween. The conductive films 1411 and 1423 also have a region where they overlap with each other with the insulating film positioned therebetween. These regions function as parasitic capacitance caused between the gate electrode and the source or drain electrode and might decrease the operation speed of the transistor 1400*a*. This parasitic capacitance can be reduced by providing the insulating film 1405 in the transistor 1400*a*. The insulating film 1405 preferably contains a material with a low relative dielectric constant.

Figure 22A:
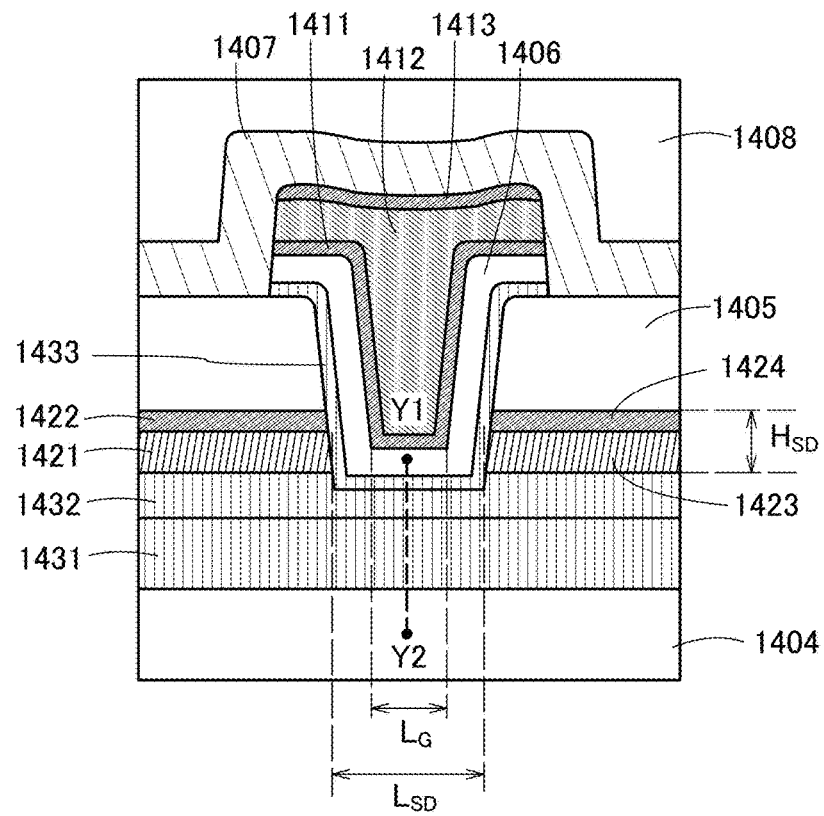
FIG. 22A is a cross-sectional view illustrating a structure example of a transistor.

FIG. 22A is an enlarged view of the center of the transistor 1400*a*. In FIG. 22A, width $L_G$ denotes the length of the bottom surface of the conductive film 1411 that faces and lies parallel to the top surface of the metal oxide 1432 with the insulating film 1406 and the metal oxide 1433 positioned therebetween. The width $L_G$ is the line width of the gate electrode. In FIG. 22A, width $L_{SD}$ denotes the length between the conductive films 1421 and 1423, i.e., the length between the source and drain electrodes.

The width $L_{SD}$ is generally determined by the minimum feature size. As illustrated in FIG. 22A, the width La is narrower than the width $L_{SD}$. This means that in the transistor 1400*a*, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 22A, height $H_{SD}$ denotes the total thickness of the conductive films 1421 and 1422, or the total thickness of the conductive films 1423 and 1424.

The thickness of the insulating film 1406 is preferably less than or equal to the height $H_{SD}$ because the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, more preferably five times or more, the thickness of the insulating film 1406, because the parasitic capacitance is negligibly small. As a result, the transistor 1400*a* can operate at high frequency.

Components of the transistor 1400*a* are described below.
<<Metal Oxide Layer>>

First, a metal oxide that can be used as the metal oxides 1431 to 1433 is described.

The transistor 1400*a* preferably has low current (off-state current) flowing between a source and a drain in the off state. Examples of the transistor with low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M. The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of these elements may be used in combination as the element M. The element M is an element having high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide).

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than 3 eV and less than or equal to 3.5 eV.

A CAAC-OS film which is described later is preferably used for the metal oxide 1432.

The metal oxides 1431 and 1433 include, for example, one or more, or two or more elements other than oxygen included in the metal oxide 1432. Since the metal oxides 1431 and 1433 include one or more, or two or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with an atomic ratio of In:M:Zn=1:3:2, 1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with an atomic ratio of In:M:Zn=1:1:1, 1:1:1.2, 2:1:3, 3:1:2, 4:2:4.1, or the like can be used. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2 or 1:3:4. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 22B:
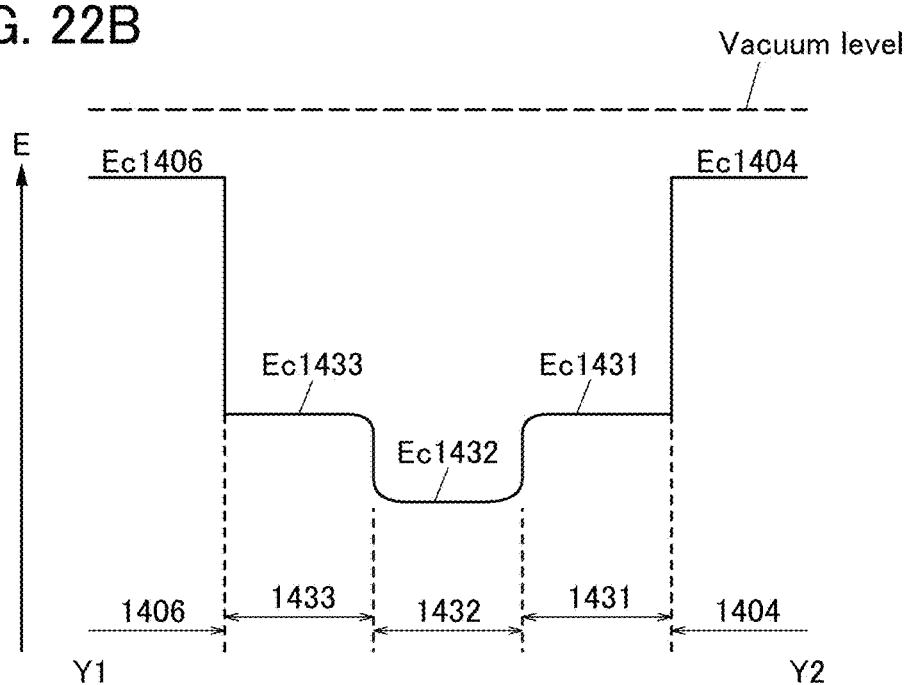
FIG. 22B is an energy band diagram of the transistor.

The function and effect of the metal oxide 1430, which includes a stack of the metal oxides 1431 to 1433, are described with reference to an energy band diagram of FIG. 22B. FIG. 22B shows the energy band structure of a portion taken along line Y1-Y2 in FIG. 22A, that is, the energy band structure of a channel formation region of the transistor 1400a and the vicinity thereof.

In FIG. 22B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as an electron affinity) corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having a higher electron affinity than those of the metal oxides 1431 and 1433. For example, as the metal oxide 1432, a metal oxide having an electron affinity higher than those of the metal oxides 1431 and 1433 by 0.07 eV or more and 1.3 eV or less, preferably 0.1 eV or more and 0.7 eV or less, more preferably 0.15 eV or more and 0.4 eV or less is used. Note that the electron affinity is an energy gap between the vacuum level and the bottom of the conduction band.

Indium gallium oxide has a low electron affinity and a high oxygen-blocking property. Therefore, the metal oxide 1433 preferably includes indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current hardly varies even when the interface state density, which inhibits electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (Ra) with the measurement area of 1 μm×1 μm is less than 1 nm, preferably less than 0.6 nm, further preferably less than 0.5 nm, and still further preferably less than 0.4 nm. The maximum difference (P–V) with the measurement area of 1 μm×1 μm is less than 10 nm, preferably less than 9 nm, more preferably less than 8 nm, still more preferably less than 7 nm. The RMS roughness, Ra, and P–V can be measured with, for example, a scanning probe microscope SPA-500 manufactured by SII Nano Technology Inc.

The electron movement is also inhibited in the case where the density of defect states is high in the channel formation region. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_{OH}$ in the following description in some cases. $V_{OH}$ is a factor in decreasing the on-state current of the transistor because $V_{OH}$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, and still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1133 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region where the concentration of silicon measured by SIMS is higher than or equal to $1\times10^{16}$ atoms/cm$^3$ and lower than $1\times10^{19}$ atoms/cm$^{19}$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region where the concentration of silicon measured by SIMS is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$.

It is preferable to reduce the concentration of hydrogen in the metal oxides 1431 and 1433 in order to reduce the concentration of hydrogen in the metal oxide 1432. The metal oxides 1431 and 1433 each have a region where the concentration of hydrogen measured by SIMS is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. It is also preferable to reduce the concentration of nitrogen in the metal oxides 1431 and 1433 in order to reduce the concentration of nitrogen in the metal oxide 1432. The metal oxides 1431 and 1433 each have a region where the concentration of nitrogen measured by SIMS is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$.

The metal oxides 1431 to 1433 may be formed by sputtering, chemical vapor deposition (CVD), molecular beam epitaxy (MBE), pulsed laser deposition (PLD), atomic layer deposition (ALD), or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., more preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without the metal oxide 1431 or 1433 may be employed. Alternatively, any one of the semiconductors given as examples of the metal oxides 1431 to 1433 may be provided over or below the metal oxide 1431 or over or below the metal oxide 1433, i.e., a four-layer structure may be employed. Alternatively, an n-layer structure (n is an integer of 5 or more) in which any one of the semiconductors given as examples of the metal oxides 1431 to 1433 is provided at two or more of the following positions may be employed: over the metal oxide 1431, below the metal oxide 1431, over the metal oxide 1433, and below the metal oxide 1433.

<<Substrate>>

As the substrate 1450, for example, an insulator substrate, a semiconductor substrate, or a conductor substrate may be used. Examples of the insulator substrate include a glass substrate, a quartz substrate, a sapphire substrate, a stabilized zirconia substrate (e.g., an yttria-stabilized zirconia substrate), and a resin substrate. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like can be used. Examples of the conductor substrate include a graphite substrate, a metal substrate, an alloy substrate, and a conductive resin substrate. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can be used. Alternatively, any of these substrates over which an element is provided may be used. Examples of the element provided over the substrate include a capacitor, a resistor, a switching element, a light-emitting element, and a memory element.

A flexible substrate may be used as the substrate 1450. As a method for providing a transistor over a flexible substrate, there is a method in which a transistor is formed over a non-flexible substrate, and then the transistor is separated and transferred to the substrate 1450 that is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 µm and less than or equal to 700 µm, preferably greater than or equal to 10 µm and less than or equal to 500 µm, more preferably greater than or equal to 15 µm and less than or equal to 300 µm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450 that is caused by dropping or the like can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment is suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyimide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

<<Base Insulating Film>>

The insulating film 1401 as a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage that is formed by reacting tetraethyl orthosilicate (TEOS), silane, or the like with oxygen, nitrous oxide, or the like.

After the insulating film 1402 is formed, the insulating film 1402 may be subjected to planarization treatment by CMP or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen at a proportion higher than that in the stoichiometric composition. Part of oxygen is released by heating from an oxide film containing oxygen at a proportion higher than that in the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen at a proportion higher than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$, in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by, for example, ion implantation, ion doping, plasma immersion ion implantation, plasma treatment, or the like.

A gas containing oxygen can be used for oxygen introducing treatment. Examples of the gas containing oxygen include oxygen, nitrous oxide, nitrogen dioxide, carbon dioxide, and carbon monoxide. Furthermore, a rare gas may be included in the gas containing oxygen for the oxygen introducing treatment. Moreover, hydrogen or the like may be included. For example, a mixed gas of carbon dioxide, hydrogen, and argon may be used.

After the insulating film 1404 is formed, the insulating film 1404 may be subjected to planarization treatment by CMP or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. The insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

The threshold voltage of the transistor 1400*a* can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

<<Gate Electrode>>

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

<<Source Electrode and Drain Electrode>>

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), or strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

<<Low-Resistance Region>>

The regions 1441 and 1442 are formed when, for example, the conductive films 1421 and 1423 extract oxygen from the metal oxides 1431 and 1432. Oxygen is more likely to be extracted at higher temperatures. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

<<Gate Insulating Film>>

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, the combination of silicon oxide or silicon oxynitride with an insulator with a high relative dielectric constant makes the layered structure thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

<<Interlayer Insulating Film and Protective Insulating Film>>

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, the combination of silicon oxide or silicon oxynitride with a resin makes the layered structure thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. The insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like may be provided. Examples of the oxide insulating film include an aluminum oxide film, an aluminum oxynitride film, a gallium oxide film, a gallium oxynitride film, an yttrium oxide film, an yttrium oxynitride film, a hafnium oxide film, and a hafnium oxynitride film.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 23A:
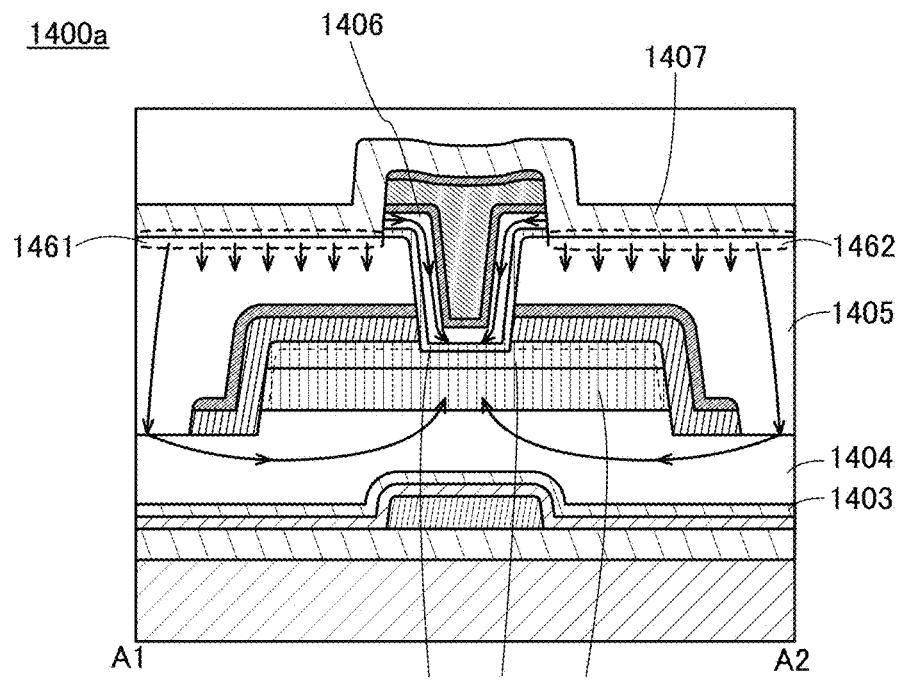
FIGS. 23A and 23B are cross-sectional views illustrating oxygen diffusion paths.
Figure 23B:
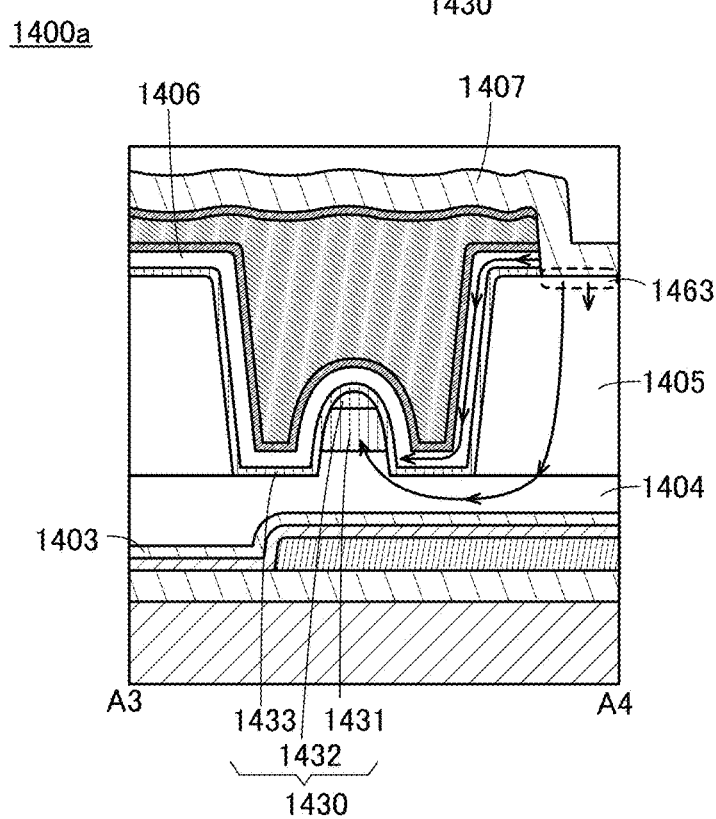

In schematic views of FIGS. 23A and 23B, oxygen added to the insulating films 1405 and 1406 in the formation of the insulating film 1407 is diffused in the insulating films through the second heat treatment and reaches the metal oxide 1430. In FIG. 23A, oxygen diffused in the cross-sectional view of FIG. 21B is indicated by arrows. In FIG. 23B, oxygen diffused in the cross-sectional view of FIG. 21C is indicated by arrows.

As illustrated in FIGS. 23A and 23B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is preferably performed at a temperature lower than that of the first heat treatment by 20° C. or higher and 150° C. or lower, preferably 40° C. or higher and 100° C. or lower. Accordingly, superfluous release of oxygen from the insulating film 1404 can be inhibited. Note that the second heat treatment is not necessarily performed when heating during formation of the films can work as heat treatment comparable to the second heat treatment.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, for example, an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

Structure Example 2 of Transistor

The conductive film 1414 and the insulating films 1402 and 1403 can be omitted in the transistor 1400a illustrated in FIGS. 21A to 21C. An example of such a structure is illustrated in FIGS. 24A to 24C.

Figure 24A:
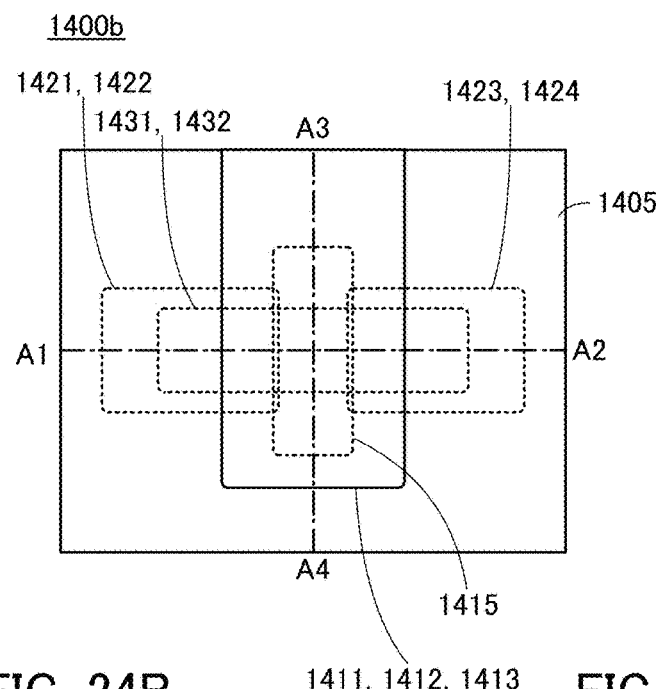
FIGS. 24A to 24C are a top view and cross-sectional views illustrating a structure example of a transistor.
Figure 24B:
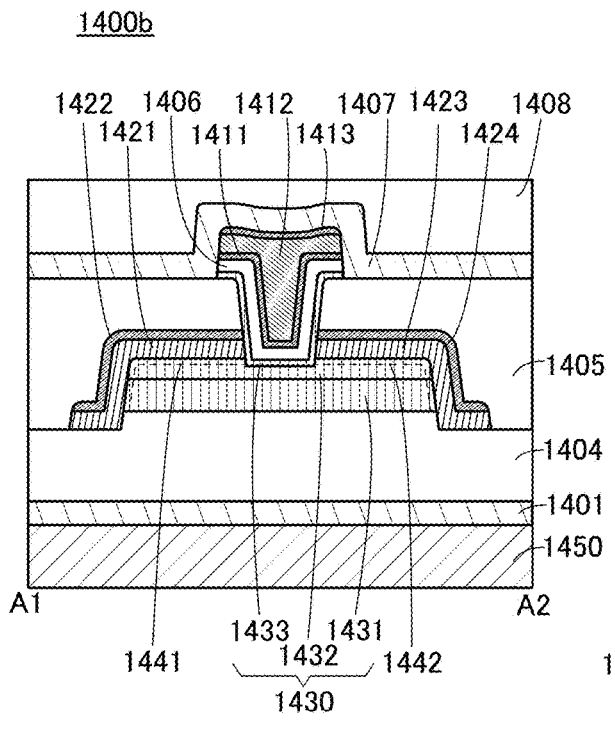
Figure 24C:
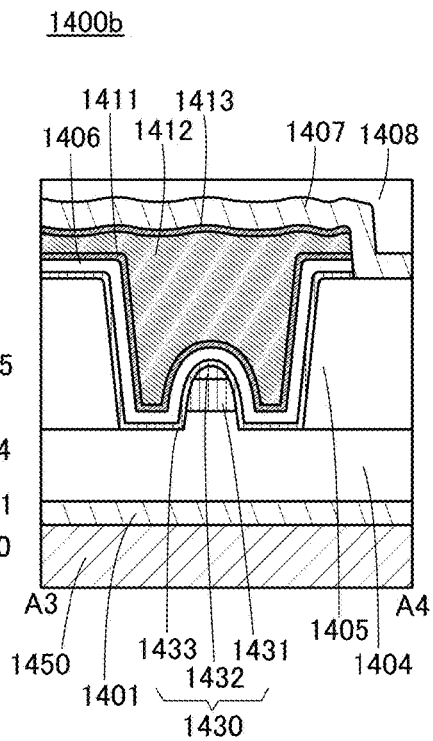

FIGS. 24A to 24C are a top view and cross-sectional views of a transistor 1400b. FIG. 24A is the top view. FIG. 24B is a cross-sectional view taken along dashed-dotted line A1-A2 in FIG. 24A, and FIG. 24C is a cross-sectional view taken along dashed-dotted line A3-A4 in FIG. 24A. Note that for simplification of the drawing, some components in the top view in FIG. 24A are not illustrated. The dashed-dotted line A1-A2 and the dashed-dotted line A3-A4 are sometimes referred to as a channel length direction of the transistor 1400b and a channel width direction of the transistor 1400b, respectively.

Structure Example 3 of Transistor

In the transistor 1400a illustrated in FIGS. 21A to 21C, parts of the conductive films 1421 and 1423 that overlap with the gate electrode (the conductive films 1411 to 1413) can be reduced in thickness. An example of such a structure is illustrated in FIGS. 25A to 25C.

Figure 25A:
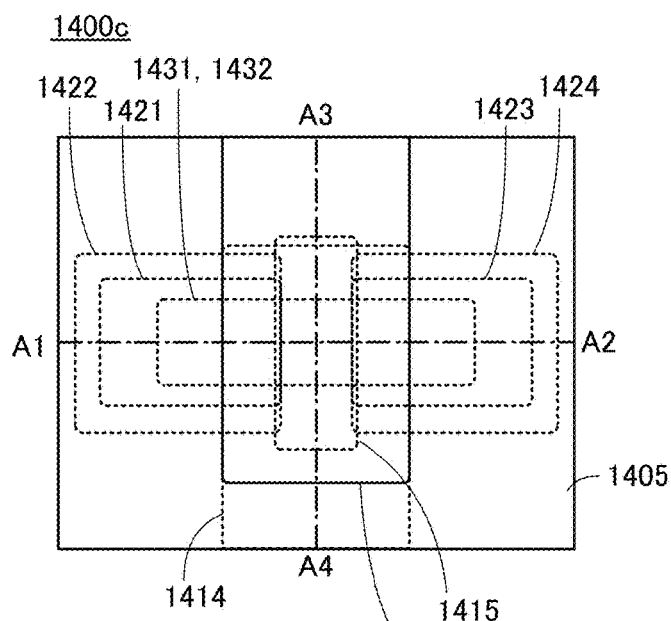
FIGS. 25A to 25C are a top view and cross-sectional views illustrating a structure example of a transistor.
Figure 25B:
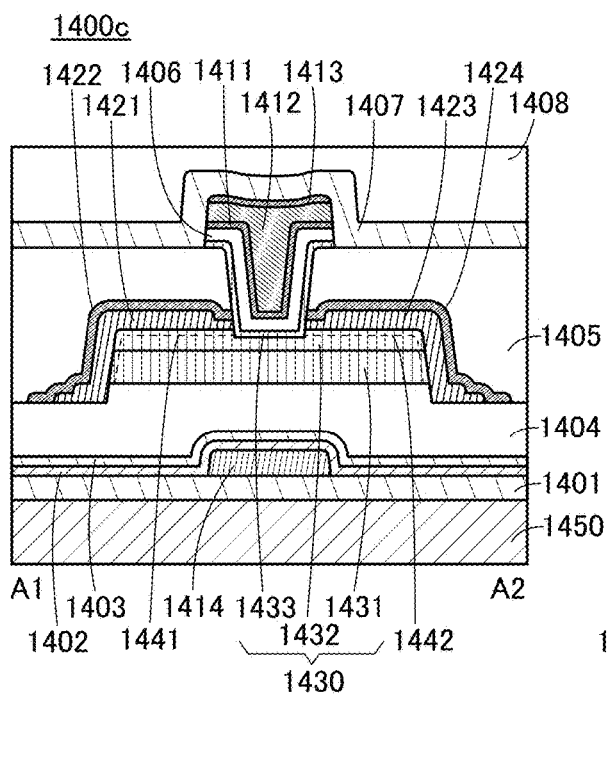
Figure 25C:
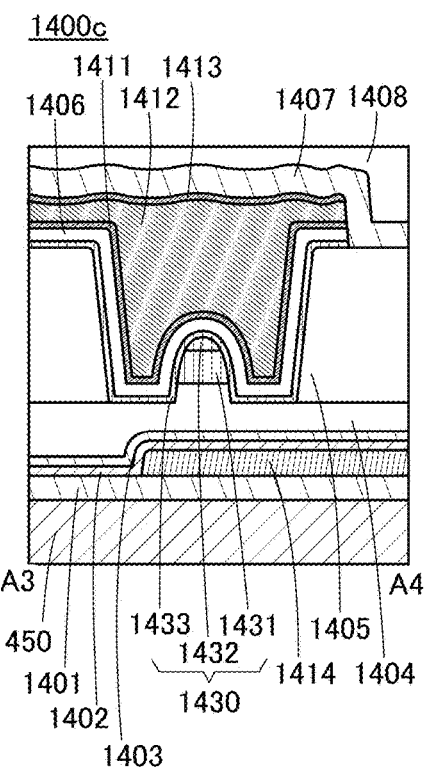

FIGS. 25A to 25C are a top view and cross-sectional views of a transistor 1400c. FIG. 25A is the top view, FIG. 25B is a cross-sectional view taken along dashed-dotted line A1-A2 in FIG. 25A, and FIG. 25C is a cross-sectional view taken along dashed-dotted line A3-A4 in FIG. 25A. Note that for simplification of the drawing, some components in the top view in FIG. 25A are not illustrated. The dashed-dotted line A1-A2 and the dashed-dotted line A3-A4 are sometimes referred to as a channel length direction of the transistor 1400c and a channel width direction of the transistor 1400c, respectively.

In the transistor 1400c illustrated in FIG. 25B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400c that has the structure in FIG. 25B can have an increased distance between the gate and source electrodes or between the gate and drain electrodes. This results in a reduction in the parasitic capacitance formed between the gate electrode and the source and drain electrodes. As a result, a transistor capable of high-speed operation can be obtained.

Structure Example 4 of Transistor

In the transistor 1400c illustrated in FIGS. 25A to 25C, the width of the metal oxides 1431 and 1432 can be increased in the A3-A4 direction. An example of such a structure is illustrated in FIGS. 26A to 26C.

Figure 26A:
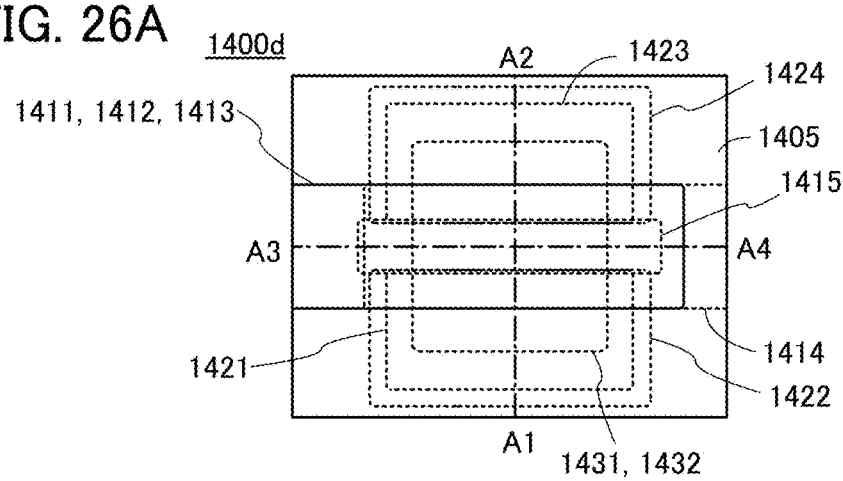
FIG. 26A is a top view and FIGS. 26B and 26C are cross-sectional views illustrating a structure example of a transistor.
Figure 26B:
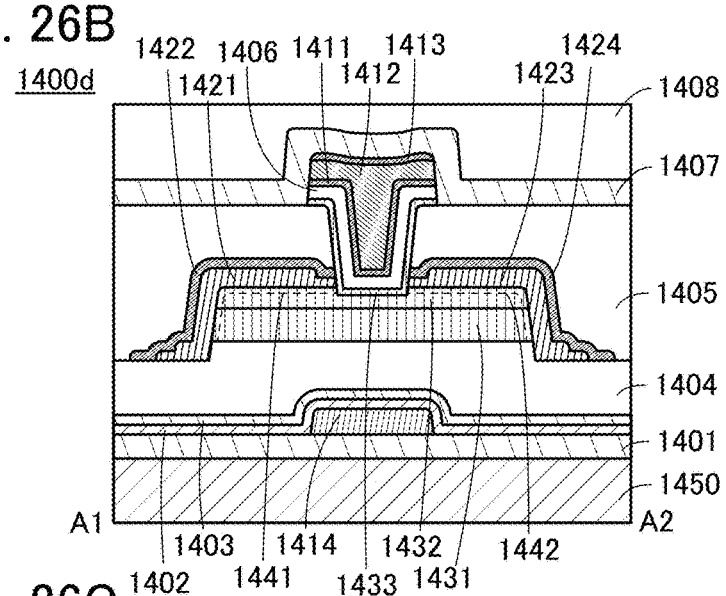
Figure 26C:
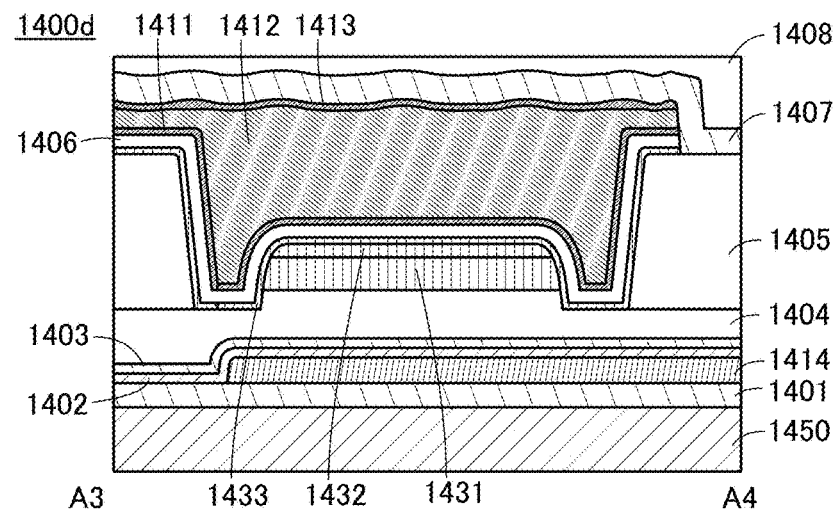

FIGS. 26A to 26C are a top view and cross-sectional views of a transistor 1400d. FIG. 26A is the top view. FIG. 26B is a cross-sectional view taken along dashed-dotted line A1-A2 in FIG. 26A, and FIG. 26C is a cross-sectional view taken along dashed-dotted line A3-A4 in FIG. 26A. Note that for simplification of the drawing, some components in the top view in FIG. 26A are not illustrated. The dashed-dotted line A1-A2 and the dashed-dotted line A3-A4 are sometimes referred to as a channel length direction of the transistor 1400d and a channel width direction of the transistor 1400d, respectively.

The transistor 1400d that has the structure in FIGS. 26A to 26C can have increased on-state current.

Structure Example 5 of Transistor

In the transistor 1400c illustrated in FIGS. 25A to 25C, a plurality of regions (fins) consisting of the metal oxides 1431 and 1432 may be provided in the A3-A4 direction. An example of such a structure is illustrated in FIGS. 27A to 27C.

Figure 27A:
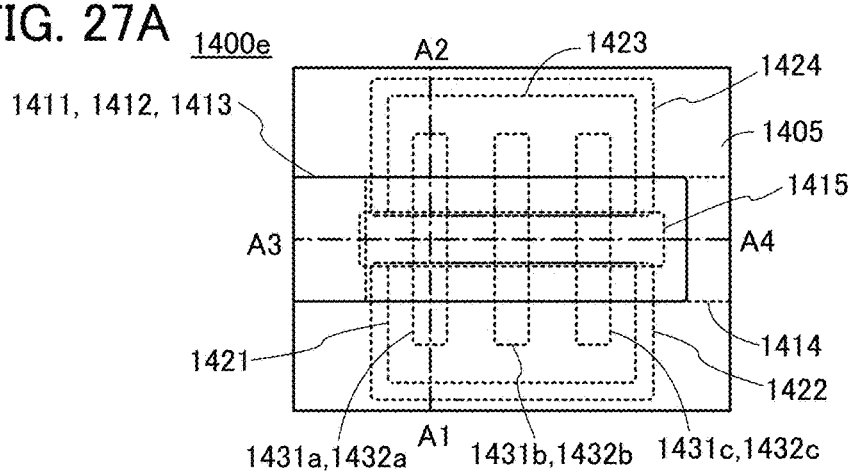
FIG. 27A is a top view and FIGS. 27B and 27C are cross-sectional views illustrating a structure example of a transistor.
Figure 27B:
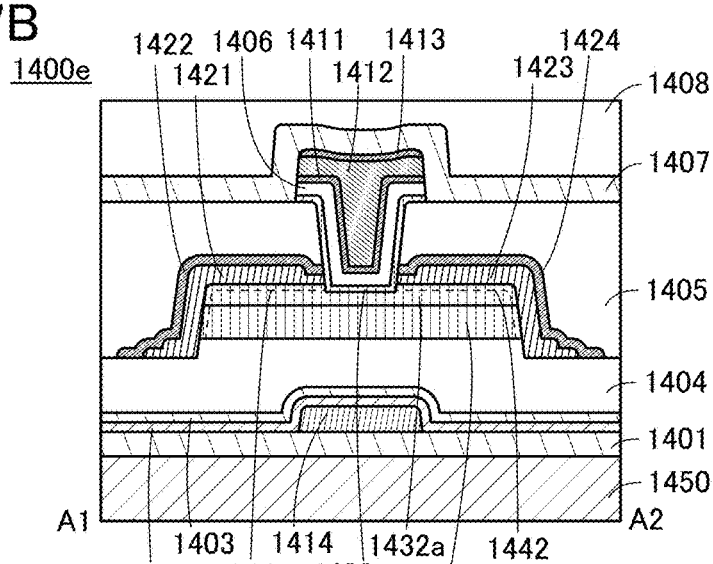
Figure 27C:
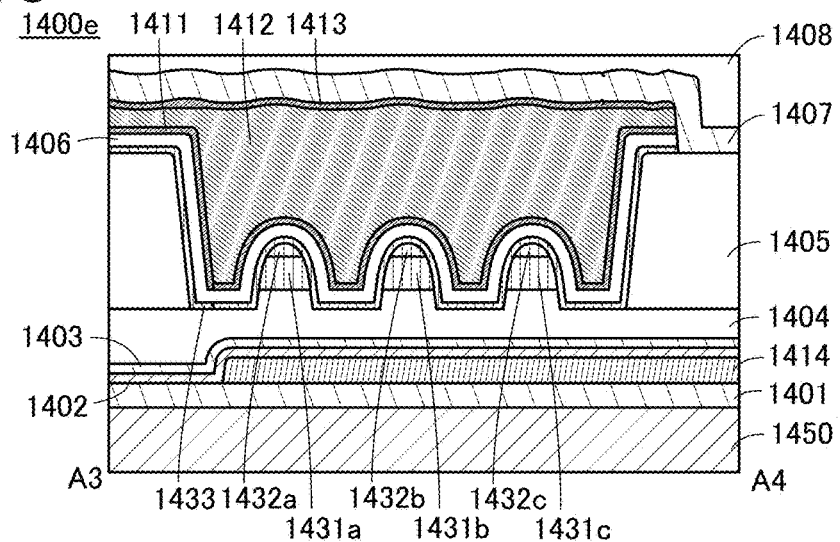

FIGS. 27A to 27C are a top view and cross-sectional views of a transistor 1400e. FIG. 27A is the top view. FIG.

27B is a cross-sectional view taken along dashed-dotted line A1-A2 in FIG. 27A, and FIG. 27C is a cross-sectional view taken along dashed-dotted line A3-A4 in FIG. 27A. Note that for simplification of the drawing, some components in the top view in FIG. 27A are not illustrated. The dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that a transistor with high on-state current can be obtained.

Structure Example 6 of Transistor

Figure 28A:
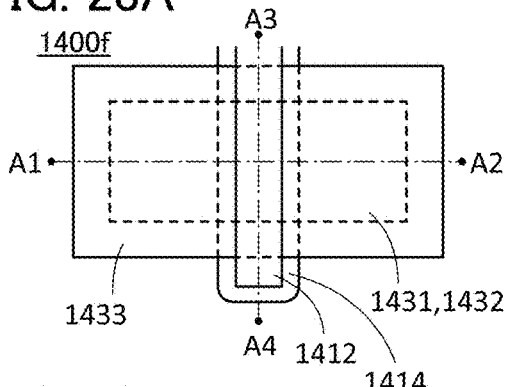
FIG. 28A is a top view and FIGS. 28B to 28D are cross-sectional views illustrating a structure example of a transistor.
Figure 28B:
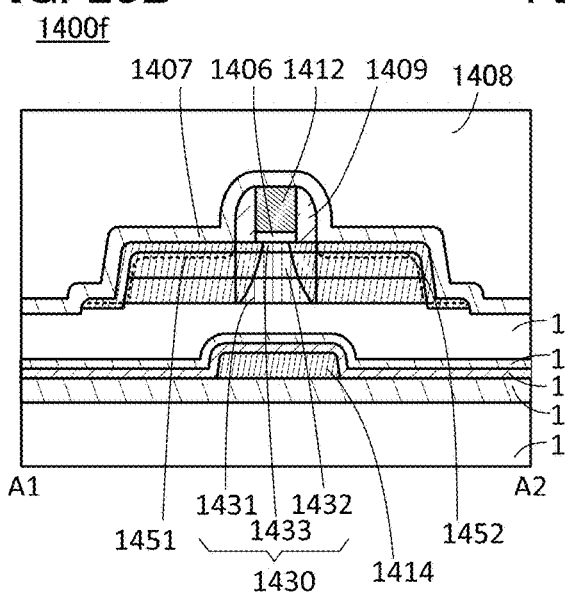
Figure 28C:
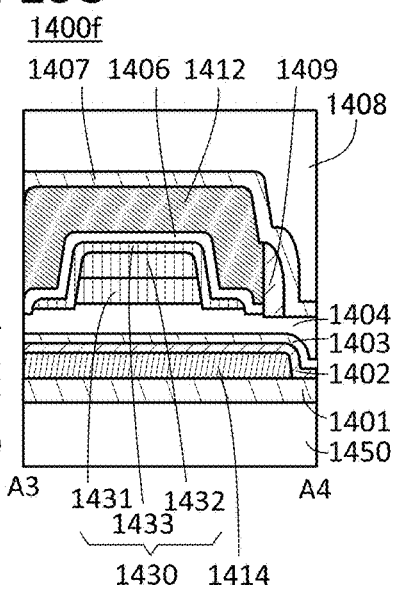

FIGS. 28A to 28D are a top view and cross-sectional views of a transistor 1400f. FIG. 28A is the top view of the transistor 1400f. FIG. 28B is a cross-sectional view taken along dashed-dotted line A1-A2 in FIG. 28A, and FIG. 28C is a cross-sectional view taken along dashed-dotted line A3-A4 in FIG. 28A. The dashed-dotted line A1-A2 and the dashed-dotted line A3-A4 are sometimes referred to as a channel length direction and a channel width direction, respectively. The transistor 1400f has an s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating films 1407 and 1408. The insulating film 1409 functions as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. It is preferable that the side edge of the conductive film 1412 in the channel length direction be approximately aligned with the side edge of the insulating film 1406 in the channel length direction. Here, the insulating film 1406 functions as a gate insulating film of the transistor 1400f and the conductive film 1412 functions as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is positioned outward from the outer edges of the metal oxides 1431 and 1432. However, the shape of the transistor in this embodiment is not limited to that where the outer edge of the metal oxide 1433 is positioned outward from the outer edge of the metal oxide 1431. For example, the outer edge of the metal oxide 1431 may be positioned outward from the outer edge of the metal oxide 1433, or the side edge of the metal oxide 1431 may be approximately aligned with the side edge of the metal oxide 1433.

Figure 28D:
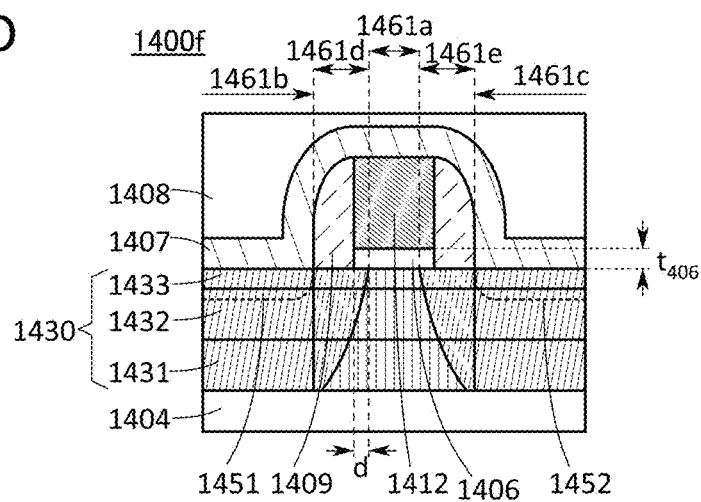

FIG. 28D is an enlarged view of part of FIG. 28B. As illustrated in FIG. 28D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have a much lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As illustrated in FIG. 28D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as illustrated in FIG. 28D, the border between the regions 1461b and 1461d overlaps with the border between the side edges of the insulating films 1407 and 1409. The same applies to the border between the regions 1461c and 1461e. Here, parts of the regions 1461d and 1461e preferably overlap with part of a region (channel formation region) where the metal oxide 1432 and the conductive film 1412 overlap with each other. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25t_{406} < d < t_{406}$.

In this manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 28D, in some cases, the boundary between the regions 1461d and 1461a around the lower surface of the metal oxide 1431 is formed closer to the A1 side of the dashed-dotted line A1-A2 than the boundary between the regions 1461d and 1461a around the upper surface of the metal oxide 1433 is; in other words, the boundary is formed closer to the A1 side in the deeper region. The distance d in that case is the distance between the boundary between the regions 1461d and 1461a which is closest to the inner part of the conductive film 1412 in the direction of the dashed-dotted line A1-A2 and the side edge of the conductive film 1412 at A1 side in the direction of the dashed-dotted line A1-A2. Similarly, the boundary between the regions 1461e and 1461a around the lower surface of the metal oxide 1431 is formed closer to the A2 side of the dashed-dotted line A1-A2 than the boundary between the regions 1461e and 1461a around the upper surface of the metal oxide 1433 is; in other words, the boundary is formed closer to the A2 side in the deeper region. The distance d in that case is the distance between the boundary between the regions 1461e and 1461a which is closest to the inner part of the conductive film 1412 in the direction of the dashed-dotted line A1-A2 and the side edge of the conductive film 1412 at A2 side in the direction of the dashed-dotted line A1-A2.

In some cases, for example, the regions 1461*d* and 1461*e* in the metal oxide 1431 do not overlap with the conductive film 1412. In that case, at least part of the regions 1461*d* and 1461*e* in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of the elements included in the insulating film 1407. Preferably, parts of the low-resistance regions 1451 and 1452 are substantially in contact with or overlap partly with the region (channel formation region) where the metal oxide 1432 and the conductive film 1412 overlap with each other.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461*b* and 1461*c*, respectively, ideally, the metal oxide 1430 has a structure in which the concentration of added elements is the highest in the low-resistance regions 1451 and 1452, the second highest in the regions 1461*b* and 1461*c* to 1461*e* other than the low-resistance regions 1451 and 1452, and the lowest in the region 1461*a*. The added elements refer to a dopant for forming the regions 1461*b* and 1461*c* and an element added from the insulating film 1407 to the low-resistance regions 1451 and 1452.

Although the low-resistance regions 1451 and 1452 are formed in the transistor 1400*f*, the semiconductor device in this embodiment is not limited to this structure. For example, the low-resistance regions 1451 and 1452 are not necessarily formed in the case where the regions 1461*b* and 1461*c* have sufficiently low resistance.

Structure Example 7 of Transistor

Figure 29A:
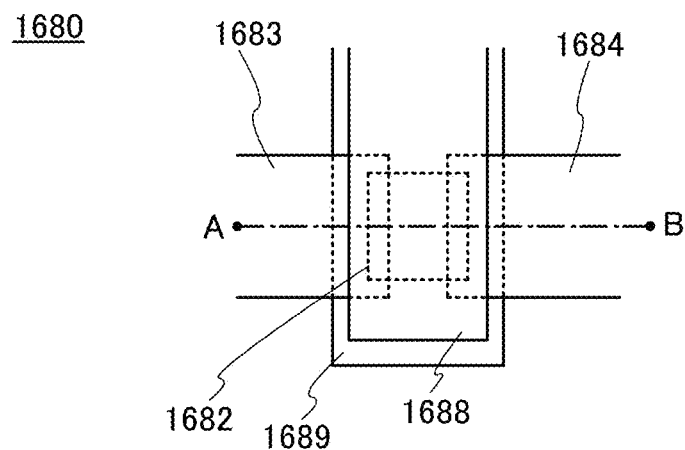
FIG. 29A is a top view and FIG. 29B is a cross-sectional view illustrating a structure example of a transistor.
Figure 29B:
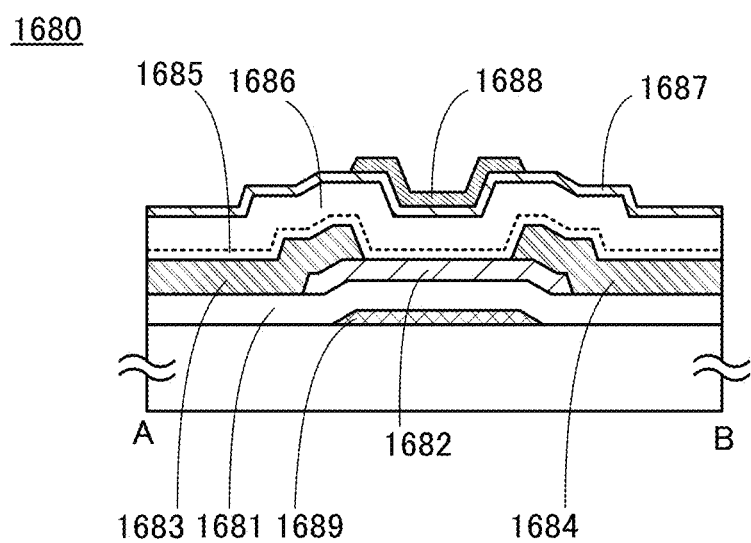

FIGS. 29A and 29B are a top view and a cross-sectional view illustrating a transistor 1680. FIG. 29A is the top view. FIG. 29B illustrates a cross section taken along dashed-dotted line A-B in FIG. 29A. In FIGS. 29A and 29B, some components are scaled up or down or omitted for easy understanding. In some cases, the direction of dashed-dotted line A-B is referred to as a channel length direction.

The transistor 1680 in FIG. 29B includes a conductive film 1689 functioning as a first gate, a conductive film 1688 functioning as a second gate, a semiconductor 1682, conductive films 1683 and 1684 functioning as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 positioned therebetween. The conductive film 1688 overlaps with the semiconductor 1682 with the insulating films 1685, 1686, and 1687 positioned therebetween. The conductive films 1683 and 1684 are connected to the semiconductor 1682.

The description of the conductive films 1411 to 1414 in FIGS. 21A to 21C may be referred to for the details of the conductive films 1689 and 1688.

The conductive films 1689 and 1688 may be supplied with different potentials, or may be supplied with the same potential at the same time. The conductive film 1688 serving as a second gate electrode in the transistor 1680 leads to stabilization of the threshold voltage. Note that the conductive film 1688 may be omitted in some cases.

The description of the metal oxide 1432 in FIGS. 21A to 21C may be referred to for the details of the semiconductor 1682. The semiconductor 1682 may be a single layer or a stack including a plurality of semiconductor layers.

The description of the conductive films 1421 to 1424 in FIGS. 21A to 21C may be referred to for the details of the conductive films 1683 and 1684.

The description of the insulating film 1406 in FIGS. 21A to 21C may be referred to for the details of the insulating film 1681.

The insulating films 1685 to 1687 are sequentially stacked over the semiconductor 1682 and the conductive films 1683 and 1684 in FIG. 29B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the formation of the insulating film 1686 directly on the semiconductor 1682 causes damage to the semiconductor 1682 at the time of formation of the insulating film 1686, the insulating film 1685 is preferably provided between the semiconductor 1682 and the insulating film 1686, as illustrated in FIG. 29B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

An insulating film has a better blocking effect as the insulating film has a higher density and becomes denser or has a fewer dangling bonds and becomes more chemically stable. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

Note that this embodiment can be combined with any of the other embodiments in this specification as appropriate.

Embodiment 7

In this embodiment, structure examples of a device in which the structure examples of the transistor described in Embodiment 6 is used for the strings 101 to 106 (hereinafter collectively referred to as a string 100) described in Embodiment 1 are described with reference to FIGS. 30A and 30B, FIGS. 31A and 31B, FIGS. 32A and 32B, FIGS. 33A and 33B, FIGS. 34A and 34B, FIGS. 35A and 35B, FIGS. 36A and 36B, and FIGS. 37A and 37B.

Structure Example 1 of Stack of Elements

Figure 30A:
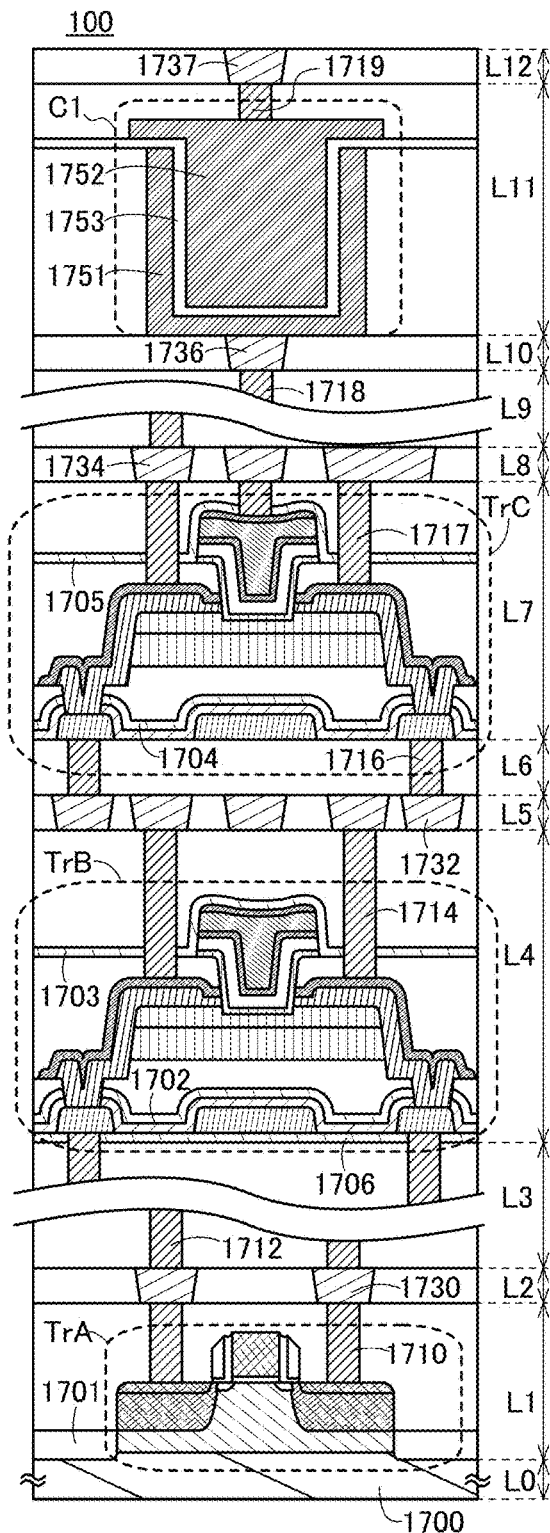
FIGS. 30A and 30B are cross-sectional views illustrating a structure example of a string.
Figure 30B:
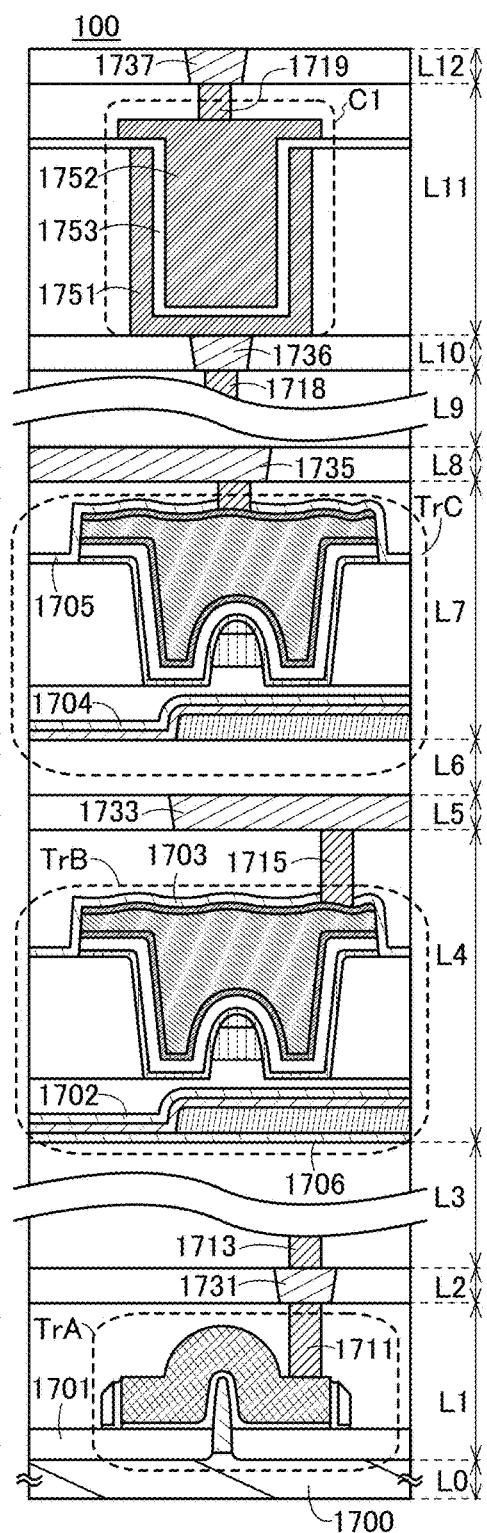

FIGS. 30A and 30B each illustrate part of a cross-sectional view of the string 100. FIG. 30A is a cross-sectional view of transistors included in the string 100 in a channel length direction. FIG. 30B is a cross-sectional view of transistors included in the string 100 in a channel width direction.

The string 100 in FIGS. 30A and 30B includes layers L0 to L12 in the order from the bottom.

The layer L0 includes a substrate 1700.

The layer L1 includes a transistor TrA formed using the substrate 1700, an element isolation layer 1701, and a plurality of conductors such as a conductor 1710 and a conductor 1711.

The layer L2 includes a plurality of wirings such as a wiring 1730 and a wiring 1731.

The layer L3 includes a plurality of conductors such as a conductor 1712 and a conductor 1713 and a plurality of wirings (not illustrated).

The layer L4 includes an insulator 1706, a transistor TrB, an insulator 1702, an insulator 1703, and a plurality of conductors such as a conductor 1714 and a conductor 1715.

The layer L5 includes a plurality of wirings such as a wiring 1732 and a wiring 1733.

The layer L6 includes a plurality of conductors such as a conductor 1716.

The layer L7 includes a transistor TrC, an insulator 1704, an insulator 1705, and a plurality of conductors such as a conductor 1717.

The layer L8 includes a plurality of wirings such as a wiring 1734 and a wiring 1735.

The layer L9 includes a plurality of conductors such as a conductor 1718 and a plurality of wirings (not illustrated).

The layer L10 includes a plurality of wirings such as a wiring 1736.

The layer L11 includes a capacitor C1 and a plurality of conductors such as a conductor 1719. The capacitor C1 includes a first electrode 1751, a second electrode 1752, and an insulating film 1753.

The layer L12 includes a plurality of wirings such as a wiring 1737.

The OS transistor described in Embodiment 6 is preferably used as the transistors TrB and TrC. In FIGS. 30A and 30B, the transistor 1400c in FIGS. 25A to 25C is used as the transistors TrB and TrC.

The transistor TrA is preferably formed using a semiconductor material different from that for the transistors TrB and TrC. In FIGS. 30A and 30B, a Si transistor is used as the transistor TrA.

Note that in FIGS. 30A and 30B, the transistors TrB and TrC include the conductive film 1414 as a back gate electrode. In the case where the string 100 is the string 104 and the transistor WOS[1] or WOS[2] corresponds to the transistor TrB or TrC, the transistor TrB or TrC does not necessarily include a back gate.

As the substrate 1700, a single crystal semiconductor substrate or a polycrystalline semiconductor substrate of silicon or silicon carbide, a compound semiconductor substrate of silicon germanium, an SOI substrate, or the like can be used.

For example, a glass substrate, a quartz substrate, a plastic substrate, a metal substrate, a flexible substrate, an attachment film, paper including a fibrous material, a base film, or the like may be used as the substrate 1700. Alternatively, a semiconductor element may be formed using one substrate, and then transferred to another substrate. In FIGS. 30A and 30B, as an example, a single crystal silicon wafer is used as the substrate 1700.

Figure 32A:
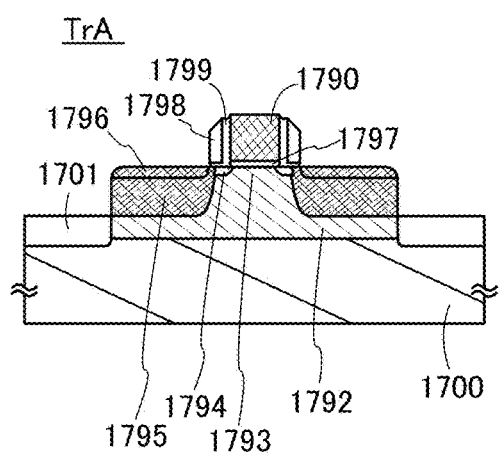
FIGS. 32A and 32B are cross-sectional views illustrating a structure example of a transistor included in a string.
Figure 32B:
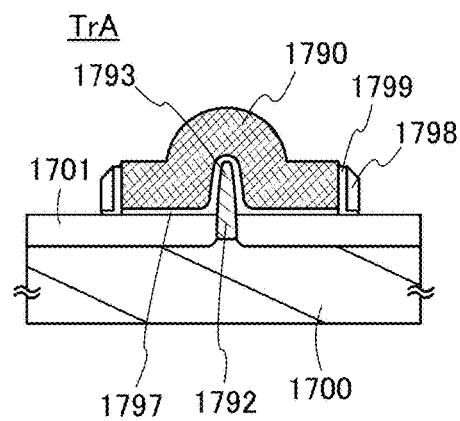

The transistor TrA is described in detail with reference to FIGS. 32A and 32B, FIG. 32A is a cross-sectional view of the transistor TrA in the channel length direction, and FIG. 32B is a cross-sectional view of the transistor TrA in the channel width direction. The transistor TrA includes a channel formation region 1793 formed in a well 1792, low concentration impurity regions 1794 and high concentration impurity regions 1795 (also collectively referred to as an impurity region simply), conductive regions 1796 provided in contact with the high concentration impurity regions 1795, a gate insulating film 1797 provided over the channel formation region 1793, a gate electrode 1790 provided over the gate insulating film 1797, and sidewall insulating layers 1798 and 1799 provided on side surfaces of the gate electrode 1790. Note that the conductive regions 1796 can be formed using metal silicide or the like. The conductive regions 1796 may be in contact with the low concentration impurity regions 1794.

In the transistor TrA in FIG. 32B, the channel formation region 1793 has a projecting portion, and the gate insulating film 1797 and the gate electrode 1790 are provided along side and top surfaces of the channel formation region 1793. The transistor with such a shape is referred to as a FIN-type transistor. Although the projecting portion is formed by processing part of the semiconductor substrate in this embodiment, a semiconductor layer with a projecting portion may be formed by processing an SOI substrate.

Figure 33A:
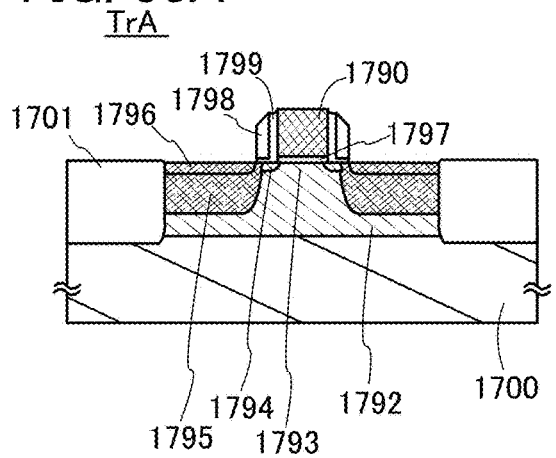
FIGS. 33A and 33B are cross-sectional views illustrating a structure example of a transistor included in a string.
Figure 33B:
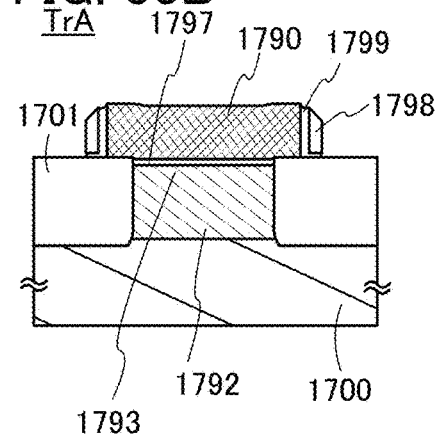

Note that the transistor TrA is not limited to the FIN-type transistor, and may be a planar-type transistor illustrated in FIGS. 33A and 33B. FIG. 33A is a cross-sectional view of the transistor TrA in the channel length direction, and FIG. 33B is a cross-sectional view of the transistor TrA in the channel width direction. The reference numerals in FIGS. 33A and 33B are the same as those in FIGS. 32A and 32B.

In FIGS. 30A and 30B, the insulators 1702 to 1706 preferably have a blocking effect against hydrogen, water, and the like. Water, hydrogen, and the like are factors that generate carriers in an oxide semiconductor; thus, such a blocking layer against hydrogen, water, and the like can improve the reliability of the transistors TrB and TrC. Examples of the insulator having a blocking effect against hydrogen, water, and the like include aluminum oxide, aluminum oxynitride, gallium oxide, gallium oxynitride, yttrium oxide, yttrium oxynitride, hafnium oxide, hafnium oxynitride, and yttria-stabilized zirconia (YSZ).

The wirings 1730 to 1737 and the conductors 1710 to 1719 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), or cobalt (Co), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The use of a Cu—Mn alloy is further preferable because manganese oxide formed at the interface with an insulator containing oxygen has a function of preventing Cu diffusion.

In FIGS. 30A and 30B, regions without reference numerals and hatch patterns represent regions formed of an insulator. As the insulator, an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, or the like can be used. Alternatively, in these regions, an organic resin such as a polyimide resin, a polyamide resin, an acrylic resin, a siloxane resin, an epoxy resin, or a phenol resin can be used. Note that in this specification, an oxynitride refers to a substance that contains more oxygen than nitrogen, and a nitride oxide refers to a substance that contains more nitrogen than oxygen.

In the case where OS transistors are used as the transistors WOS[1], WOS[2], ROS[1], ROS[2], and SW included in the strings 101 to 104 in Embodiment 1, the transistors WOS[1], WOS[2], ROS[1], ROS[2], and SW are preferably formed in the layer L4 or L7.

In the case where a Si transistor is used as the transistor SW in each of the strings 101 to 104 described in Embodiment 1, the transistor SW is preferably formed in the layer L1.

In the case where OS transistors are used as the transistors WOS[1] to WOS[m], ROS[1] to ROS[m], and SW included in the string 105 in Embodiment 1, the transistors WOS[1] to WOS[m], ROS[1] to ROS[m], and SW are preferably formed in the layer L4 or L7.

In the case where an OS transistor is used as at least one of the transistors WOS[1] to WOS[m] and ROS[1] to ROS[m] and SW included in the string 106 in Embodiment 1, the OS transistor is preferably formed in the layer L4 or L7. The transistor SW included in the string 106 is preferably formed in the layer L1.

The capacitors C[1] and C[2] included in the strings 101 to 104 in Embodiment 1 are preferably formed as the capacitor C1 in the layer L11.

The capacitors C[1] to C[m] included in the string 105 or 106 in Embodiment 1 are preferably formed as the capacitor C1 in the layer L11.

In the case where a driver circuit around the string 100 is formed using an OS transistor, the OS transistor may be formed in the layer L4 or L7.

In the case where a driver circuit around the string 100 is formed using a Si transistor, the Si transistor may be formed in the layer L1.

With the structure illustrated in FIGS. 30A and 30B, the area occupied by the string 100 can be reduced, leading to higher integration of the memory cell in the string 100.

Figure 34A:
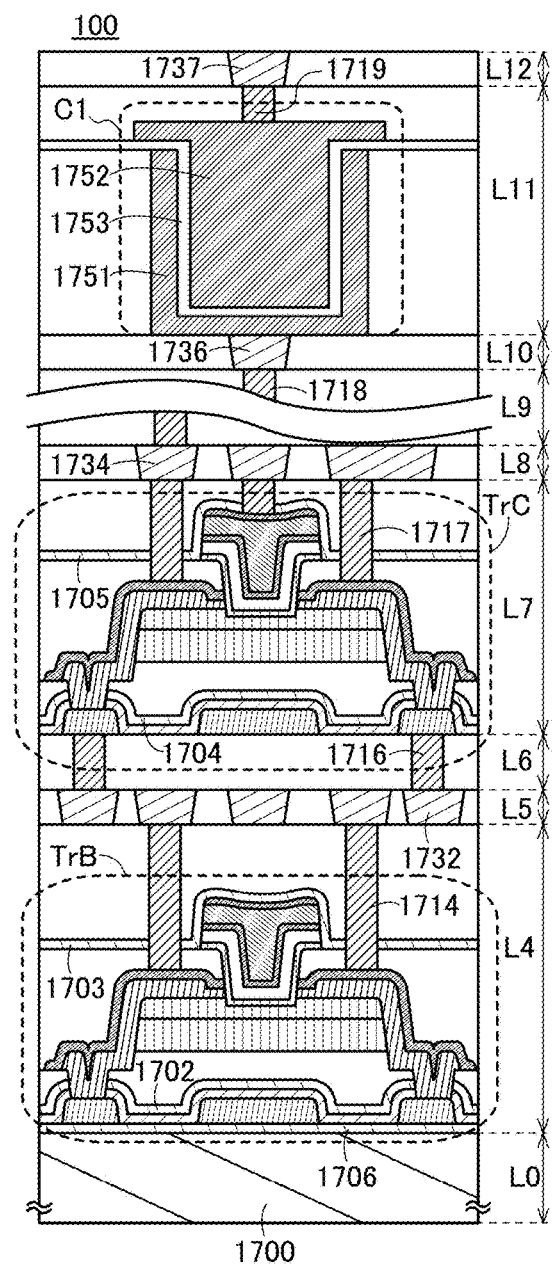
FIGS. 34A and 34B are cross-sectional views illustrating a structure example of a string.
Figure 34B:
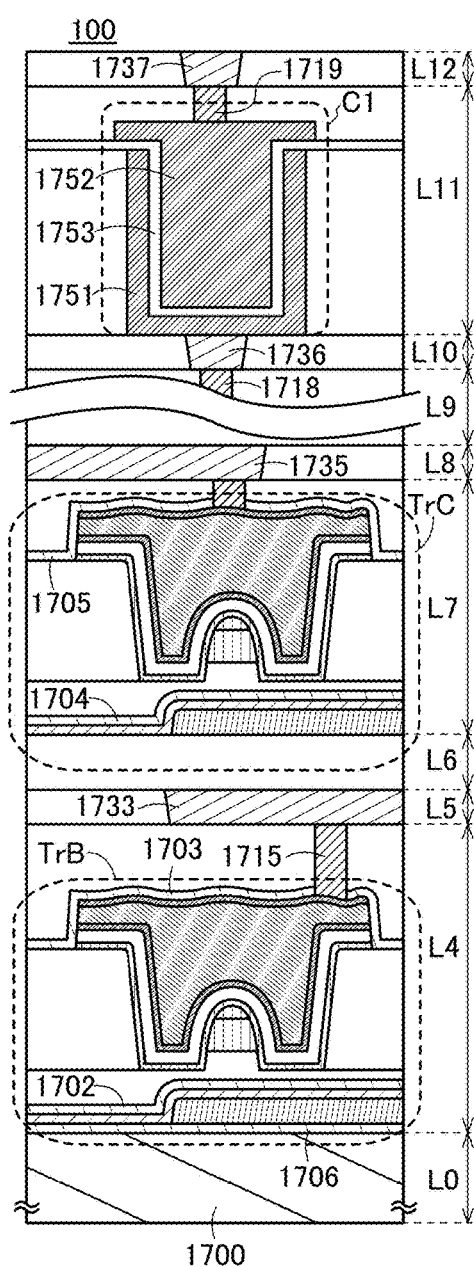

One embodiment of the present invention is not limited to the structure example in FIGS. 30A and 30B, and the structure example of the string 100 illustrated in FIGS. 34A and 34B in which OS transistors are used as all the transistors included in the strings 101 to 105 may be employed. In the string 100 illustrated in FIGS. 34A and 34B, the transistor TrB is formed over the substrate 1700 without forming the transistor TrA. In that case, a glass substrate is preferably used as the substrate 1700.

Figure 35A:
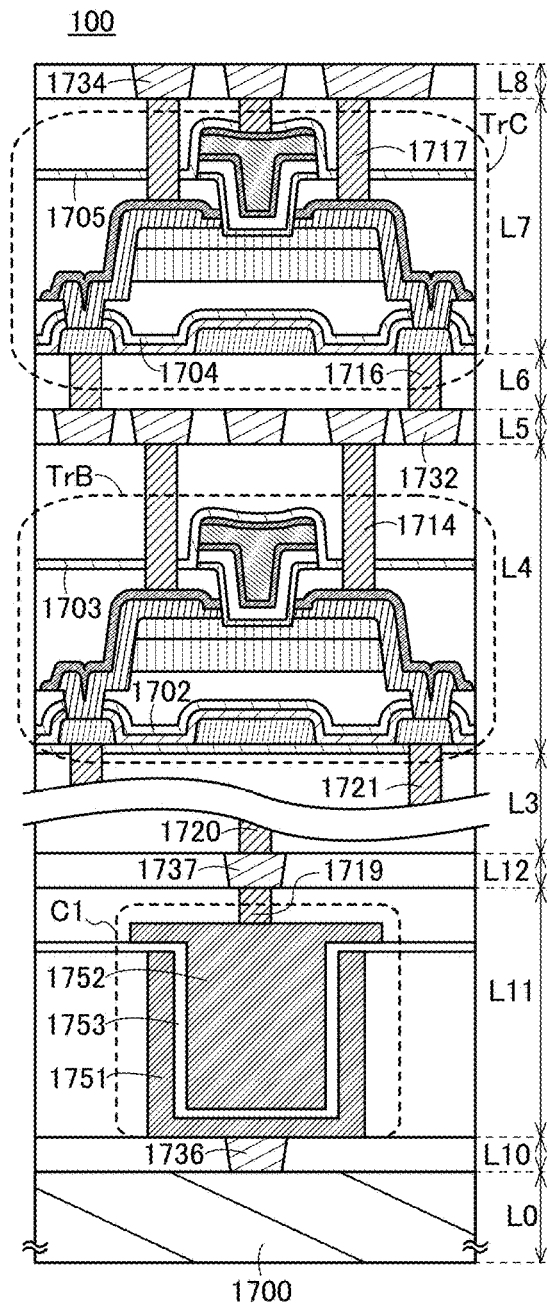
FIGS. 35A and 35B are cross-sectional views illustrating a structure example of a string.
Figure 35B:
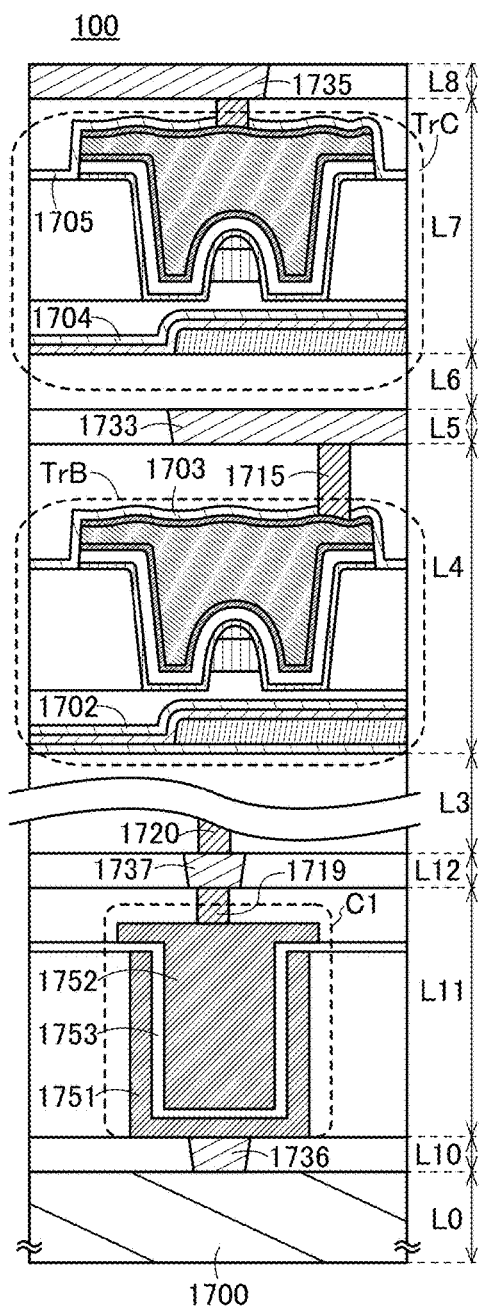

One embodiment of the present invention is not limited to the structure example in FIGS. 30A and 30B, and a layer in which the capacitor C1 is formed is not limited to the layer L11 and the capacitor C1 may be formed in a layer between the transistors TrB and TrC or a layer between the transistors TrA and TrB. For example, the structure of the string 100 illustrated in FIGS. 35A and 35B may be employed. In FIGS. 35A and 35B, the capacitor C1 of the string 100 in FIGS. 34A and 34B is provided between the substrate 1700 and the transistor TrB. Although the capacitor C1 in FIGS. 30A and 30B is a trench capacitor, in the case where the capacitor C1 is a planar capacitor, the capacitor C1 can be formed in the same layer as the transistor TrB or TrC (not illustrated).

Note that in the case where the strings 100 to 106 described in Embodiment 1 have the structure of FIGS. 30A and 30B, the number of transistors (TrA, TrB, and TrC) and the number of capacitors (C1) are sometimes different from those in FIGS. 30A and 30B. In that case, the structure of FIGS. 30A and 30B may be changed as appropriate; for example, the numbers of the layers L4, L7, and L11 are increased or decreased, or an element is additionally provided in a layer.

Structure Example 2 of Stack of Elements

Figure 31A:
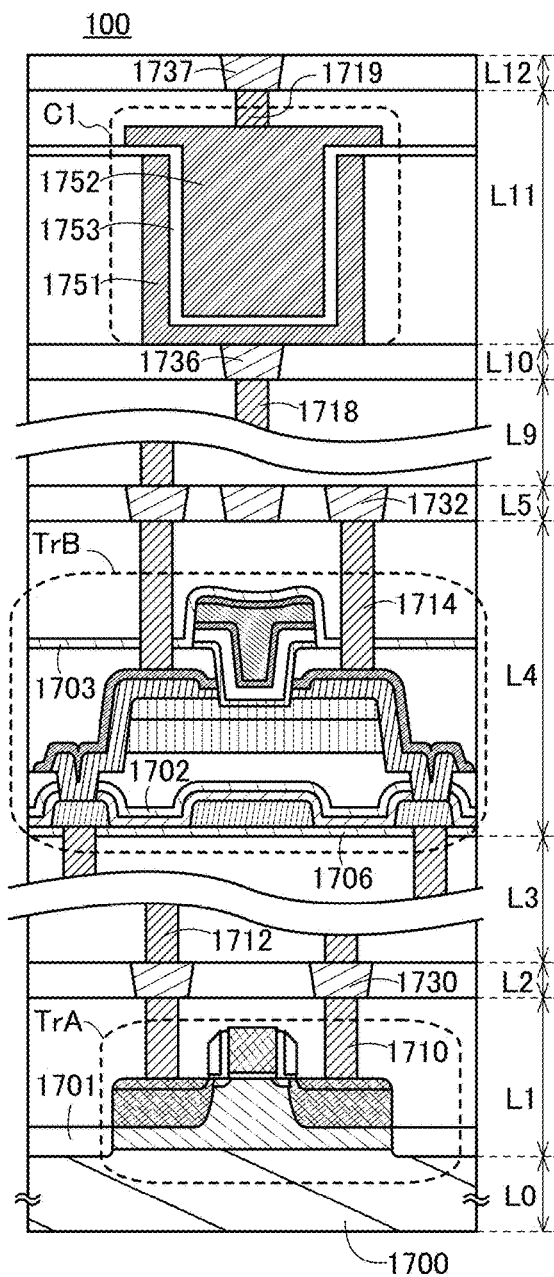
FIGS. 31A and 31B are cross-sectional views illustrating a structure example of a string.
Figure 31B:
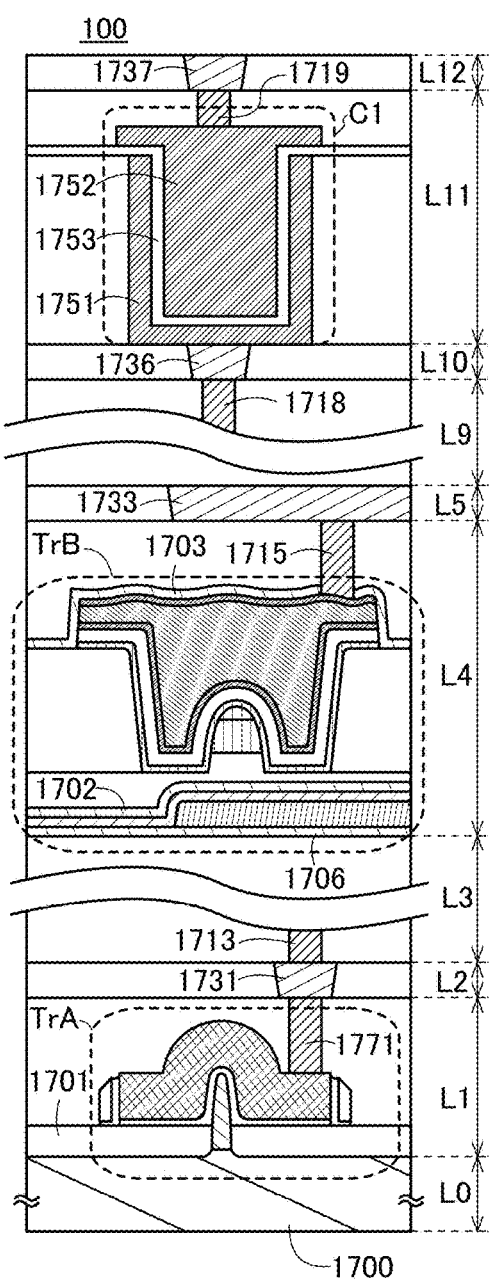

All the OS transistors in the string 100 illustrated in FIGS. 30A and 30B may be formed in the same layer. An example in that case is illustrated in FIGS. 31A and 31B. As in FIGS. 30A and 30B, FIG. 31A is a cross-sectional view of a transistor included in the string 100 in the channel length direction, and FIG. 31B is a cross-sectional view of a transistor included in the string 100 in the channel width direction.

The cross-sectional views of FIGS. 31A and 31B are different from those of FIGS. 30A and 30B in that the layers L6 to L8 are omitted and the layer L9 is formed on the layer L5. For other details in FIGS. 31A and 31B, the description of FIGS. 30A and 30B is referred to.

In the case where OS transistors are used as the transistors WOS[1], WOS[2], ROS[1], ROS[2], and SW included in the strings 101 to 104 in Embodiment 1, the transistors WOS[1], WOS[2], ROS[1], ROS[2], and SW are preferably formed in the layer L4.

In the case where a Si transistor is used as the transistor SW in the strings 101 to 104 described in Embodiment 1, the transistor SW is preferably formed in the layer L1.

In the case where OS transistors are used as the transistors WOS[1] to WOS[m], ROS[1] to ROS[m], and SW included in the string 105 in Embodiment 1, the transistors WOS[1] to WOS[m], ROS[1] to ROS[m], and SW are preferably formed in the layer L4.

In the case where OS transistors are used as the transistors WOS[1] to WOS[m] and ROS[1] to ROS[m] included in the string 106 in Embodiment 1, the transistors WOS[1] to WOS[m] and ROS[1] to ROS[m] are preferably formed in the layer L4. The transistor SW included in the string 106 is preferably formed in the layer L1.

The capacitors C[1] and C[2] included in the strings 101 to 104 in Embodiment 1 are preferably formed as the capacitor C1 in the layer L11.

The capacitors C[1] to C[m] included in the string 105 or 106 in Embodiment 1 are preferably formed as the capacitor C1 in the layer L11.

In the case where a driver circuit around the string 100 is formed using an OS transistor, the OS transistor may be formed in the layer L4.

In the case where a driver circuit around the string 100 is formed using a Si transistor, the Si transistor may be formed in the layer L1.

With the structure illustrated in FIGS. 31A and 31B, the manufacturing process of the string 100 can be simplified.

One embodiment of the present invention is not limited to the structure example in FIGS. 31A and 31B. OS transistors may be used as all the transistors included in the strings 101 to 105 and a structure example of the string 100 illustrated in FIGS. 36A and 36B may be employed. In the string 100 illustrated in FIGS. 36A and 36B, the transistor TrB is formed over the substrate 1700 without forming the transistor TrA. In that case, a glass substrate is preferably used as the substrate 1700.

Figure 36A:
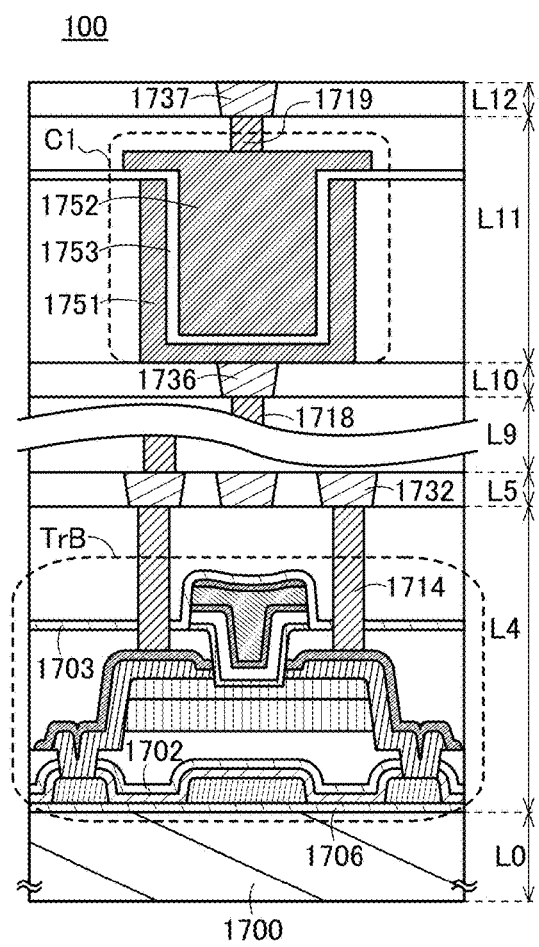
FIGS. 36A and 36B are cross-sectional views illustrating a structure example of a string.
Figure 36B:
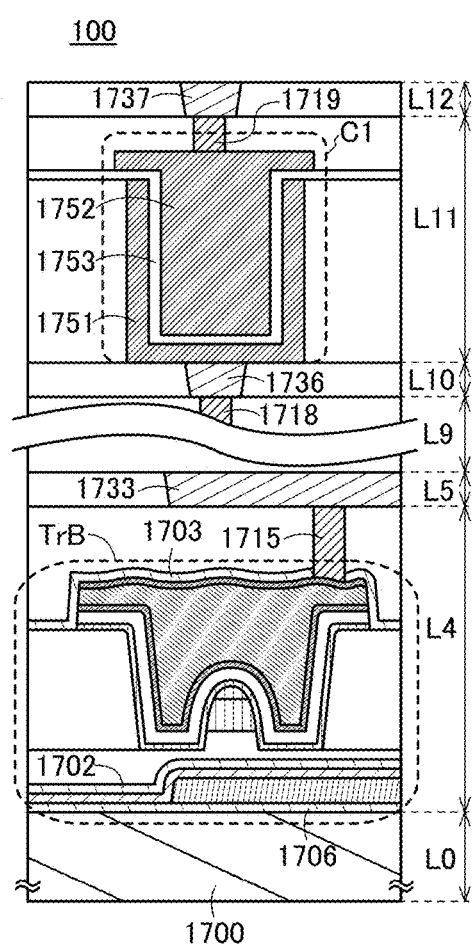
Figure 37A:
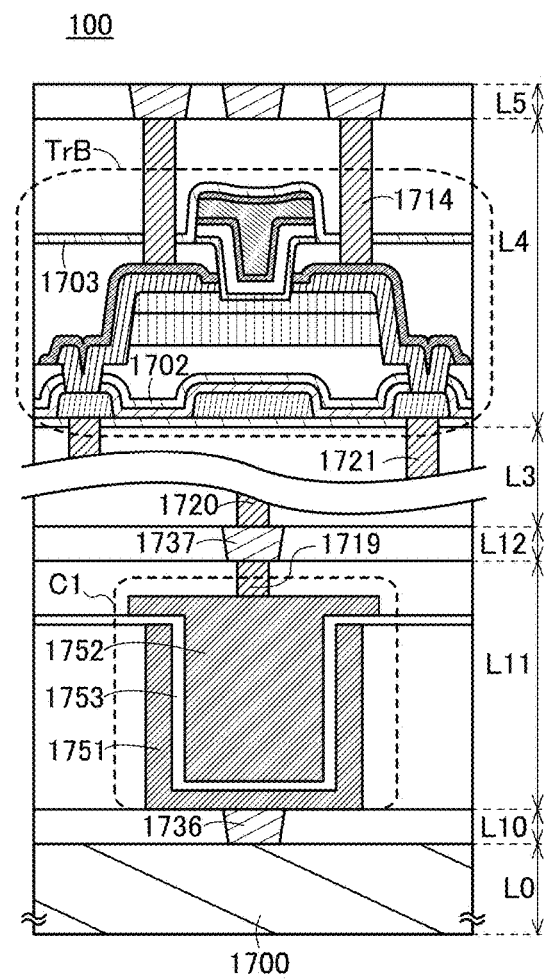
FIGS. 37A and 37B are cross-sectional views illustrating a structure example of a string.
Figure 37B:
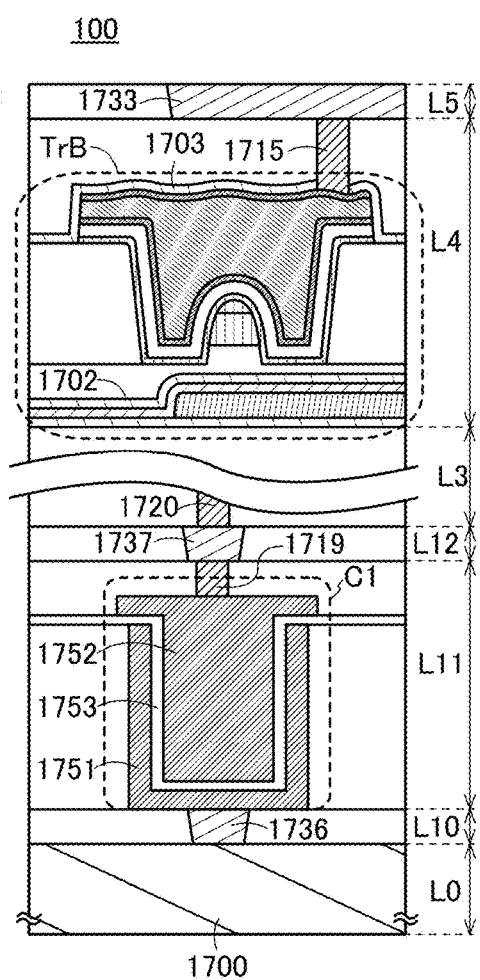

One embodiment of the present invention is not limited to the structure example in FIGS. 31A and 31B, and a layer in which the capacitor C1 is formed is not limited to the layer L11 and the capacitor C1 may be formed in a layer between the transistors TrA and TrB. For example, the structure of the string 100 illustrated in FIGS. 37A and 37B may be employed. In FIGS. 37A and 37B, the capacitor C1 of the string 100 in FIGS. 36A and 36B is provided between the substrate 1700 and the transistor TrB. Although the capacitor C1 in FIGS. 31A and 31B is a trench capacitor, in the case where the capacitor C1 is a planar capacitor, the capacitor C1 can be formed in the same layer as the transistor TrB or TrC (not illustrated).

Note that in the case where the strings 101 to 106 described in Embodiment 1 have the structure of FIGS. 31A and 31B, the number of transistors (TrA, TrB, and TrC) and the number of capacitors (C1) are sometimes different from those in FIGS. 31A and 31B. In that case, the structure of FIGS. 31A and 31B may be changed as appropriate; for example, the numbers of the layers L4 and L11 are increased or decreased, or an element is additionally provided in a layer.

Note that this embodiment can be combined with any of the other embodiments in this specification as appropriate.

Embodiment 8

Described in this embodiment are structures of an oxide semiconductor film capable of being used for the OS transistors described in the above embodiments.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 38A:
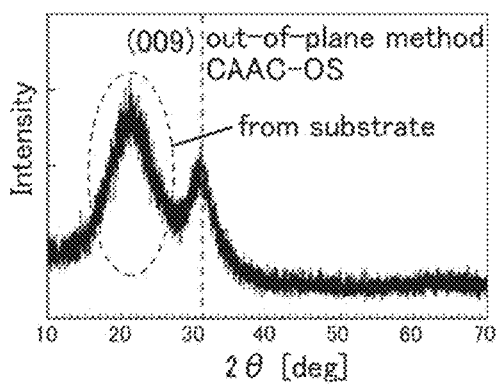
FIGS. 38A to 38E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 38A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 38B:
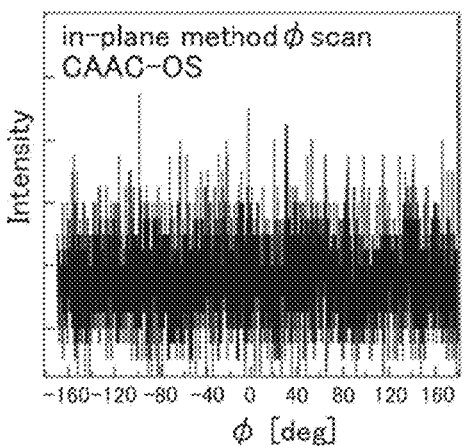
Figure 38C:
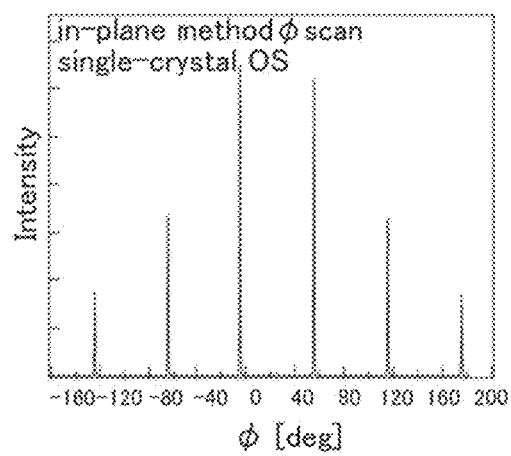

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with 2θ fixed at around 56° and with the sample rotated using a normal vector to the sample surface as an axis (φ axis), as shown in FIG. 38B, a peak is not clearly observed. In contrast, in the case where single crystal $InGaZnO_4$ is subjected to φ scan with 2θ fixed at around 56°, as shown in FIG. 38C, six peaks which are derived from crystal planes equivalent to the (110) plane are observed. Accordingly, the structural analysis using XRD shows that the directions of a-axes and b-axes are irregularly oriented in the CAAC-OS.

Figure 38D:
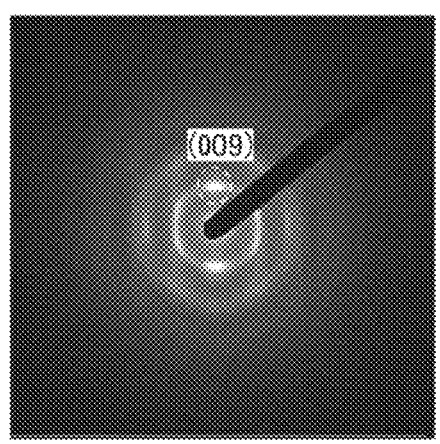
Figure 38E:
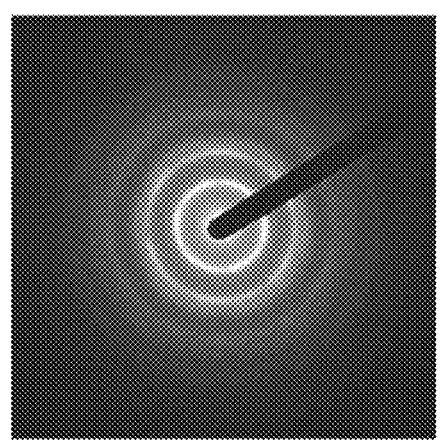

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 38D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 38E shows a diffraction pattern obtained in such a manner that an electron beam with a probe diameter of 300 nm is incident on the same sample in a direction perpendicular to the sample surface. As shown in FIG. 38E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 38E is considered to be derived from the (010) plane, the (100) plane, and the like of the $InGaZnO_4$ crystal. The second ring in FIG. 38E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 39A:
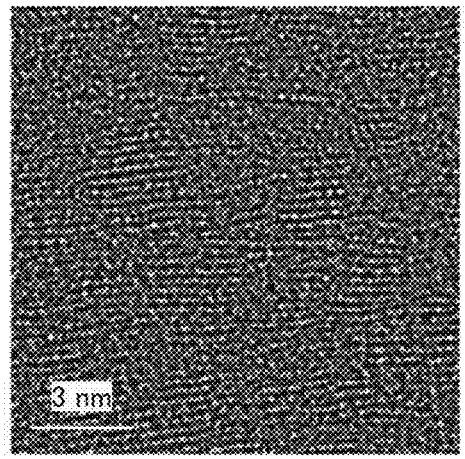
FIGS. 39A to 39E show a cross-sectional TEM image and plan-view TEM images of a CAAC-OS and images obtained through analysis thereof.

FIG. 39A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 39A shows pellets in which metal atoms are arranged in a layered manner. FIG. 39A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 39B:
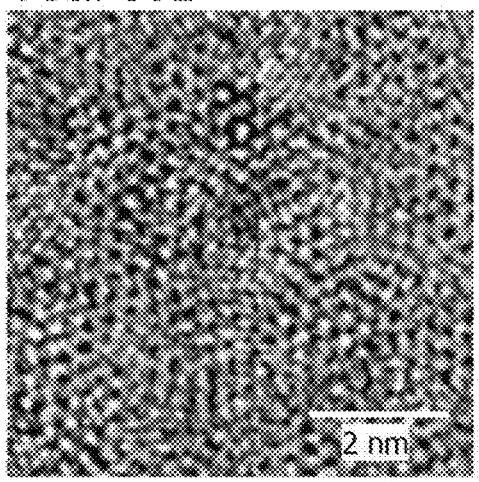
Figure 39C:
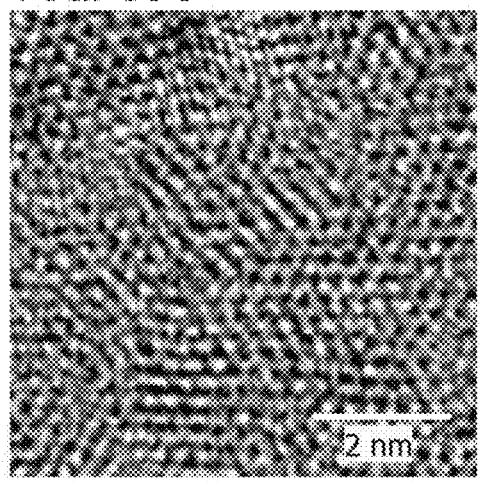
Figure 39D:
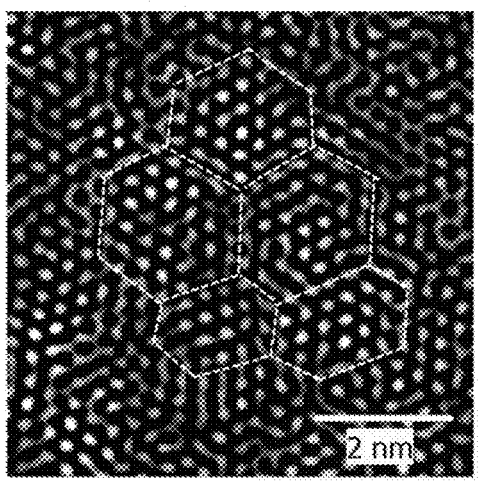
Figure 39E:
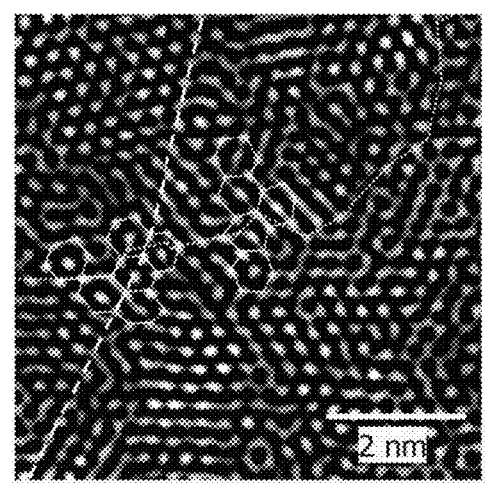

FIGS. 39B and 39C show Cs-corrected high-resolution TEM images of a plane of the CAAC-OS observed from a direction substantially perpendicular to the sample surface. FIGS. 39D and 39E are images obtained through image processing of FIGS. 39B and 39C. The method of image processing is as follows. The image in FIG. 39B is subjected to fast Fourier transform (FFT), so that an FFT image is obtained. Then, mask processing is performed such that a range of from $2.8^{-1}$ to $5.0$ $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 39D, a portion where a lattice arrangement is broken is shown by a dashed lines. A region surrounded by a dashed line is one pellet. The portion shown by the dashed line is a junction of pellets. The dashed line draws a hexagon, which means that the pellet has a hexagonal shape. Note that the shape of the pellet is not always a regular hexagon but is a non-regular hexagon in many cases.

In FIG. 39E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. For example, impurities contained in the oxide semiconductor might serve as carrier traps or carrier generation sources. For example, oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density. Specifically, an oxide semiconductor with a carrier density of lower than $8 \times 10^{11}$ $cm^{-3}$, preferably lower than $1 \times 10^{11}$ $cm^{-3}$, further preferably lower than $1 \times 10^{10}$ $cm^{-3}$, and higher than or equal to $1 \times 10^{-9}$ $cm^{-3}$ can be used. A CAAC-OS has a low impurity concentration and a low density of defect states. Thus, the CAAC-OS can be referred to as an oxide semiconductor having stable characteristics.

<Nc-OS>

Next, an nc-OS is described.

Analysis of an nc-OS by XRD is described. When the structure of an nc-OS is analyzed by an out-of-plane method, for example, a peak indicating orientation does not appear. That is, a crystal of an nc-OS does not have orientation.

Figure 40A:
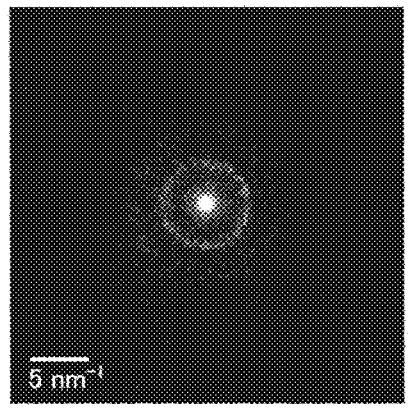
FIGS. 40A to 40D show electron diffraction patterns and a cross-sectional TEM image of an nc-OS.
Figure 40B:
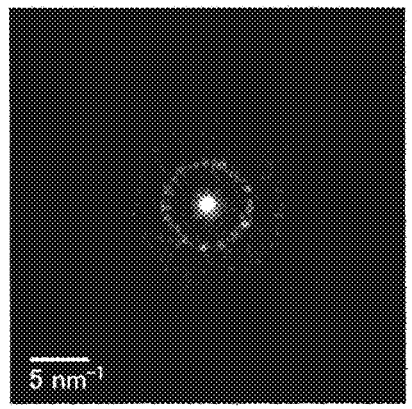

For example, when an electron beam with a probe diameter of 50 nm is incident on a 34-nm-thick region of a thinned nc-OS including an InGaZnO$_4$ crystal in a direction parallel to the formation surface, a ring-shaped diffraction pattern (nanobeam electron diffraction pattern) shown in FIG. 40A is observed. FIG. 40B shows a diffraction pattern obtained when an electron beam with a probe diameter of 1 nm is incident on the same sample. As shown in FIG. 40B, a plurality of spots are observed in a ring-like region. In other words, ordering in an nc-OS is not observed with an electron beam with a probe diameter of 50 nm but is observed with an electron beam with a probe diameter of 1 nm.

Figure 40C:
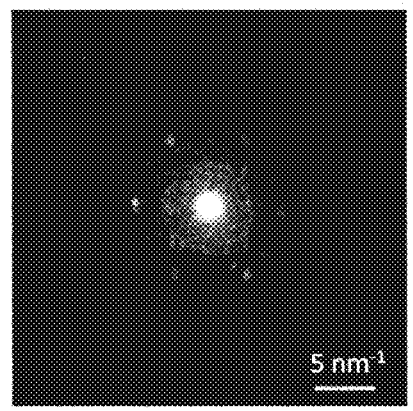

Furthermore, an electron diffraction pattern in which spots are arranged in an approximately regular hexagonal shape is observed in some cases as shown in FIG. 40C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 40D:
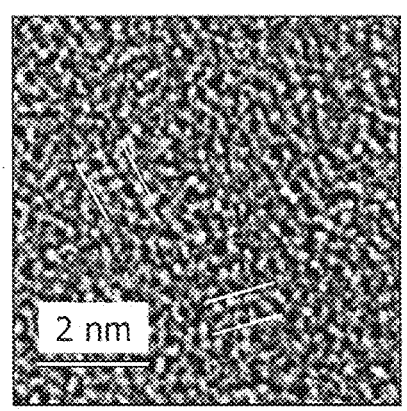

FIG. 40D shows a Cs-corrected high-resolution TEM image of a cross section of an nc-OS observed from the direction substantially parallel to the formation surface. In a high-resolution TEM image, an nc-OS has a region in which a crystal part is observed, such as a part indicated by additional lines in FIG. 40D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS might be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity than an amorphous oxide semiconductor. Thus, the nc-OS has a lower density of defect states than the a-like OS and the amorphous oxide semiconductor. Note that there is no regularity of crystal orientation between different pellets in the nc-OS; thus, the nc-OS has a higher density of defect states than the CAAC-OS.

<A-Like OS>

An a-like OS is an oxide semiconductor having a structure between the nc-OS and the amorphous oxide semiconductor.

Figure 41A:
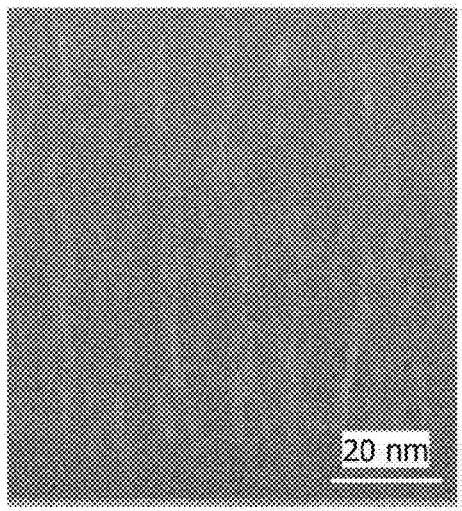
FIGS. 41A and 41B are cross-sectional TEM images of an a-like OS.
Figure 41B:
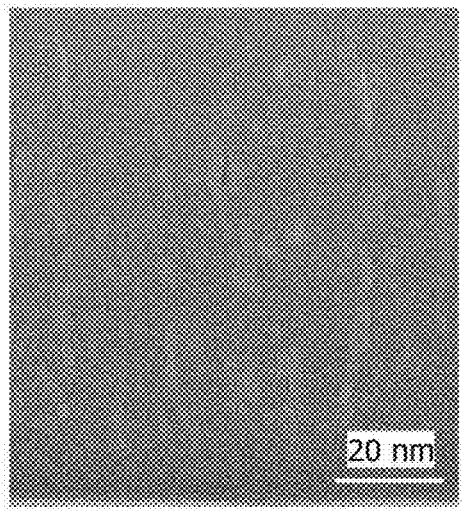

FIGS. 41A and 41B are high-resolution cross-sectional TEM images of an a-like OS. FIG. 41A is the high-resolution cross-sectional TEM image of the a-like OS at the start of electron irradiation. FIG. 41B is the high-resolution cross-sectional TEM image of a-like OS after electron (e$^-$) irradiation at $4.3 \times 10^8$ e$^-$/nm$^2$. FIGS. 41A and 41B show that stripe-like bright regions extending vertically are observed in the a-like OS from the start of electron irradiation. It can be also found that the shape of the bright region changes after electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

Note that it is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as a d value). The value is calculated to be 0.29 nm from crystal structural analysis. Accordingly, a portion where the spacing between lattice fringes is greater than or equal to 0.28 nm and less than or equal to 0.30 nm is regarded as a crystal part of InGaZnO$_4$ in the following description. Each of lattice fringes corresponds to the a-b plane of the InGaZnO$_4$ crystal.

Figure 42:
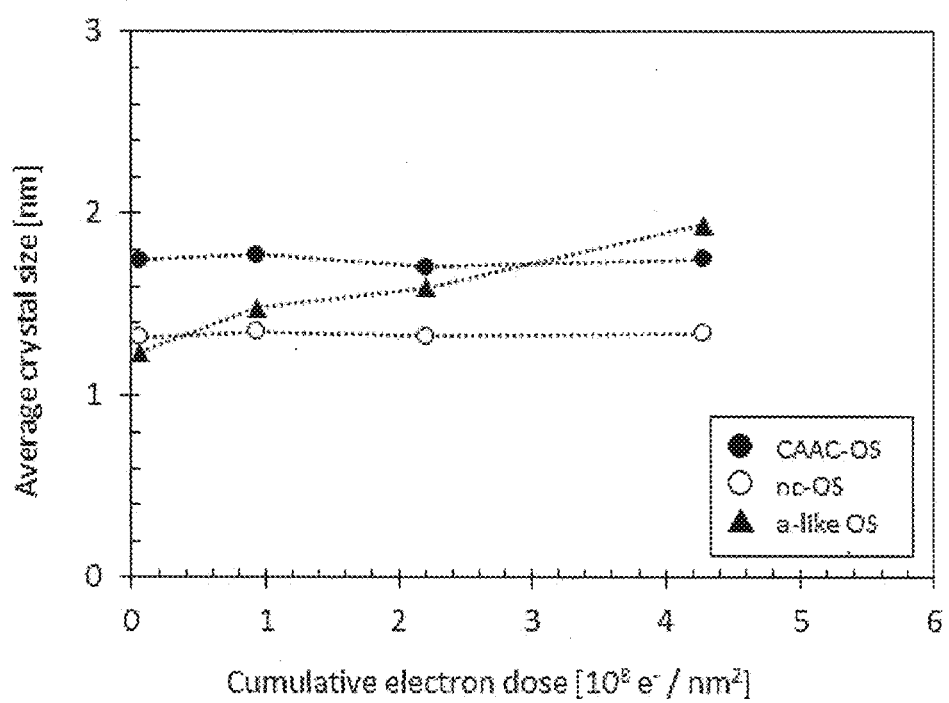
FIG. 42 shows a change of crystal parts of an In—Ga—Zn oxide owing to electron irradiation.

FIG. 42 shows a change in the average size of crystal parts (at 22 to 30 points) in each sample. Note that the crystal part size corresponds to the length of the lattice fringe, FIG. 42 indicates that the crystal part size in the a-like OS increases with an increase in the cumulative electron dose in obtaining TEM images, for example. As shown in FIG. 42, a crystal part of approximately 1.2 nm (also referred to as an initial nucleus) at the start of TEM observation grows to a size of approximately 1.9 nm at a cumulative electron (e$^-$) dose of $4.2 \times 10^8$ e$^-$/nm$^2$. In contrast, the crystal part sizes in the nc-OS and the CAAC-OS show little change from the start of electron irradiation to a cumulative electron dose of $4.2 \times 10^8$ e$^-$/nm$^2$. As shown in FIG. 42, the crystal part sizes in the nc-OS and the CAAC-OS are approximately 1.3 nm and approximately 1.8 nm, respectively, regardless of the cumulative electron dose. For electron beam irradiation and TEM observation, a Hitachi H-9000NAR transmission electron microscope was used. The conditions of electron beam irradiation were as follows: accelerating voltage was 300 kV; current density was $6.7 \times 10^5$ e$^-$/(nm$^2$·s); and the diameter of an irradiation region was 230 nm.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example.

Note that this embodiment can be combined with any of the other embodiments in this specification as appropriate.

Example 1

In this example, measurement results and calculation results of characteristics of an OS transistor will be described.

Figure 43A:
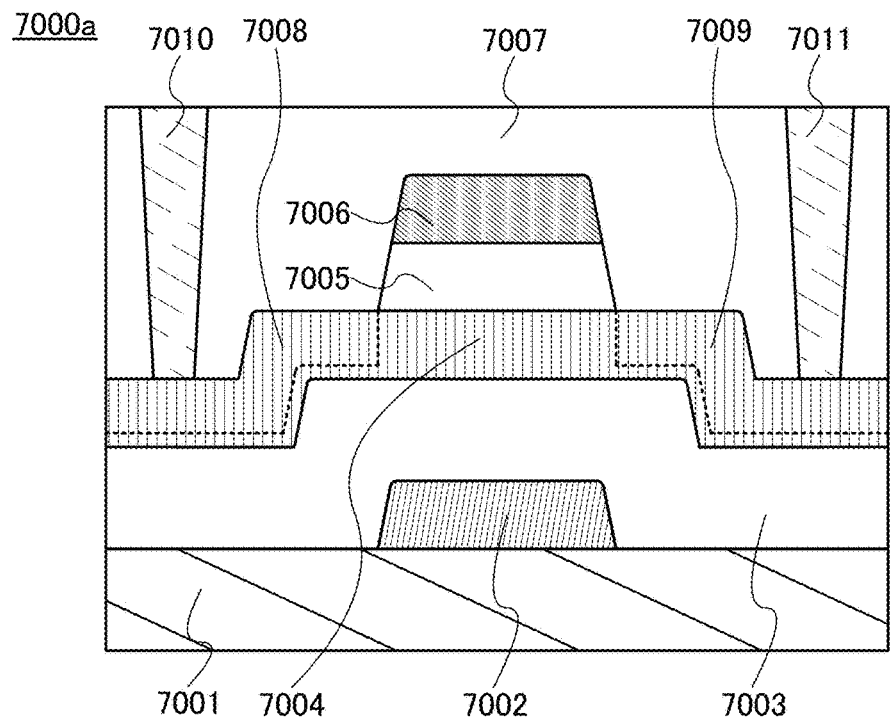
FIGS. 43A and 43B are cross-sectional views showing structures of transistors of Example 1.

FIG. 43A is a cross-sectional view of the transistor 7000a in a channel length direction. The transistor 7000a includes a glass substrate 7001, a conductive film 7002 over the glass substrate 7001, an insulating film 7003 formed to cover the conductive film 7002, a metal oxide 7004 over the insulating film 7003, an insulating film 7005 over the metal oxide 7004, a conductive film 7006 over the insulating film 7005, and an insulating film 7007 over the oxide 7004 and the conductive film 7006. The metal oxide 7004 includes regions 7008 and 7009 where resistance is reduced in regions which do not overlap with the conductive film 7006. An opening reaching the region 7008 and an opening reaching the region 7009 are provided in the insulating film 7007, and the conductive films 7010 and 7011 are formed in the openings.

The conductive film 7006 functions as a first gate electrode. The conductive film 7002 functions as a second gate electrode. The insulating film 7005 functions as a first gate insulating film. The insulating film 7003 functions as a second gate insulating film and a base insulating film. The region 7008 functions as one of a source region and a drain region. The region 7009 functions as the other of the source region and the drain region. The conductive film 7010 functions as one of a source electrode and a drain electrode. The conductive film 7011 functions as the other of the source electrode and the drain electrode. The insulating film 7007 functions as a protective insulating film.

The transistor 7000a includes the first gate electrode and the second gate electrode. The structure of the transistor including two gate electrodes is referred to as a dual-gate structure in some cases.

Figure 43B:
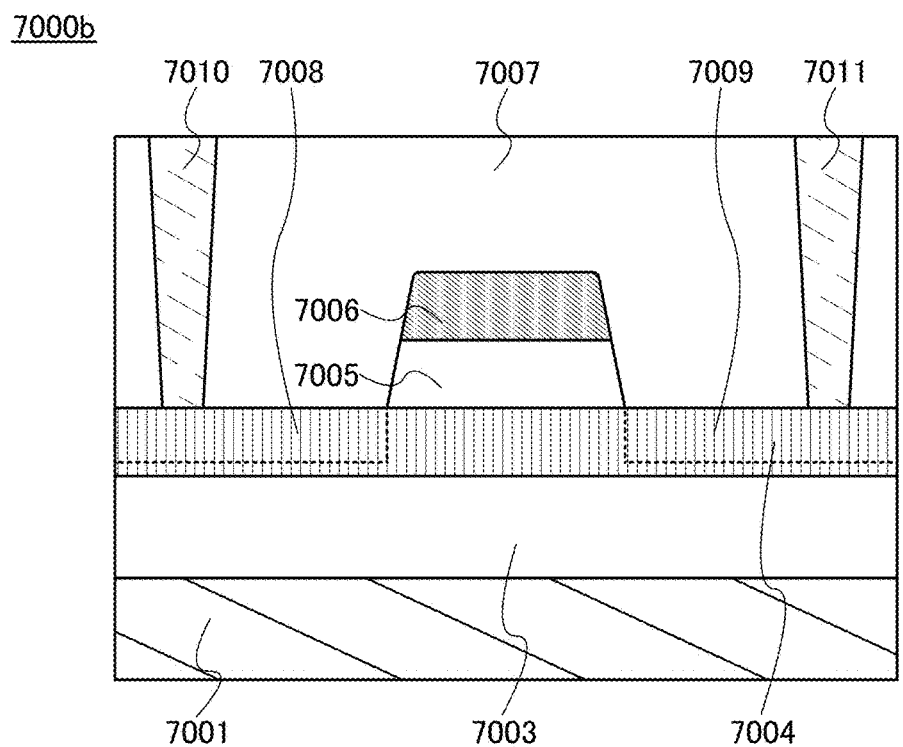

FIG. 43B is a cross-sectional view of a transistor 7000b in the channel length direction. The transistor 7000b has the structure of the transistor 7000a in which the conductive film 7002 functioning as a second gate electrode is omitted. The insulating film 7003 in the transistor 7000b functions as a base insulating film.

The transistor 7000b includes a first gate electrode but does not include a second gate electrode. The structure of the transistor including one gate electrode is referred to as a single-gate structure in some cases.

Next, a method for fabricating the transistor 7000a will be described. A stacked layer film of a 10-nm-thick titanium and a 100-nm-thick copper was formed over the glass substrate 7001 and processed to form the conductive film 7002. Then, the insulating film 7003 with an equivalent oxide thickness (EOT) of 210 nm was formed. Next, a 30-nm-thick metal oxide 7004 was formed by a direct current (DC) sputtering method. Note that the metal oxide 7004 was a CAAC-OS film. Then, an insulating film with an EOT of 100 nm was formed, and the insulating film was processed into the insulating film 7005. Then, a conductive film was formed and processed to the conductive film 7006. Then, resistance of the regions 7008 and 7009 in the metal oxide 7004 was reduced by argon plasma treatment. Next, the insulating film 7007 was formed. After that, an opening reaching the region 7008 was formed in the insulating film 7007, and a stacked-layer film of a 10-nm-thick titanium and a 100-nm-thick copper was formed as the conductive film 7010 in the opening. In addition, an opening reaching the region 7009 was formed in the insulating film 7007, and a stacked-layer film of a 10-nm-thick titanium and a 100-nm-thick copper was formed as the conductive film 7011 in the opening.

In forming the transistor 7000b, the insulating film 7003 with an EOT of 160 nm was formed over the glass substrate 7001 without forming the conductive film 7002. The following steps are similar to those of the transistor 7000a.

The transistors 7000a and 7000b each have a channel length of 6 μm and a channel width of 50 μm.

The sum of the capacitance of the insulating film 7005 and that of the insulating film 7003 in the transistor 7000a is 1.63 times the capacitance of the insulating film 7005 in the transistor 7000b.

Figure 44A:
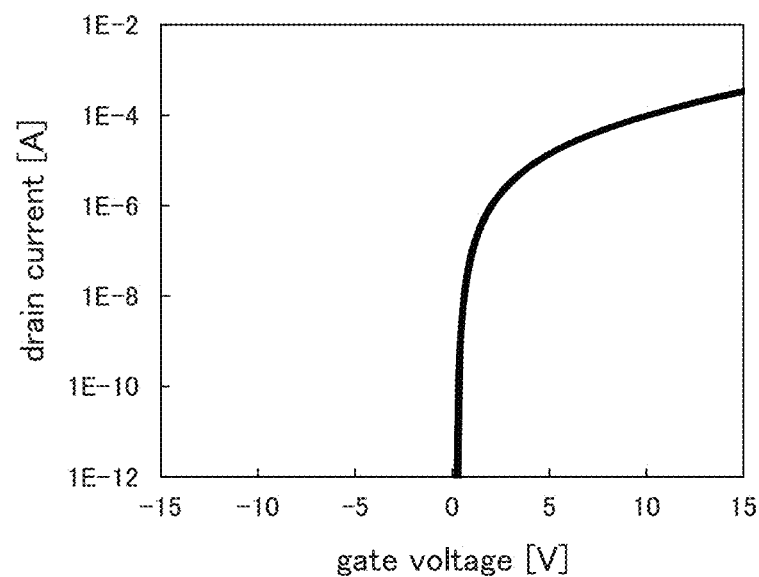
FIGS. 44A and 44B show drain current-gate voltage characteristics.
Figure 44B:
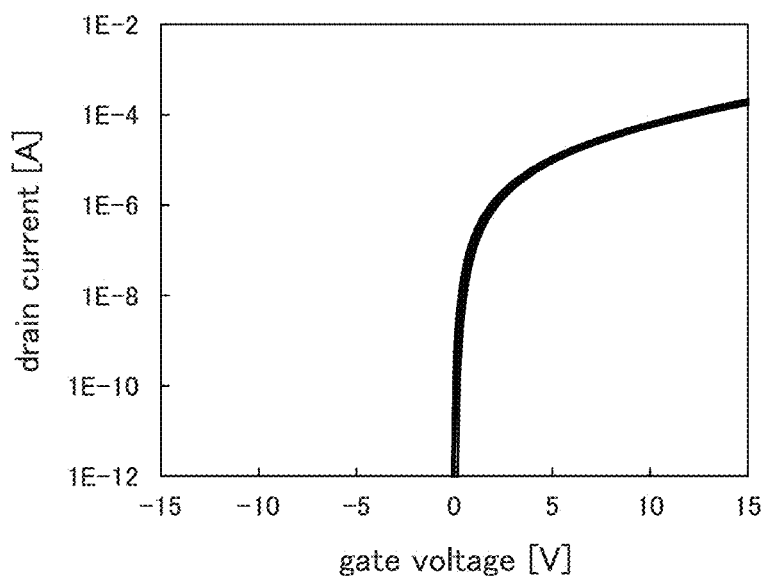

In this example, 20 transistors 7000a and 20 transistors 7000b were fabricated and drain current-gate voltage (Id-Vg) characteristics thereof were measured when the drain voltage was 20 V. FIG. 44A shows Id-Vg characteristics of the 20 transistors 7000a. FIG. 44B shows Id-Vg characteristics of the 20 transistors 7000b. In each of the transistors 7000a and the transistors 7000b, variation in the Id-Vg characteristics among the transistors is extremely small. Furthermore, in the transistors 7000a, values lower than 1.0×10$^{-12}$ A are shown when the gate voltage is 0 V, which indicates that normally-off characteristics are achieved.

Figure 45:
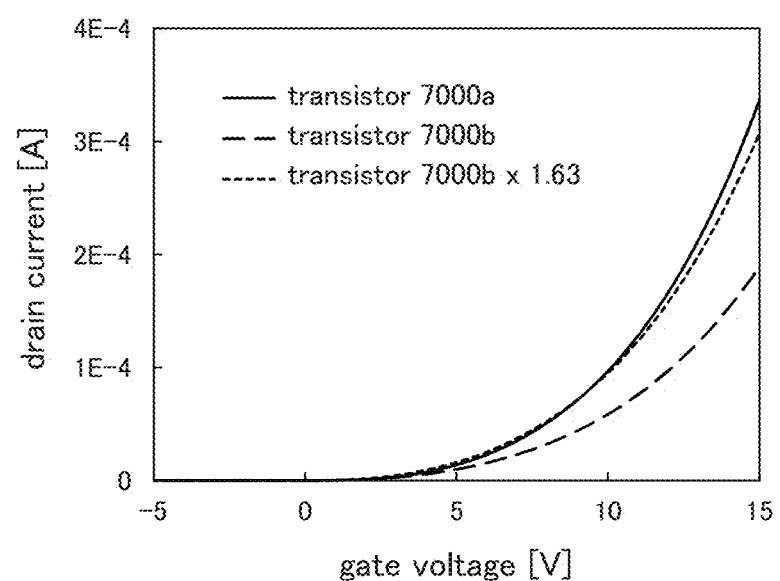
FIG. 45 shows drain current-gate voltage characteristics.

In FIG. 45, Id-Vg characteristics are shown in a linear scale. A solid line represents the average value of drain currents of the 20 transistors 7000a at each gate voltage; a dashed line represents the average value of drain currents of the 20 transistors 7000b at each gate voltage; and a dotted line represents a value which is 1.63 times the average value of drain currents of the 20 transistors 7000b at each gate voltage. Note that, as described above, the sum of the capacitance of the insulating film 7005 and that of the insulating film 7003 in the transistor 7000a is 1.63 times the capacitance of the insulating film 7005 in the transistor 7000b.

In the case where the gate voltage is 15 V, the average value of drain currents of the 20 transistors 7000a is 336 μA, and the average value of drain currents of the 20 transistors 7000b is 189 μA. That is, the average value of drain currents of the 20 transistors 7000a is 1.78 times the average value of drain currents of the 20 transistors 7000b, which indicates that drain current of the transistor 7000a is larger than the value assumed from the capacitance ratio between the gate insulating films (1.63 times the average value of drain current of 20 transistors 7000b).

Figure 46A:
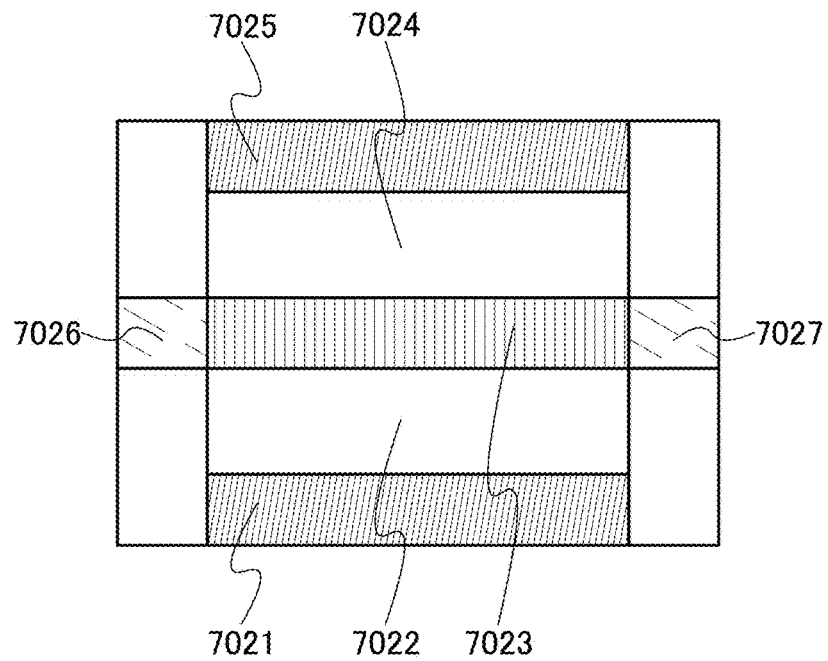
FIGS. 46A and 46B are schematic views of transistors which are assumed in calculations using a two-dimensional structure models.
Figure 46B:
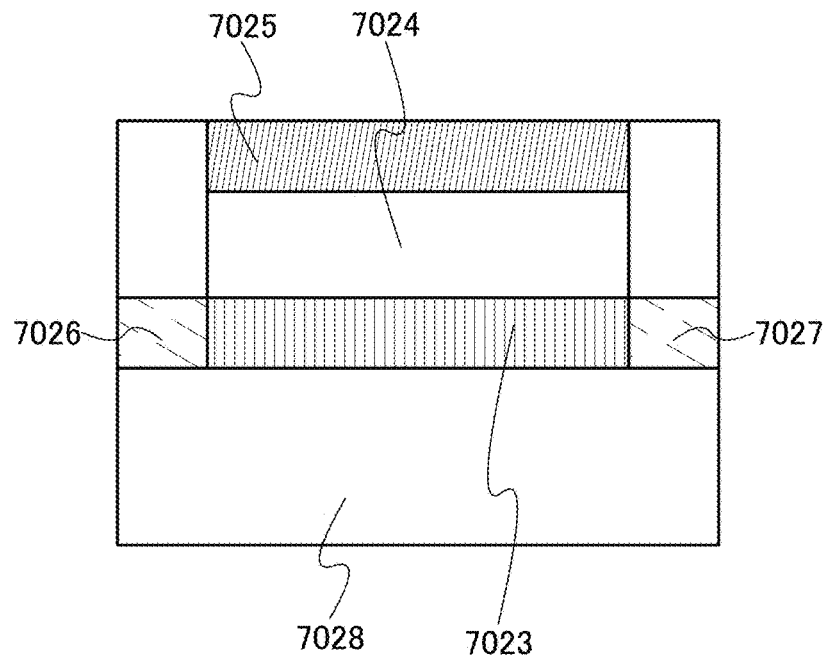

To examine the cause of the above phenomenon, calculations were performed using two-dimensional structure models shown in FIGS. 46A and 46B. A transistor 7020a having the structure illustrated in FIG. 46A includes a conductive film 7021, an insulating film 7022 over the conductive film 7021, a metal oxide 7023 over the insulating film 7022, an insulating film 7024 over the metal oxide 7023, a conductive film 7025 over the insulating film 7024, and conductive films 7026 and 7027 in contact with side surfaces of the metal oxide 7023.

The conductive film 7025 functions as a first gate electrode. The conductive film 7021 functions as a second gate electrode. The insulating film 7024 functions as a first gate insulating film. The insulating film 7022 functions as a second gate insulating film. The conductive film 7026 functions as one of a source electrode and a drain electrode. The conductive film 7027 functions as the other of the source electrode and the drain electrode.

That is, the transistor 7020a is a transistor having a dual-gate structure, which corresponds to the structure of the transistor 7000a.

The metal oxide 7023 is an oxide semiconductor.

A transistor 7020b having a structure illustrated in FIG. 46B includes an insulating film 7028, the metal oxide 7023 over the insulating film 7028, the insulating film 7024 over the metal oxide 7023, and the conductive film 7025 over the insulating film 7024. The conductive films 7026 and 7027 provided over the insulating film 7028 and in contact with the side surfaces of the metal oxide 7023 are also included. The insulating film 7028 functions as a base insulating film.

That is, the transistor 7020b is a transistor having a single-gate structure, which corresponds to the structure of the transistor 7000b.

In this example, a calculation on the assumption that there is a shallow trap level in the metal oxide 7023 and a calculation in consideration of an increase in electron mobility of the metal oxide 7023 due to self-generated heat of the transistor were performed. As calculation software, ATLAS manufactured by SILVACO, Inc. was used.

In the calculation in this example, the thickness of the insulating film 7022 was set equal to the thickness of the insulating film 7024 in the transistor 7020a. In both cases of the transistors 7020a and 7020b, a channel length was set to 5 μm and the thickness of the metal oxide 7023 was set to 50 nm.

In the transistor 7020b, the thickness of the insulating film 7028 was set to 1 μm. In the calculation in consideration of heat generation, the insulating film 7028 was provided under the conductive film 7021 included in the transistor 7020a so that the transistors 7020a and 7020b have the same size.

The following Formula 1 shows a formula of gradual channel approximation which represents the drain current in a linear region. In Formula 1, μ represents the mobility of a semiconductor, L represents the channel length, W represents the channel width, $V_g$ represents the gate voltage, $V_{th}$ represents the threshold voltage, $V_d$ represents the drain voltage, and $C_{GI}$ represents the GI capacitance per unit area.

[Formula 1]

$$I_d = \mu \frac{W}{L}\left[(V_g - V_{th})V_d - \frac{1}{2}V_d^2\right]C_{GI} \qquad (1)$$

As shown by Formula 1, the drain current in a linear region is proportional to the GI capacitance. That is, the drain current can be roughly calculated from the GI capacitance ratio. Here, the GI capacitance of the transistor 7020a represents the sum of the capacitance of the insulating film 7022 and the capacitance of the insulating film 7024, and the GI capacitance of the transistor 7020b represents the capacitance of the insulating film 7024. In this example, a parameter r shown in the following Formula 2 was introduced as an index denoting how much the drain current ratio of the transistor 7020a and the transistor 7020b follows the GI capacitance ratio of the transistor 7020a to the transistor 7020b.

[Formula 2]

$$r \equiv \frac{C_{GI,app}(DG)/C_{GI,app}(SG)}{C_{GI,str}(DG)/C_{GI,str}(SG)} \qquad (2)$$

$C_{GI,app}$ in Formula 2 represents the apparent GI capacitance per unit area and can be calculated from the following Formula 3. $C_{GI,str}$ represents the structural GI capacitance per unit area which can be obtained by the thicknesses of the insulating films 7022 and 7024. DG represents the transistor 7020a which is a transistor having a dual-gate structure, and SG represents the transistor 7020b which is a transistor having a single-gate structure.

[Formula 3]

$$C_{GI,app} \equiv \frac{I_d}{\mu \frac{W}{L}\left[(V_g - V_{th})V_d - \frac{1}{2}V_d^2\right]} \qquad (3)$$

In Formula 2, in the case where the drain current of the transistor 7020a follows the GI capacitance ratio, r is equal to 1, and in the case where the drain current of the transistor 7020a is larger than the value estimated from the GI capacitance ratio, r exceeds 1.

In the case where the parameter r was calculated, the gate voltage was set to 15 V and the drain voltage was set to 5 V.

Figure 47:
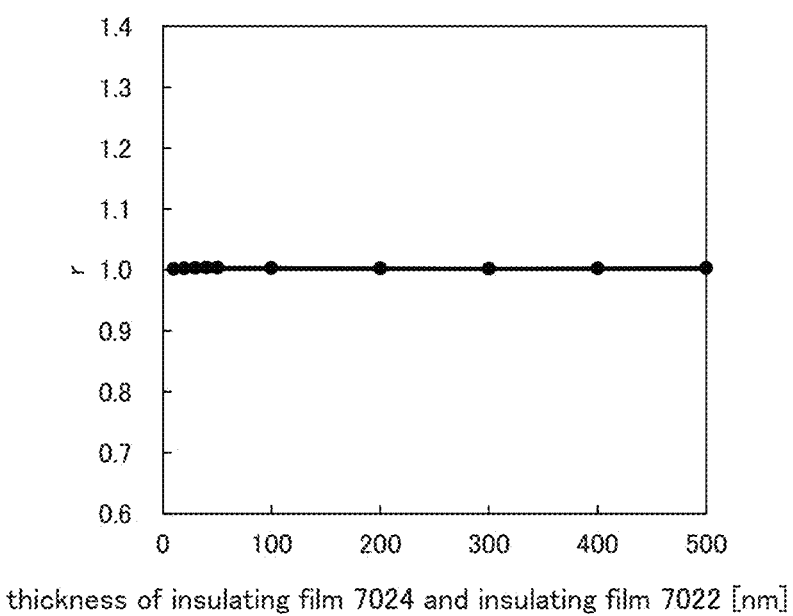
FIG. 47 shows the result of calculation according to Example 1.

FIG. 47 shows the relationship between the parameter r and the thickness of the insulating film 7024 (insulating film 7022) in the case where neither the shallow trap level in the metal oxide 7023 nor the increase in electron mobility of the metal oxide 7023 due to self-generated heat of the transistor is assumed. In this calculation condition, r is nearly 1.00 and the drain current of the transistor 7020a follows the GI capacitance ratio regardless of the thickness of the insulating film 7024 (insulating film 7022). That is, the fact that the drain current of the transistor 7000a is larger than the drain current of the transistor 7000b by more than the GI capacitance ratio as shown in FIG. 45 cannot be explained simply by the dual-gate structure of the transistor 7000a.

Figure 48:
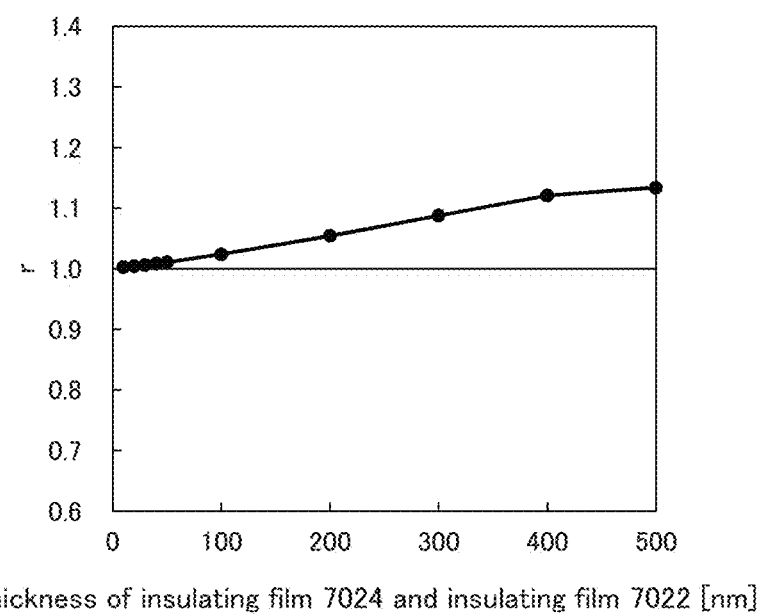
FIG. 48 shows the result of calculation according to Example 1.

FIG. 48 shows the relationship between the parameter r and the thickness of the insulating film 7024 (insulating film 7022) under the assumption that there is a shallow trap level in the metal oxide 7023. The drain current is small when electron traps are present. In this example, a calculation was performed under the assumption that electron traps have a tail-type distribution as shown in Formula 4. In Formula 4, E represents an energy level of an electron trap, $E_C$ represents the energy level of the conduction band bottom of the metal oxide 7023, $N_{TA}$ represents the volume density of the electron trap in the case where the energy level of the electron trap is $E_C$, and $W_{TA}$ represents the energy decay characteristics. In this example, calculation was performed assuming that $N_{TA}$ was $1.0 \times 10^{18}$ cm$^{-1}$, and $W_{TA}$ was 0.05 eV.

[Formula 4]

$$N_{tail}(E) = N_{TA} \exp\left(\frac{E - E_C}{W_{TA}}\right) \quad (4)$$

FIG. 48 shows that r is larger than 1.00 and the drain current of the transistor 7000a is larger than the drain current of the transistor 7000b by more than the GI capacitance. This result indicates that the rate of decrease in drain current due to a shallow trap level is reduced in the transistor having a dual-gate structure. Furthermore, r increases as the thickness of the insulating film 7024 gets smaller. That is, r increases as the thicknesses of the insulating films 7022 and 7024 get smaller. In the case where the thicknesses of the insulating films 7022 and 7024 are large, the GI capacitance is small and electrons are more likely to be trapped. Therefore, in the case where the thicknesses of the insulating films 7022 and 7024 are large, the effect of a dual-gate structure on reducing a decrease in drain current is larger than in the case where the thicknesses of the insulating films 7022 and 7024 are small.

Figure 49:
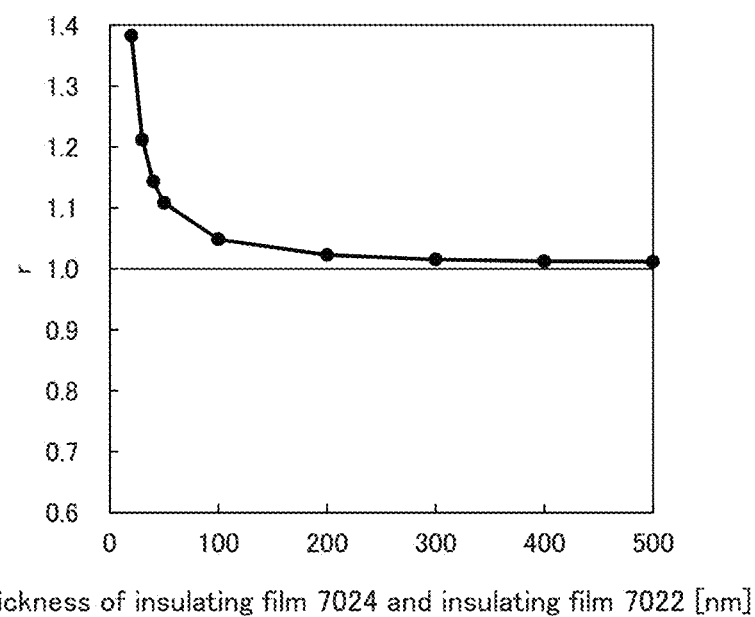
FIG. 49 shows the result of calculation according to Example 1.

FIG. 49 shows the relationship between the parameter r and the thickness of the insulating film 7024 (insulating film 7022) in the case where an increase in electron mobility of the metal oxide 7023 due to self-generated heat of the transistor is considered. Note that the thermal conductivity of the metal oxide 7023 was set to 0.014 W cm$^{-1}$ K$^{-1}$. According to the Joule's law, in the case where a large current flows in a transistor, the amount of self-generated heat of the transistor is increased and the electron mobility of the metal oxide 7023 is increased. In this example, the following Formula 5 was used as a model of an electron mobility of the metal oxide 7023. In Formula 5, T represents the absolute temperature and $\mu_{e,300}$ represents electron mobility in the case where the absolute temperature is 300 K.

[Formula 5]

$$\mu_e(T) = \mu_{e,300} \left(\frac{T}{300}\right)^{1.5} \quad (5)$$

FIG. 49 shows that r is larger than 1.00. That is, the electron mobility in the transistor 7020a is higher than that in the transistor 7020b. This indicates that the temperature of the transistor 7020a is higher than that of the transistor 7020b. This is because the amount of current of the transistor having a dual-gate structure is larger than that of the transistor having the single-gate structure even in the case where the electron mobility does not change depending on the temperature. In addition, r increases as the thickness of the insulating film 7024 decreases. That is, r increases as the thicknesses of the insulating films 7022 and 7024 decrease. This is because the GI capacitance and the joule heat are increased as the thicknesses of the insulating films 7022 and 7024 decrease.

(Notes on the Description of the Specification and the Like)

The following are notes on the description of structures in the above embodiments and the above example.

<Notes on One Embodiment of the Present Invention Described in Embodiments>

One embodiment of the present invention can be constituted by combining the structure described in an embodiment with any of the structures described in the other embodiments as appropriate. In addition, in the case where a plurality of structure examples are described in one embodiment, some of the structure examples can be combined as appropriate.

Note that what is described (or part thereof) in an embodiment can be applied to, combined with, or replaced with another content in the same embodiment and/or what is described (or part thereof) another embodiment or other embodiments.

Note that in each embodiment, a content described in the embodiment is a content described with reference to a variety of diagrams or a content described with text disclosed in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on Ordinal Numbers>

In this specification and the like, ordinal numbers such as "first," "second," and "third" are used in order to avoid confusion among components. Thus, the terms do not limit the number or order of components. In this specification and the like, a "first" component in one embodiment can be referred to as a "second" component in other embodiments or claims. Alternatively, in this specification and the like, a "first" component in one embodiment can be omitted in other embodiments or claims.

<Notes on the Description for Drawings>

Embodiments are described with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the description of the embodiments. Note that in the structures of the embodiments, the same portions or portions having similar functions are denoted by the same reference numerals in different drawings, and the description of such portions is not repeated.

In this specification and the like, the terms for explaining arrangement, such as "over" and "under", are used for convenience to describe the positional relationship between components with reference to drawings. The positional relationship between components is changed as appropriate in accordance with a direction in which each component is described. Thus, the positional relationship is not limited to that described with a term used in this specification and can be explained with another term as appropriate depending on the situation.

The term "over" or "under" does not necessarily mean that a component is placed directly on or directly below and directly in contact with another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent of each other. However, in an actual circuit and the like, such components are sometimes hard to classify functionally, and there is a case in which one circuit is associated with a plurality of functions or a case in which a plurality of circuits are associated with one function. Therefore, the segmentation of blocks in a block diagram is not limited by any of the components described in the specification and can be differently determined as appropriate depending on the situation.

In the drawings, the size, the layer thickness, or the region is determined arbitrarily for description convenience; therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

In drawings such as a top view (also referred to as a plan view or a layout view) and a perspective view, some of components might not be illustrated for clarity of the drawings.

In the drawings, the same components, components having similar functions, components formed using the same material, or components formed at the same time are denoted by the same reference numerals in some cases, and the description thereof is not repeated in some cases.

<Notes on Expressions that can be Rephrased>

In this specification and the like, the terms "one of a source and a drain" (or a first electrode or a first terminal) and "the other of the source and the drain" (or a second electrode or a second terminal) are used to describe the connection relationship of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In this specification and the like, the term such as "electrode" or "wiring" does not limit the function of a component. For example, an "electrode" is used as part of a "wiring" in some cases, and vice versa. Moreover, the term "electrode" or "wiring" can also mean a combination of a plurality of "electrodes" or "wirings" formed in an integrated manner.

In this specification and the like, voltage and potential can be replaced with each other. The voltage refers to a potential difference from a reference potential. When the reference potential is a ground potential, for example, a voltage can be replaced with a potential. The ground potential does not necessarily mean 0 V. Potentials are relative values, and a potential supplied to a wiring or the like is sometimes changed depending on the reference potential.

In this specification and the like, the terms "film," "layer," and the like can be interchanged with each other depending on circumstances or conditions. For example, the term "conductive layer" can be changed into the term "conductive film" in some cases. Moreover, the term "insulating film" can be changed into the term "insulating layer" in some cases, or can be replaced with a word not including the term "film" or "layer." For example, the term "conductive layer" or "conductive film" can be changed into the term "conductor" in some cases. Furthermore, for example, the term "insulating layer" or "insulating film" can be changed into the term "insulator" in some cases.

In this specification and the like, the terms "wiring," "signal line," "power supply line," and the like can be interchanged with each other depending on circumstances or conditions. For example, the term "wiring" can be changed into the term "signal line" in some cases. For example, the term "wiring" can be changed into the term such as "power source line" in some cases. The term such as "signal line" or "power source line" can be changed into the term "wiring" in some cases. The term such as "power source line" can be changed into the term such as "signal line" in some cases. The term such as "signal line" can be changed into the term such as "power source line" in some cases.

<Notes on Definitions of Terms>

The following are definitions of the terms mentioned in the above embodiments.

<<Semiconductor>>

In this specification, a "semiconductor" includes characteristics of an "insulator" in some cases when the conductivity is sufficiently low, for example. Furthermore, it is difficult to strictly distinguish a "semiconductor" and an "insulator" from each other in some cases because a border between the "semiconductor" and the "insulator" is not clear. Accordingly, a "semiconductor" in this specification can be called an "insulator" in some cases. Similarly, an "insulator" in this specification can be called a "semiconductor" in some cases.

Note that a "semiconductor" includes characteristics of a "conductor" in some cases when the conductivity is sufficiently high, for example. Furthermore, it is difficult to strictly distinguish a "semiconductor" and a "conductor" from each other in some cases because a border between the "semiconductor" and the "conductor" is not clear. Accordingly, a "semiconductor" in this specification can be called a "conductor" in some cases. Similarly, a "conductor" in this specification can be called a "semiconductor" in some cases.

An impurity in a semiconductor refers to, for example, elements other than the main components of a semiconductor layer. For example, an element with a concentration of lower than 0.1 atomic % is an impurity. When an impurity is contained, the density of states (DOS) may be formed in a semiconductor, the carrier mobility may be decreased, or the crystallinity may be decreased, for example. In the case where the semiconductor is an oxide semiconductor, examples of an impurity which changes the characteristics of the semiconductor include Group 1 elements, Group 2 elements, Group 13 elements, Group 14 elements, Group 15 elements, and transition metals other than the main components; specific examples are hydrogen (also included in water), lithium, sodium, silicon, boron, phosphorus, carbon, and nitrogen. In the case of an oxide semiconductor, oxygen vacancy may be formed by entry of impurities such as hydrogen. Furthermore, in the case where the semiconductor is a silicon layer, examples of an impurity which changes the characteristics of the semiconductor include oxygen, Group 1 elements except hydrogen, Group 2 elements, Group 13 elements, and Group 15 elements.

<<Transistor>>

In this specification, a transistor is an element having at least three terminals of a gate, a drain, and a source. The transistor has a channel formation region between a drain drain terminal, a drain region, or a drain electrode) and a source (a source terminal, a source region, or a source electrode), and current can flow through the drain, the channel formation region, and the source. Note that in this specification and the like, a channel formation region refers to a region through which current mainly flows.

Furthermore, the functions of a source and a drain might be switched when transistors having different polarities are employed or a direction of current flow is changed in circuit operation, for example. Therefore, the terms "source" and "drain" can be switched in this specification and the like.

<<Switch>>

In this specification and the like, a switch is conducting or not conducting (is turned on or off) to determine whether current flows therethrough or not. Alternatively, a switch has a function of selecting and changing a current path.

Examples of the switch include an electrical switch and a mechanical switch. That is, the switch is not limited to a certain element and any element can be used as long as it can control current.

Examples of the electrical switch include a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of the mechanical switch is a switch formed using a micro electro mechanical systems (MEMS) technology, such as a digital micromirror device (DMD). Such a switch includes an electrode that can be moved mechanically, and operates by controlling conduction and non-conduction in accordance with movement of the electrode.

<<Channel Length>>

In this specification and the like, the channel length refers to, for example, the distance between a source (source region or source electrode) and a drain (drain region or drain electrode) in a region where a semiconductor (or a portion where current flows in a semiconductor when a transistor is on) and a gate electrode overlap with each other or a region where a channel is formed in a top view of the transistor.

Note that in one transistor, channel lengths in all regions do not necessarily have the same value. In other words, the channel length of one transistor is not fixed to one value in some cases. Therefore, in this specification, the channel length is any one of values, the maximum value, the minimum value, or the average value, in a region where a channel is formed.

<<Channel Width>>

In this specification and the like, the channel width refers to, for example, the length of a portion where a source and a drain face each other in a region where a semiconductor (or a portion where a current flows in a semiconductor when a transistor is on) and a gate electrode overlap with each other, or a region where a channel is formed in a top view of the transistor.

Note that in one transistor, channel widths in all regions do not necessarily have the same value. In other words, the channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is increased in some cases. In that case, an effective channel width Obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known as an assumption condition. Therefore, in the case where the shape of a semiconductor is not known accurately, it is difficult to measure an effective channel width accurately.

Therefore, in this specification, in a top view of a transistor, an apparent channel width that is the length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from the one obtained by calculation using an effective channel width is obtained in some cases.

<<Connection>>

In this specification and the like, when it is described that X and Y are connected, the case where X and Y are electrically connected, the case where X and Y are functionally connected, and the case where X and Y are directly connected are included therein. Accordingly, another element may be interposed between elements having a connection relationship shown in drawings and texts, without limiting to a predetermined connection relationship, for example, the connection relationship shown in the drawings and the texts.

Here, X, Y, and the like each denote an object (e.g., a device, an element, a circuit, a wiring, an electrode, a terminal, a conductive film, or a layer).

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, a switch is conducting or not conducting (is turned on or off) to determine whether current flows therethrough or not.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up converter or a step-down converter) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, when it is explicitly described that X and Y are electrically connected, the description is the same as the case where it is explicitly only described that X and Y are connected.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in that order." When the connection order in a circuit structure is defined by an expression similar to the above examples, a source (or a first terminal or the like) and a drain (or a second terminal or the like) of a transistor can be distinguished from each other to specify the technical scope. Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

<<Parallel and Perpendicular>>

In this specification, the term "parallel" indicates that an angle formed between two straight lines is greater than or equal to −10° and less than or equal to 10°, and accordingly also includes the case where an angle is greater than or equal to −5° and less than or equal to 5°. The term "substantially parallel" indicates that an angle formed between two straight lines is greater than or equal to −30° and less than or equal to 30°. The term "perpendicular" indicates that an angle formed between two straight lines is greater than or equal to 80° and less than or equal to 100°, and accordingly also includes the case where an angle is greater than or equal to 85° and less than or equal to 95°. The term "substantially perpendicular" indicates that an angle formed between two straight lines is greater than or equal to 60° and less than or equal to 120°.

<<Trigonal and Rhombohedral>>

In this specification, trigonal and rhombohedral crystal systems are included in a hexagonal crystal system.

This application is based on Japanese Patent Application serial no. 2015-208166 filed with Japan Patent Office on Oct. 22, 2015, and Japanese Patent Application serial no. 2016-050444 filed with Japan Patent Office on Mar. 15, 2016, the entire contents of which are hereby incorporated by reference.

EXPLANATION OF REFERENCE

OS1: transistor, OS2: transistor, C0: capacitor, BL1: wiring, BL2: wiring, BL3: wiring, BL4: wiring, RBL1: wiring, RBL2: wiring, RBL3: wiring, RBL4: wiring, SL1: wiring, SL2: wiring, SL3; wiring, SL4: wiring, WL1: wiring, WL2: wiring, WL3; wiring, WL4: wiring, CNODE1: wiring, CNODE2: wiring, CNODE3: wiring, CNODE4: wiring, MCS: circuit unit, MC[1]: memory cell, MC[2]: memory cell, MC[i]: memory cell, MC[m]: memory cell, WOS[1]: transistor, WOS[2]: transistor, WOS[i]: transistor, WOS[m]: transistor, ROS[1]: transistor, ROS[2]: transistor, ROS[i]: transistor, ROS[m]: transistor, SW: transistor, C[1]: capacitor, C[2]: capacitor, C[i]: capacitor, C[m]: capacitor, FN[1]: node, FN[2]: node, FN[i]: node, FN[m]: node, BL: wiring, SL: wiring, WLOS[1]: wiring, WLOS[2]: wiring, WLOS [i]: wiring, WLOS[m]: wiring, WLC[1]: wiring, WLC[2]: wiring, WLC[i]: wiring, WLC[m]: wiring, WBG: wiring, WBG

[1]: wiring, WBG[2]: wiring, RBG: wiring, MCS[1]: circuit unit, MCS[j]: circuit unit, MCS[n]: circuit unit, MCS[1, 1]: circuit unit, MCS[m, 1]: circuit unit, MCS[1, n]: circuit unit, MCS[m, n]: circuit unit, MCS[1, 1]: memory cell, MC[i, 1]: memory cell, MC[m, 1]: memory cell, MC[1, j]: memory cell, MC[i, j]: memory cell, MC[m, j]: memory cell, MC[1, n]: memory cell, MC[i, n]: memory cell, MC[m, n], memory cell, MC[k]: memory cell, SW[1]: transistor, SW[j]: transistor, SW[n]: transistor, SW[1, 1]: transistor, SW[m, 1]: transistor, SW[1, i]: transistor, SW[m, n]: transistor, BL[1]: wiring, BL[j]: wiring, BL[n]: wiring, SL[1]: wiring, SL[j]: wiring, SL[n]: wiring, SG[1]: wiring, SG[j]: wiring, SG[n]: wiring, SG[1, 1]: wiring, SG[m, 1]; wiring, SG[1, n]: wiring, SG[m, n]: wiring, WLOS[1, 1]: wiring, WLOS[1, j]: wiring, WLOS[1, n]: wiring, WLOS[i,1]: wiring, WLOS[i, j]: wiring, WLOS[i, n]: wiring, WLOS[m, 1]: wiring, WLOS[m, j]: wiring, WLOS[m, n]: wiring, WLOS(1)[1, 1]: wiring, WLOS(1)[1, n]: wiring, WLOS(k)[1, 1]: wiring, WLOS(k)[1, n]: wiring, WLOS(1)[m, 1]: wiring, WLOS(1)[m, n]: wiring, WLOS(k)[m, 1]: wiring, WLOS(k)[m n]: wiring, WLC(1)[1]: wiring, WLC(k)[1]: wiring, WLC(1)[m]: wiring, WLC(k)[m]: wiring, WBG[m]: wiring, RBG[1]: wiring, RBG[m]: wiring, S1: step, S2: step, S3: step, S4; step, S5: step, S6: step, S7: step, S8: step, S9: step, L0: layer, L1: layer, L2: layer, L3: layer, L4: layer, L5: layer, L6: layer, L7: layer, L8: layer, L9: layer, L10: layer, L11: layer, L12: layer, TrA: transistor, TrB: transistor, TrC: transistor, C1: capacitor, 10: external circuit, 20: circuit layer, 100; string, 101: string, 102: string, 103: string, 104: string, 105: string, 105[1]: string, 105[j]: string, 105[n]: string, 105[1, 1]: string, 105[m, 1]: string, 105[1, n]: string, 105[m, n]: string, 106: string, 200: semiconductor device, 210: semiconductor device, 220: semiconductor device, 221: semiconductor device, 222: semiconductor device, 1400a: transistor, 1400b: transistor, 1400c: transistor, 1400d: transistor, 1400e: transistor, 1400f: transistor, 1401: insulating film, 1402: insulating film, 1403: insulating film, 1404: insulating film, 1405: insulating film, 1406: insulating film, 1407: insulating film, 1408: insulating film, 1409: insulating film, 1411: conductive film, 1412: conductive film, 1413: conductive film, 1414: conductive film, 1415: opening, 1421: conductive film, 1422: conductive film, 1423: conductive film, 1424: conductive film, 1430: metal oxide, 1431: metal oxide, 1431a: metal oxide, 1431b: metal oxide, 1431c: metal oxide, 1432: metal oxide, 1432a: metal oxide, 1432b: metal oxide, 1432c: metal oxide, 1433: metal oxide, 1441: region, 1442: region, 1450: substrate, 1451: low-resistance region, 1452: low-resistance region, 1461: region, 1461a: region, 1461b: region, 1461c: region, 1461d: region, 1461e: region, 1462: region, 1463: region, 1680: transistor, 1681: insulating film, 1682: semiconductor, 1683: conductive film, 1684: conductive film, 1685: insulating film, 1686: insulating film, 1687: insulating film, 1688: conductive film, 1689: conductive film, 1700: substrate, 1701: element isolation layer, 1702: insulator, 1703: insulator, 1704: insulator, 1705: insulator, 1706: insulator, 1710: conductor, 1711: conductor, 1712: conductor, 1713: conductor, 1714: conductor, 1715: conductor, 1716: conductor, 1717: conductor, 1718: conductor, 1719: conductor, 1730: wiring, 1731: wiring, 1732: wiring, 1733: wiring, 1734: wiring, 1735: wiring, 1736: wiring, 1737: wiring, 1751: first electrode, 1752: second electrode, 1753: insulator, 1790: gate electrode, 1792: well, 1793: channel formation region, 1794: low concentration impurity region, 1795: high concentration impurity region, 1796: conductive region, 1797: gate insulating film, 1798: sidewall insulating layer, 1799: sidewall insulating layer, 2600: memory device, 4000: RE TAG, 4700: electronic component, 4701: lead, 4702: printed board, 4703: circuit unit, 4704: circuit board, 5201: housing, 5202: housing, 5203: display portion, 5204: display portion, 5205: microphone, 5206: speaker, 5207: operation key, 5208: stylus, 5301: housing, 5302: refrigerator door, 5303: freezer door, 5401: housing, 5402: display portion, 5403: keyboard, 5404: pointing device, 5501: housing, 5502: display portion, 5503: microphone, 5504: speaker, 5505: operation buttons, 5601: housing, 5602: housing, 5603: display portion, 5604: display portion, 5605: joint, 5606: operation key, 5701: car body, 5702: wheels, 5703: dashboard, 5704: lights, 5801: housing, 5802: housing, 5803: display portion, 5804: operation key, 5805: lens, 5806: joint, 5901: housing, 5902: display portion, 5903: operation buttons, 5904: operator, 5905: band, 6000: memory device, 6100: memory cell, 7000a: transistor, 7000b: transistor, 7001: glass substrate, 7002: conductive film, 7003: insulating film, 7004: metal oxide, 7005: insulating film, 7006: conductive film, 7007: insulating film, 7008: region, 7009: region, 7010: conductive film, 7011: conductive film, 7020a: transistor, 7020b: transistor, 7021: conductive film, 7022: insulating film, 7023: metal oxide, 7024: insulating film, 7025: conductive film, 7026: conductive film, 7027: conductive film, and 7028: insulating film.

The invention claimed is:

1. A semiconductor device comprising:
a first transistor comprising a back gate; and
a circuit,
wherein the circuit comprises a second to a (2n+1)th transistor, a first to an n-th capacitor, a first wiring, and a first to an n-th retention node,
wherein n is an integer greater than or equal to 2,
wherein the (2i+1)th transistor comprises a back gate,
wherein i is an integer greater than or equal to 1 and less than or equal to n,
wherein a first terminal of the 2-th transistor is electrically connected to a gate of the (2i+1)th transistor through the i-th retention node,
wherein the first terminal of the 2i-th transistor is electrically connected to a first terminal of the i-th capacitor through the i-th retention node,
wherein a first terminal of the first transistor is electrically connected to a second terminal of the 2i-th transistor,
wherein a second terminal of the (2i−1)th transistor is electrically connected to a first terminal of the (2i+1)th transistor, and
wherein a back gate of the (2j−1)th transistor is electrically connected to a back gate of the (2j+1)th transistor, and
wherein j is an integer greater than or equal to 2 and less than or equal to n, and
wherein the back gate of the first transistor is electrically connected to a back gate of the third transistor.

2. The semiconductor device according to claim 1, wherein the first transistor comprises silicon in a channel formation region, and
wherein the second to the (2n+1)th transistor includes an oxide semiconductor in a channel formation region.

3. The semiconductor device according to claim 1, wherein the first to the (2n+1)th transistor includes an oxide semiconductor in a channel formation region.

4. The semiconductor device according to claim 1, further comprising a memory cell array comprising the first transistor and the circuit.

5. The semiconductor device according to claim 4, wherein the memory cell array further comprises a plurality of first transistors and a plurality of circuits.

6. The semiconductor device according to claim 5,
wherein the semiconductor device comprises a plurality of memory cell arrays including the memory cell array, and
wherein the plurality of memory cell arrays are overlapped with each other.

7. The semiconductor device according to claim 1,
wherein the i-th retention node is configured to retain M-bit data, and
wherein M is an integer greater than or equal to 1.

8. A memory device comprising the semiconductor device according to claim 1 and a driver circuit.

9. The memory device according to claim 8, wherein a storage capacity is one terabyte or more.

10. An electronic device comprising the memory device according to claim 8 and a housing.

11. A semiconductor device comprising:
a first transistor comprising a first back gate;
a first memory cell comprising a second transistor comprising a second gate and a second back gate, a third transistor comprising a third gate and a third back gate, and a first capacitor;
a second memory cell comprising a fourth transistor comprising a fourth gate and a fourth back gate, a fifth transistor comprising a fifth gate and a fifth back gate, and a second capacitor; and
a first wiring, a second wiring, a third wiring, and a fourth wiring,
wherein the first transistor, the second transistor, and the fourth transistor are electrically connected in series between the first wiring and the second wiring,
wherein the second gate is electrically connected to one of a source or a drain of the third transistor and one terminal of the first capacitor,
wherein the fourth gate is electrically connected to one of a source or a drain of the fifth transistor and one terminal of the second capacitor,
wherein the first back gate, the second back gate, and the fourth back gate are electrically connected to the third wiring, and
wherein the third back gate and the fifth back gate are electrically connected to the fourth wiring.

12. The semiconductor device according to claim 11,
wherein the first transistor comprises silicon in a channel formation region, and
wherein the second transistor, the third transistor, the fourth transistor, and the fifth transistor each includes an oxide semiconductor in a channel formation region.

13. The semiconductor device according to claim 11,
wherein one of a source or a drain of the second transistor is electrically connected to one of a source or a drain of the first transistor.

14. The semiconductor device according to claim 13,
wherein one of a source or a drain of the fourth transistor is electrically connected to the other one of the source or the drain of the second transistor.

15. A memory device comprising the semiconductor device according to claim 11 and a driver circuit.

16. An electronic device comprising the memory device according to claim 15 and a housing.

17. A semiconductor device comprising:
a first transistor comprising a first back gate;
a first memory cell comprising a second transistor comprising a second gate and a second back gate, a third transistor comprising a third gate, and a first capacitor;
a second memory cell comprising a fourth transistor comprising a fourth gate and a fourth back gate, a fifth transistor comprising a fifth gate, and a second capacitor; and
a first wiring, a second wiring, and a third wiring,
wherein the first transistor, the second transistor, and the fourth transistor are electrically connected in series between the first wiring and the second wiring,
wherein the second gate is electrically connected to one of a source or a drain of the third transistor and one terminal of the first capacitor,
wherein the fourth gate is electrically connected to one of a source or a drain of the fifth transistor and one terminal of the second capacitor, and
wherein the first back gate, the second back gate, and the fourth back gate are electrically connected to the third wiring.

18. The semiconductor device according to claim 17,
wherein the third transistor further comprises a third back gate electrically connected to a fifth wiring, and
wherein the fifth transistor further comprises a fifth back gate electrically connected to a sixth wiring.

19. The semiconductor device according to claim 17,
wherein the third transistor further comprises a third back gate electrically connected to the third gate, and
wherein the fifth transistor further comprises a fifth back gate electrically connected to the fifth gate.

* * * * *

UNITED STATES PATENT AND TRADEMARK OFFICE
CERTIFICATE OF CORRECTION

PATENT NO. : 9,990,997 B2
APPLICATION NO. : 15/296493
DATED : June 5, 2018
INVENTOR(S) : Takanori Matsuzaki et al.

Page 1 of 1

It is certified that error appears in the above-identified patent and that said Letters Patent is hereby corrected as shown below:

In the Claims

In Claim 1, at Column 68, Line 36, "the 2-th transistor" should be the --2$i$-th transistor--.

Signed and Sealed this
Twenty-eighth Day of August, 2018

Andrei Iancu
*Director of the United States Patent and Trademark Office*